(12) United States Patent
Kanno

(10) Patent No.: US 10,402,350 B2
(45) Date of Patent: Sep. 3, 2019

(54) MEMORY SYSTEM AND CONTROL METHOD

(71) Applicant: Toshiba Memory Corporation, Tokyo (JP)

(72) Inventor: Shinichi Kanno, Ota Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/684,826

(22) Filed: Aug. 23, 2017

(65) Prior Publication Data

US 2018/0246821 A1 Aug. 30, 2018

(30) Foreign Application Priority Data

Feb. 28, 2017 (JP) ................. 2017-036932

(51) Int. Cl.
*G06F 12/02* (2006.01)
*G06F 13/16* (2006.01)
*G11C 5/02* (2006.01)
*G11C 16/04* (2006.01)
*G11C 16/08* (2006.01)

(52) U.S. Cl.
CPC ...... *G06F 13/1668* (2013.01); *G06F 12/0246* (2013.01); *G11C 5/025* (2013.01); *G06F 2212/7201* (2013.01); *G06F 2212/7202* (2013.01); *G06F 2212/7207* (2013.01); *G11C 16/0483* (2013.01); *G11C 16/08* (2013.01)

(58) Field of Classification Search
CPC .. G06F 13/1668; G06F 12/0246; G06F 12/02; G11C 16/0483
USPC ......................... 711/154, 103, 114
See application file for complete search history.

(56) References Cited

U.S. PATENT DOCUMENTS

| 8,095,577 | B1* | 1/2012 | Faibish | ............... | G06F 16/13 707/823 |
|---|---|---|---|---|---|
| 9,323,612 | B2 | 4/2016 | Chen et al. | | |
| 9,542,118 | B1* | 1/2017 | Lercari | ............... | G06F 3/064 |
| 10,048,873 | B2* | 8/2018 | Jung | ............... | G06F 3/061 |

(Continued)

FOREIGN PATENT DOCUMENTS

| JP | 2015524975 A | 8/2015 |
|---|---|---|
| TW | I559314 B | 11/2016 |
| TW | I566254 B | 1/2017 |

OTHER PUBLICATIONS

Taiwan Office Action dated Feb. 13, 2018, flied in Taiwan counterpart Application No. 106122908, 12 pages (with translation).

*Primary Examiner* — Pierre Miche Bataille
(74) *Attorney, Agent, or Firm* — Kim & Stewart LLP

(57) ABSTRACT

A memory package in which a plurality of stacked non-volatile memory dies is connected to one another through a plurality of vertical vias is used in a memory system. The dies are classified into a plurality of die groups including a first die group that includes a plurality of dies connected to a first channel, and a second die group that includes a plurality of dies connected to a second channel. A data write/read operation on the first die group is performed through the first channel in response to an I/O command designating a first area corresponding to the first die group, and a data write/read operation on the second die group is performed through the second channel in response to an I/O command designating a second area corresponding to the second die group.

17 Claims, 36 Drawing Sheets

(56) References Cited

U.S. PATENT DOCUMENTS

| | | |
|---|---|---|
| 2009/0206332 A1 | 8/2009 | Son et al. |
| 2012/0203986 A1* | 8/2012 | Strasser ................ G06F 3/0611 711/158 |
| 2013/0019057 A1 | 1/2013 | Stephens |
| 2013/0148457 A1 | 6/2013 | Sweere et al. |
| 2013/0159603 A1* | 6/2013 | Whitney ............. G06F 12/0246 711/103 |
| 2015/0364218 A1* | 12/2015 | Frayer ................... G11C 29/44 714/6.13 |
| 2015/0378640 A1* | 12/2015 | Huang ................. G06F 3/0661 709/217 |
| 2016/0011972 A1* | 1/2016 | Flynn ................. G06F 12/0246 711/103 |
| 2016/0019136 A1* | 1/2016 | Nellans ............... G06F 12/0246 711/102 |
| 2016/0188213 A1 | 6/2016 | Lin et al. |
| 2016/0202910 A1* | 7/2016 | Ravimohan ......... G06F 12/0246 711/103 |
| 2016/0217098 A1* | 7/2016 | Chiu .................... G06F 13/426 |
| 2017/0185329 A1* | 6/2017 | Park ...................... G06F 3/0619 |
| 2017/0185335 A1* | 6/2017 | Pardoe ....................... G06F 1/30 |
| 2018/0032249 A1* | 2/2018 | Makhervaks ........... G06F 3/061 |
| 2018/0188985 A1* | 7/2018 | Wysocki ............... G06F 3/0622 |

\* cited by examiner

MEMORY SYSTEM AND CONTROL METHOD

CROSS-REFERENCE TO RELATED APPLICATION

This application is based upon and claims the benefit of priority from Japanese Patent Application No. 2017-036932, filed Feb. 28, 2017, the entire contents of which are incorporated herein by reference.

FIELD

Embodiments described herein relate generally to a technology that controls a non-volatile memory.

BACKGROUND

Today, memory systems including non-volatile memory are widely used.

As one of the memory systems, NAND flash technology-based solid-state drives (SSDs) are known. The SSDs are used as storages of various computers for their features such as high capabilities and low power consumption.

In general, a plurality of non-volatile memory dies is mounted in the SSD in order to increase the capacitance thereof. The individual non-volatile memory dies may be independently operated. Thus, each non-volatile memory die may function as a unit of parallel processes.

However, operations for one non-volatile memory die may not be performed in parallel or may be sequentially performed. For that reason, when a read request is received by the non-volatile memory die in which a write operation is being performed (resulting in a die contention), a reply time to the read request (known as read latency) may become extremely long.

Accordingly, a new function of allowing a host to access an SSD with no die contention is desirable.

DETAILED DESCRIPTION

Figure 1:
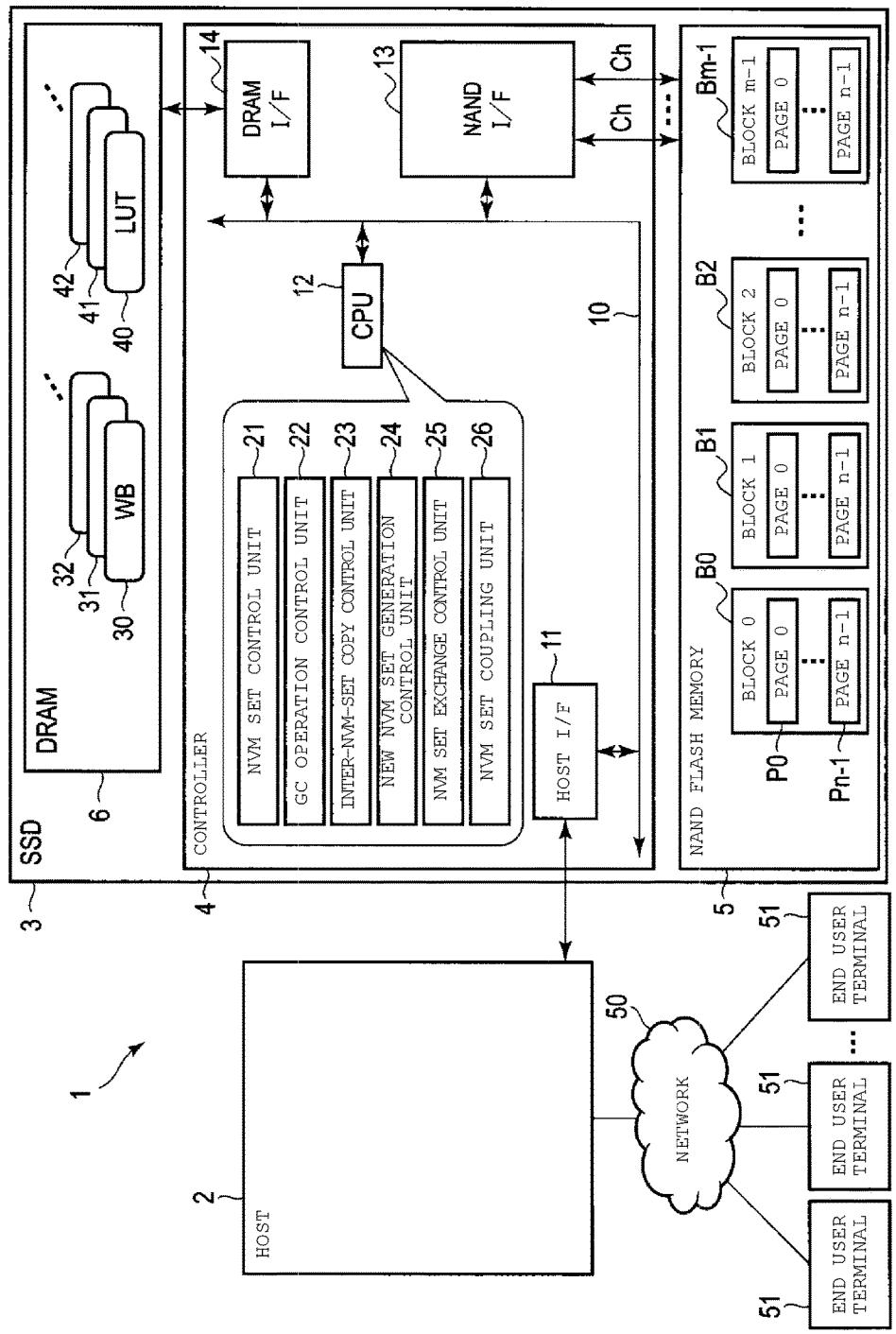
FIG. 1 is a block diagram showing a configuration example of a memory system according to an embodiment.

An embodiment provides a memory system and a control method capable of accessing a non-volatile memory with no die contention.

In general, according to an embodiment, a memory system connectable to a host includes a non-volatile memory that includes a plurality of non-volatile memory dies connected to each of a plurality of channels, and a controller configured to control the non-volatile memory through the plurality of channels. Each non-volatile memory die includes a plurality of blocks. The controller classifies the plurality of non-volatile memory dies into a plurality of die groups including a first die group that includes a plurality of first non-volatile memory dies connected to a first channel of the plurality of channels and a second die group that includes a plurality of second non-volatile memory dies connected to a second channel of the plurality of channels. The controller performs a data write/read operation on the first die group through the first channel according to a first I/O command that is received from the host and designates a first area corresponding to the first die group. The controller performs a data write/read operation on the second die group through the second channel according to a second I/O command that is received from the host and designates a second area corresponding to the second die group. The non-volatile memory includes one or more memory packages, each memory package includes a plurality of stacked non-volatile memory dies, the plurality of stacked non-volatile memory dies in each memory package are connected to one another through a plurality of vertical vias, and a plurality of signals corresponding to at least one channel is transmitted to the plurality of stacked non-volatile memory dies of each memory package through the plurality of vertical vias thereof.

Hereinafter, embodiments will be described with reference to the drawings.

Initially, a configuration of an information processing system 1 including a memory system according to an embodiment will be described with reference to FIG. 1.

The memory system is a semiconductor storage device that is configured to write data in a non-volatile memory and read data from the non-volatile memory. For example, the memory system is implemented with a NAND flash-based solid-state drive (SSD) 3.

The information processing system 1 includes a host (or host device) 2 and an SSD 3. The host 2 is a server or an information processing device such as a personal computer. As a typical example of the server functioning as the host 2, there is a server within a data center.

In a case where the host 2 is implemented by the server within the data center, the host (e.g., server) 2 may be connected to a plurality of end user terminals 51 through a network 50. The host 2 may provide various services to these end user terminals 51. A plurality of virtual machines may run on a physical server functioning as the host 2. These virtual machines may function as a virtual server configured to provide various services to the corresponding to client (e.g., end user terminal 51).

The SSD 3 may be used as a main storage of the information processing device functioning as the host 2. The SSD 3 may be built in the information processing device, or may be connected to the information processing device through a cable or a network.

SCSI, Serial Attached SCSI (SAS), ATA, Serial ATA (SATA), PCI Express (PCIe), Ethernet®, Fibre Channel, or NVM Express® (NVMe) may be used as an interface for mutually connecting the host 2 and the SSD 3.

The SSD 3 includes a controller 4, and a non-volatile memory (e.g., NAND flash memory) 5. The SSD 3 may include a random-access memory, for example, a DRAM 6.

The NAND flash memory 5 includes a memory cell array including a plurality of memory cells arranged to have a matrix configuration. The NAND flash memory 5 may be a two-dimensional NAND flash memory, or may be a three-dimensional NAND flash memory.

The memory cell array of the NAND flash memory 5 includes a plurality of blocks B0 to Bm−1. Each of the blocks B0 to Bm−1 includes a plurality of pages (page P0 to Pn−1 in this example). The blocks B0 to Bm−1 function as erase units. The blocks are also referred to as "erase blocks" or are simply referred to as "physical blocks". Each of pages P0 to Pn−1 includes a plurality of memory cells connected to the same word line. Each of the pages P0 to Pn−1 is a unit on which a data write operation and a data read operation is performed.

The controller 4 is electrically connected to the NAND flash memory 5 through a NAND interface 13 such as Toggle or Open NAND Flash Interface (ONFI) and a plurality of channels (Chs). The NAND interface 13 functions as a NAND control circuit configured to control the NAND flash memory 5.

Figure 2:
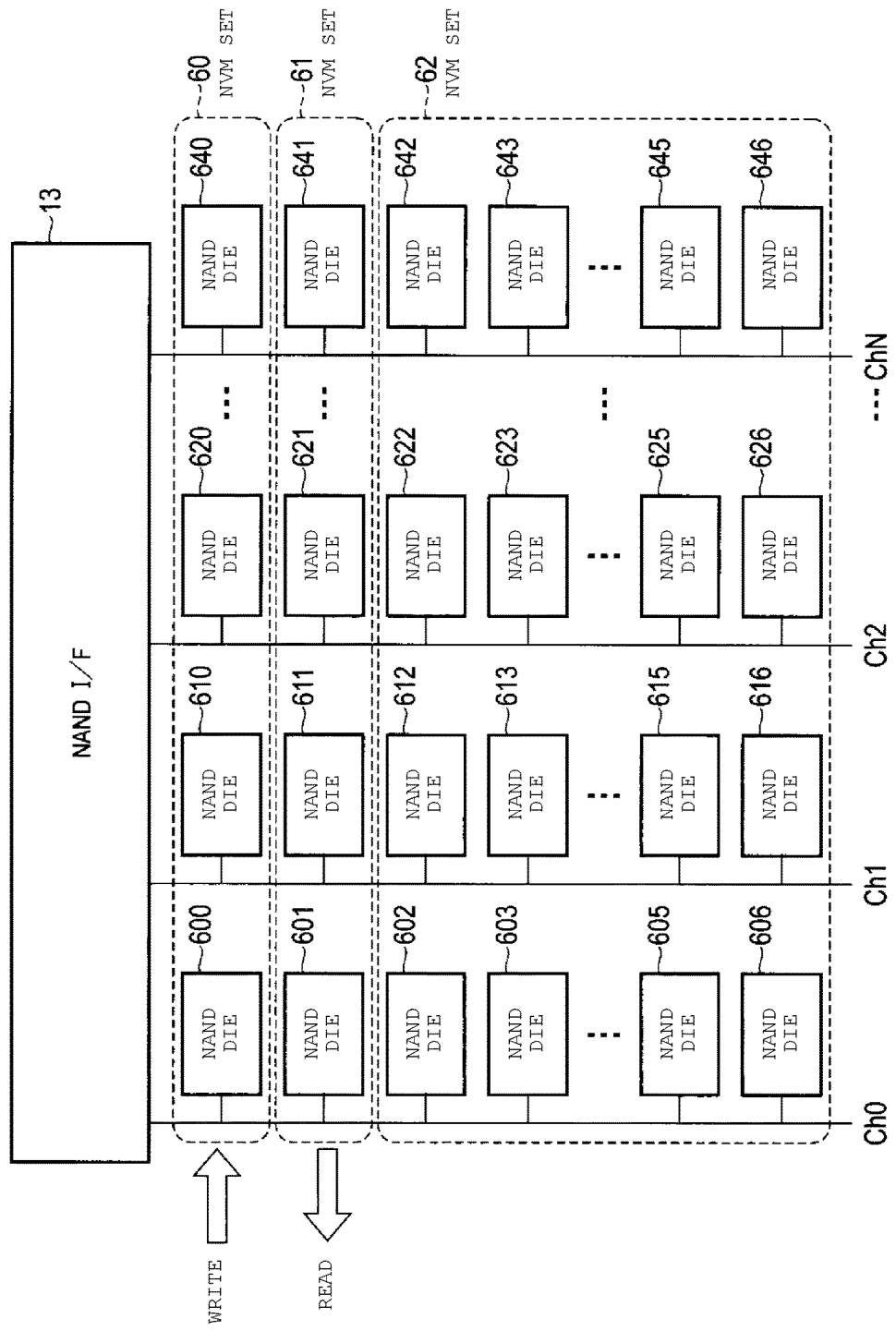
FIG. 2 is a block diagram showing a plurality of non-volatile memory sets (NVM sets) formed of a plurality of NAND flash memory dies within the memory system according to the embodiment.

As shown in FIG. 2, the NAND flash memory 5 includes a plurality of NAND flash memory dies (depicted as "NAND dies" in FIG. 2). Each NAND flash memory die is a non-volatile memory die that includes a memory cell array including a plurality of blocks and a peripheral circuit controlling the memory cell array. The individual NAND flash memory dies may be independently operated. Thus, the NAND flash memory die functions as a single parallel operation unit. The NAND flash memory die is also referred to as a "NAND flash memory chip".

In FIG. 2, a case where a plurality of channels Ch0, Ch1, Ch2, . . . , and ChN is connected to the NAND interface 13 and the same number (for example, K dies assigned to the channels, and K is an integer of 2 or more) of NAND flash memory dies are connected to each of the channels Ch0, Ch1, Ch2, . . . , and ChN is illustrated. Each channel includes a communication line (e.g., memory bus) for communicating with the corresponding NAND flash memory dies.

In FIG. 2, NAND flash memory dies 600, 601, and 602 to 606 are connected to the channel Ch0. NAND flash memory dies 610, 611, and 612 to 616 are connected to the channel Ch1. NAND flash memory dies 620, 621, and 622 to 626 are connected to the channel Ch2. Similarly, NAND flash memory dies 640, 641, and 642 to 646 are connected to the channel ChN.

The controller 4 controls the NAND flash memory 5 through the channels Ch0, Ch1, Ch2, ..., and ChN. The controller 4 may simultaneously drive the channels Ch0, Ch1, Ch2, ..., and ChN. That is, the NAND interface 13 includes N NAND control circuits which respectively correspond to the channels Ch0, Ch1, Ch2, ..., and ChN. The controller 4 may independently drive the channels Ch0, Ch1, Ch2, ..., and ChN by using the NAND control circuits.

In the present embodiment, the controller 4 classifies (K×N) NAND flash memory dies 600 to 646 into a plurality of die groups such that each of the NAND flash memory dies belongs to only one die group. In the following description, the die group is referred to as a "non-volatile memory subset (NVM set)".

In FIG. 2, each NVM set extends over the plurality of channels Ch0, Ch1, Ch2, ..., and ChN. For example, the NVM set 60 includes the NAND flash memory dies 600, 610, 620, ..., and 640 respectively connected to the channels Ch0, Ch1, Ch2, ..., and ChN. The NVM set 61 includes the NAND flash memory dies 601, 611, 621, ..., and 641 respectively connected the channels Ch0, Ch1, Ch2, ..., and ChN. The NVM set 62 includes the NAND flash memory dies 602, 603, ..., 605, and 606 connected to the channel Ch0, the NAND flash memory dies 612, 613, ..., 615, and 616 connected to the channel Ch1, the NAND flash memory dies 622, 623, ..., 625, and 626 connected to the channel Ch2, and the NAND flash memory dies 642, 643, ..., 645, and 646 connected to the channel ChN.

As described above, in FIG. 2, the (K×N) NAND flash memory dies 600 to 646 are classified into a plurality of NVM sets each extending over the plurality of channels. In each NVM set, a data write/read operation for a maximum of N NAND flash memory dies may be simultaneously performed.

A plurality of areas capable of being designated by the host 2 may be respectively associated with the plurality of NVM sets. The plurality of areas is logical areas that the host 2 is able to access. The number of areas corresponding to each NVM set may be one or may be two or more. The number of areas corresponding to each NVM set may be different for every NVM set.

The controller 4 may simultaneously perform a plurality of I/O commands (e.g., a write command or a read command) for designating different areas corresponding to different NVM sets with no die contention. Accordingly, for example, even though the read command for the area corresponding to the NVM set 61 is received from the host 2 for a period during which the data write operation for the NVM set 60 is being performed, the controller 4 may immediately perform the data read operation corresponding to the read command without waiting for the completion of the data write operation.

In the SSD 3 shown in FIG. 1, the controller 4 may function as a flash translation layer (FTL) configured to perform data management of the NAND flash memory 5 and block management of the NAND flash memory 5.

The data management performed by the FTL includes (1) a management of mapping information indicating a correspondence between the logical addresses and the physical addresses of the NAND flash memory 5, and (2) a process for concealing the read/write operation on the page basis and the erasing operation based on the block basis. The logical address is an address used by the host 2 in order to designate the address of the SSD 3. The logical block address (LBA) is typically used as the logical address.

The management of the mapping of the logical block addresses (LBAs) and the physical addresses is performed by using a lookup table (LUT) functioning as an address translation table (e.g., logical-to-physical address translation table). A physical address corresponding to a certain LBA indicates a physical storage position within the NAND flash memory 5 in which the data of the LBA is written. The lookup table (LUT) may be loaded to the DRAM 6 from the NAND flash memory 5 when the SSD 3 is powered on. In general, a size of each lookup table is relatively large. For that reason, at least a part of each lookup table may be stored as an address translation table cache in the DRAM 6.

In the NAND flash memory 5, the data writing for the page may be performed one time per one erase cycle. Thus, the controller 4 writes update data corresponding to a certain LBA in a different physical storage position other than a physical storage position in which previous data corresponding to the LBA is stored. The controller 4 updates the corresponding lookup table (LUT), and associates the LBA with the different physical storage position. As a result, previous data corresponding to the LBA is invalidated.

In the present embodiment, a plurality of lookup tables (LUTs) 40, 41, 42, ... is used. Basically, the lookup tables (LUTs) 40, 41, 42, ... correspond to the plurality of NVM sets, respectively. Each lookup table may correspond to a certain one area, or may correspond to one group of garbage collection.

Each NVM set includes at least one of garbage collection groups. The garbage collection group includes a plurality of blocks, and is used as a unit on which the garbage collection is performed. Only one lookup table may be used for the NVM set including only one garbage collection group. A plurality of lookup tables may be used for the NVM set including the plurality of garbage collection groups.

The controller 4 may further have a multi-namespace control function. The multi-namespace control function enables the allocation of a plurality of logical address spaces (LBA spaces) to the SSD 3 in order to enable one storage device to be used as a plurality of drives.

Each of the plurality of areas may be implemented by a namespace. Each namespace is equivalent to an area in the NAND flash memory 5. A logical address range (LBA range) is assigned to each namespace. A size (that is, the number of LBAs) of the LBA range is varied for every namespace. Each LBA range starts from LBA0. Each namespace is identified by an identifier of the namespace.

The write command from the host 2 includes an identifier of a specific namespace, that is, a namespace ID (NSID). The controller 4 determines an accessing target area in which the write data is to be written based on the namespace ID within the write command from the host 2. Similarly, the read command from the host 2 includes the namespace ID corresponding to the specific namespace. The controller 4 determines an accessing target area from which the data is to be read based on the namespace ID within the read command from the host 2.

The block management includes the management of bad blocks, the wear leveling, and garbage collection.

Wear leveling is an operation for equalizing degrees of wear of the blocks.

The garbage collection is an operation for increasing the number of free blocks in which data is able to be written. In the garbage collection operation, the controller 4 copies only valid data within some blocks which store valid data and invalid data together to different blocks (for example, free blocks). In the present embodiment, the valid data means data (that is, data associated as latest data from the logical address) referred to in the LUT and is likely to be read from the host 2 later. The invalid data means data which is not likely to be read from the host 2. For example, data associated with a certain logical address is valid data, and data which is not associated with any logical address is invalid data. The controller 4 maps the LBAs of the copied valid data to copying destination physical addresses of the valid data. The valid data are copied to different blocks, and thus, the blocks in which only the invalid data are present is released as the free blocks. Accordingly, the block may be reused after the erasing operation is performed.

Hereinafter, a configuration of the controller 4 will be described.

The controller 4 includes a host interface 11, a CPU 12, the NAND interface 13, and a DRAM interface 14. The CPU 12, the NAND interface 13, and the DRAM interface 14 are connected to each other through a bus 10.

The host interface 11 is a host interface circuit configured to communicate with the host 2. For example, the host interface 11 may be a PCIe controller (e.g., NVMe controller). The host interface 11 receives various commands (e.g., a write command, a read command, various control commands, and an UNMAP command) from the host 2.

The write command is to request the SSD 3 to write data designated by the write command. The write command may include a start LBA, a transmission length, and an ID. The ID within the write command is an identifier for uniquely identifying an area in which data is to be written. The ID may be the namespace ID. The read command requests the SSD 3 to read the data designated by the read command. The read command may include a start LBA, a transmission length, and an ID. The ID within the read command is an identifier for uniquely identifying an area from which data is to be read. The ID may be the namespace ID.

The CPU 12 is a processor configured to control the host interface 11, the NAND interface 13, and the DRAM interface 14. The CPU 12 performs various processes by loading a control program (e.g., firmware) from a ROM (not shown) or the NAND flash memory 5 onto the DRAM 6 in response to the powered-on of the SSD 3 and performs the firmware. The firmware may be loaded on an SRAM (not shown) within the controller 4. For example, the CPU 12 may perform a command process for processing various commands from the host 2 in addition to the FTL process. An operation of the CPU 12 is controlled by the firmware executed by the CPU 12. A part or all of the FTL process and the command process may be performed by dedicated hardware within the controller 4.

The CPU 12 may function as an NVM set control unit 21, a garbage collection (GC) operation control unit 22, an inter-NVM-set copy control unit 23, a new NVM set generation control unit 24, an NVM set exchange control unit 25, and an NVM set coupling unit 26.

The NVM set control unit 21 classifies the (K×N) NAND flash memory dies 600 to 646 into a plurality of NVM sets such that each of the (K×N) NAND flash memory dies 600 to 646 belongs to one NVM set. The NVM set control unit 21 performs the data write/read operation for one NVM set of the plurality of NVM sets according to an I/O command which is received from the host 2 to designate any one of a plurality of areas including at least one area corresponding to each NVM set. For example, in a case where the plurality of NVM sets includes a first NVM set and a second NVM set, the NVM set control unit 21 performs the data write/read operation for the first NVM set according to a first I/O command from the host 2 which is received from the host 2 to designate at least one area corresponding to the first NVM set. The NVM set control unit 21 performs the data write/read operation for the second NVM set according to a second I/O command from the host 2 which is received from the host 2 to designate at least one area corresponding to the second NVM set.

The NVM set control unit 21 individually manages free block groups within the NAND flash memory 5 by a plurality of free block pools corresponding to the plurality of NVM sets for every NVM set. The free block means a block which does not store the valid data. For example, the free blocks belonging to the first NVM set are managed by a first free block pool corresponding to the first NVM set, and the free blocks belonging to the second NVM set are managed by a second free block pool corresponding to the second NVM set. When an operation for initializing the SSD 3 is performed, the NVM set control unit 21 arranges all blocks belonging to the first NVM set in the first free block pool, and arranges all blocks belonging to the second NVM set in the second free block pool.

In each of the plurality of NVM sets, the NVM set control unit 21 performs an operation for allocating one of the free blocks within the corresponding free block pool as a block in which user data (e.g., write data from the host 2 or data to be copied for the garbage collection) is to be written, an operation for writing the user data in the allocated block, an operation for managing the block filled with the user data by a data block pool (referred to as an active block pool), and an operation for returning the block which is managed by the data block pool and does not store the valid data to the corresponding free block pool.

Accordingly, since a block group arranged in the free block pool corresponding to a certain NVM set is able to be used only by one or more areas corresponding to the NVM set, it is possible to guarantee that the die contention will not occur among the plurality of NVM sets. The data block pool means a pool for managing the blocks that belong to the corresponding NVM set and store the valid data.

In the present embodiment, two kinds of NVM sets including isolated NVM sets and a shared NVM set may be used.

The isolated NVM set is an NVM set including only one garbage collection group (i.e., only one data block pool). That is, the free block pool corresponding to the isolated NVM set is a dedicated free block pool for a single data block pool that manages the blocks that belong to the NVM set and store the valid data. In the isolated NVM set, a single data block pool occupies the free block pool corresponding to the isolated NVM set.

The shared NVM set is an NVM set including the plurality of garbage collection groups (i.e., the plurality of data block pools). That is, the free block pool corresponding to the shared NVM set is a free block pool shared among the plurality of data block pools that manages the blocks that belong to the NVM set and store the valid data. In the shared NVM set, the plurality of data block pools shares the free block pool corresponding to the share NVM set.

The garbage collection (GC) operation control unit 22 independently performs the garbage collection for every garbage collection group.

In the garbage collection of the isolated NVM set, that is, the garbage collection of the block group of a single data block pool belonging to the isolated NVM set, the GC operation control unit 22 performs (1) an operation for allocating one of the free blocks within the free block pool corresponding to the isolated NVM set, as the copying destination block, (2) an operation for copying only the valid data from one or more blocks which belong to the data block pool and which store the valid data and the invalid data together to the copying destination block, and (3) an operation for returning the block which stores only the invalid data through the copying of the valid data to the copying destination block to the free block pool corresponding to the isolated NVM set. Accordingly, since the free block generated through the GC of a certain isolated NVM set is used only by one or more areas corresponding to the NVM set, it is possible to guarantee that the die contention will not occur among the plurality of NVM sets.

In the garbage collection of the shared NVM set, that is, the garbage collection of the block group within one data block pool of the plurality of data block pools belonging to the shared NVM set, the GC operation control unit 22 performs (1) an operation for allocating one of the free blocks within the free block pool corresponding to the shared NVM set, as the copying destination block, (2) an operation for copying only the valid data from one or more blocks which belong to one data block pool and store the valid data and the invalid data together to the copying destination block, and (3) an operation for returning one or more blocks which store only the invalid data through the copying of the valid data to the copying destination block to the free block pool corresponding to the shared NVM set. Accordingly, since the free block generated through the GC of a certain shared NVM set is able to be used only by one or more areas corresponding to the shared NVM set, it is possible to guarantee that the die contention will not occur among the plurality of NVM sets.

The inter-NVM-set copy control unit 23 performs an inter-NVM-set copy operation in order to equalize the degrees of wear (e.g., the number of program/erase cycles) of the NVM sets. For example, the inter-NVM-set copy operation may be used for copying the valid data stored in an isolated NVM set having a high degree of wear to an isolated NVM set having a low degree of wear. Accordingly, it is possible to equalize the degree of wear of the NVM sets. The host 2 may send an inter-NVM-set copy command including a parameter for designating a copying source NVM set and a copying destination NVM set to the SSD 3.

The inter-NVM-set copy control unit 23 performs (1) an operation for selecting the block that stores the valid data from the blocks belonging to the copying source NVM set, as the copying source block, (2) an operation for copying only the valid data within the copying source block to the allocated copying destination block from the free block pool corresponding to the copying destination NVM set, (3) an operation for mapping a physical address indicating a physical storage position within the copying destination block to which the valid data is copied to a logical address corresponding to the copied valid data by updating the lookup table that manages the mapping of the logical addresses and the physical addresses of the copying source NVM set, (4) an operation for returning the copying source block to the free block pool corresponding to the copying source NVM set when there is no valid data in the copying source block, and (5) an operation for repeating the (1) to (4) operations until the block that stores the valid data is not present in the copying source NVM set. As a result, it is possible to move the data (e.g., data having a high update frequency) within the copying source NVM set to the copying destination NVM set having the smaller number of program/erase cycles. For that reason, the copying destination NVM set having a low degree of wear is used for writing the data having a high update frequency. Thus, it is possible to delay a timing when the number of program/erase cycles of the copying source NVM set reaches a limit value.

The new NVM set generation control unit 24 generates a new NVM set from another NVM set. For example, the new NVM set generation control unit 24 may generate some NAND flash memory die sets within a certain NVM set, as a new NVM set. Accordingly, it is possible to divide one NVM set into two NVM sets.

The NVM set exchange control unit 25 performs an NVM set exchange operation in order to equalize the degrees of wear (e.g., the number of program/erase cycles) of the NVM sets. For example, the NVM set exchange operation is able to be used for exchanging data between the isolated NVM set having a high degree of wear and the isolated NVM set having a low degree of wear. Accordingly, it is possible to equalize the degrees of wear of the NVM sets. The host 2 may send an NVM set exchange command including a parameter for designating two NVM sets (e.g., a first NVM set and a second NVM set) in which the stored data is mutually exchanged to the SSD 3.

The NVM set exchange control unit 25 performs an operation for copying only the valid data within the first NVM set to the second NVM set, and an operation for copying only the valid data within the second NVM set to the first NVM set.

In the operation for copying only the valid data within the first NVM set to the second NVM set, the NVM set exchange control unit 25 performs (1) an operation for selecting the block that stores the valid data from the blocks belonging to the first NVM set, as the copying source block, (2) an operation for copying only the valid data within the copying source block to the allocated copying destination block from the free block pool corresponding to the second NVM set, (3) an operation for mapping a physical address indicating the physical storage position within the copying destination block to which the valid data is copied to a logical address corresponding to the copied valid data by updating the lookup table that manages the mapping of the logical addresses and the physical addresses of the first NVM set, (4) an operation for returning the copying source block to the free block pool corresponding to the first NVM set when there is no valid data in the copying source block, and (5) an operation for repeating the (1) to (4) operations until the block that stores the valid data is not present in the first NVM set.

In the operation for copying only the valid data within the second NVM set to the first NVM set, the NVM set exchange control unit 25 performs (1) an operation for selecting the block that stores the valid data from the blocks belonging to the second NVM set, as the copying source block, (2) an operation for copying only the valid data within the copying source block to the allocated copying destination block from the free block pool corresponding to the first NVM set, (3) an operation for mapping a physical address indicating the physical storage position which the copying destination block to which the valid data is copied to a logical address corresponding to the copied valid data by updating the lookup table that manages the mapping of the logical addresses and the physical addresses of the second NVM set, (4) an operation for returning the copying source block to the free block pool corresponding to the second NVM set when there is no valid data in the copying source block, and (5) an operation for repeating the (1) to (4) operations until the block that stores the valid data is not present in the second NVM set.

Accordingly, it is possible to equalize the degrees of wear of the two NVM sets.

The NVM set coupling unit 26 couples two or more NVM sets as one NVM set. Two or more NVM sets which are coupling targets and one NVM set which is a coupling destination may be designated by the host 2.

The NAND interface 13 controls the NAND flash memory 5 under the control of the CPU 12. The DRAM interface 14 is a DRAM controller configured to control the DRAM 6 under the control of the CPU 12. A part of the storage area of the DRAM 6 is used as a write buffer (WB) for temporarily storing the write data from the host 2. In the present embodiment, a plurality of write buffers (WBs) 30, 31, 32, . . . is used. At least one write buffer (WB) may be prepared for every NVM set. The other part of the storage area of the DRAM 6 is used for storing the lookup tables (LUTs) 40, 41, 42, . . . .

Figure 3:
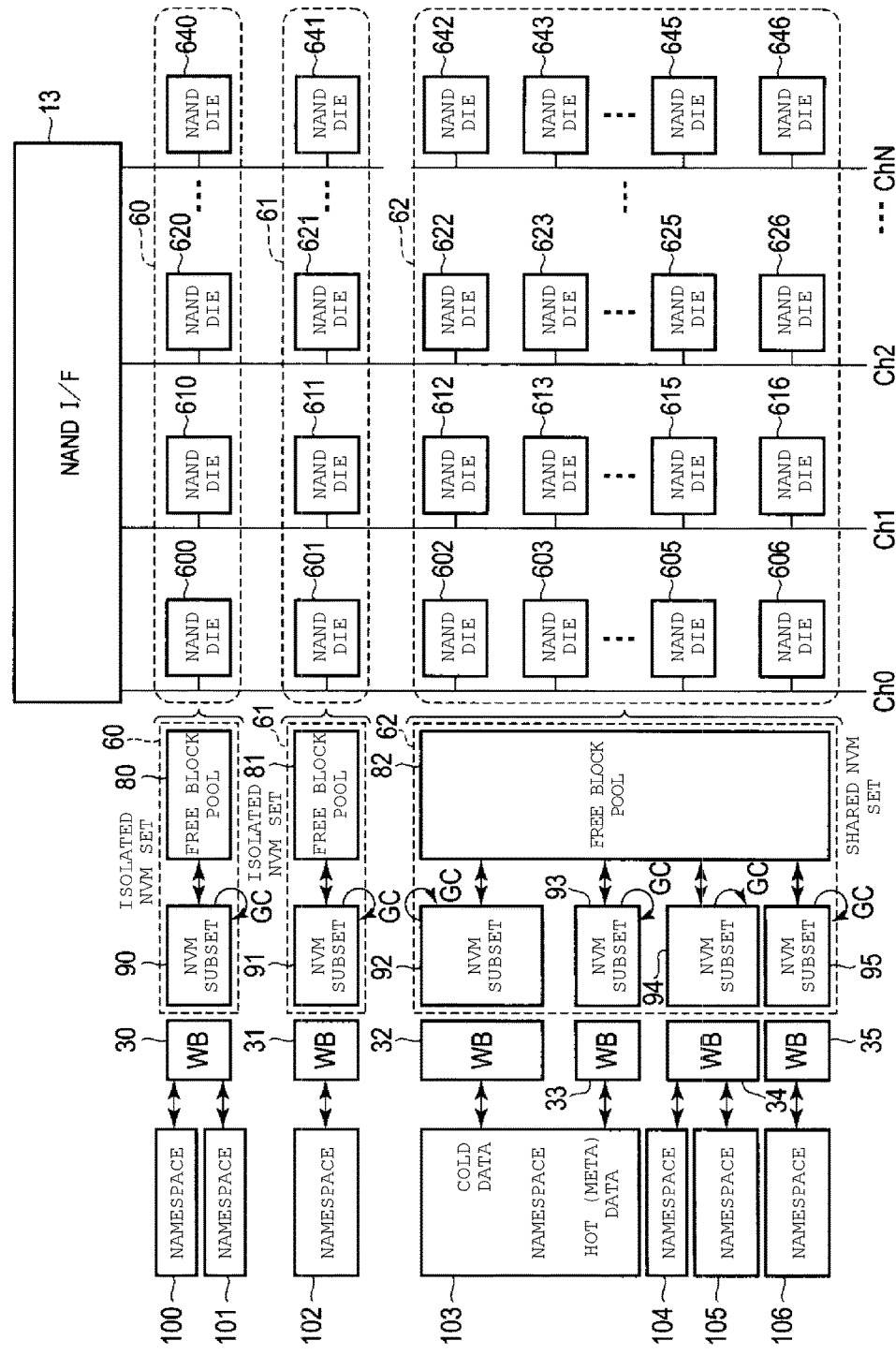
FIG. 3 is a block diagram showing the relationship between block management corresponding to each NVM set of FIG. 2 and one or more areas corresponding to each NVM set.

FIG. 3 shows an example of the relationship between the block management corresponding to the NVM sets of FIG. 2 and one or more areas corresponding to the NVM sets.

The NVM set 60 includes the NAND flash memory die 600 connected to the channel Ch0, the NAND flash memory die 610 connected to the channel Ch1, the NAND flash memory die 620 connected to the channel Ch2, and the NAND flash memory die 640 connected to the channel ChN. The blocks that belong to the NVM set 60 and do not store the valid data are managed by a free block pool 80 corresponding to the NVM set 60. In a process of initializing the SSD 3, the controller 4 arranges all blocks belonging to the NVM set 60, that is, all blocks within the NAND flash memory dies 600, 610, 620, . . . , and 640 in the free block pool 80 corresponding to the NVM set 60.

The blocks belonging to the NVM set 60 are managed by using the free block pool 80 and an NVM subset 90. The NVM subset 90 is a data block pool for managing the blocks that belong to the NVM set 60 and store the valid data. A block group included in the NVM subset 90 constitutes one garbage collection group.

The free block pool 80 is a dedicated free block pool for one NVM subset 90. Accordingly, the NVM set 60 functions as the NVM set exclusively used by one NVM subset 90 (referred to as an isolated NVM set). One write buffer (WB) 30 is associated with the NVM subset 90.

The NVM set 60 is used as a physical storage space for at least one area capable of being designated by the host 2. The NVM set 60 may be a dedicated physical storage space for only one namespace. In FIG. 3, the NVM set 60 is used as physical storage spaces for two namespaces 100 and 101.

The NVM set 61 includes the NAND flash memory die 601 connected to the channel Ch0, the NAND flash memory die 611 connected to the channel Ch1, the NAND flash memory die 621 connected to the channel Ch2, . . . , and the NAND flash memory die 641 connected to the channel ChN. The blocks that belong to the NVM set 61 and do not store the valid data are managed by the free block pool 81 corresponding to the NVM set 61. In a process of initializing the SSD 3, the controller 4 arranges all blocks belonging to the NVM set 61, that is, all blocks within the NAND flash memory dies 601, 611, 621, . . . , and 641 in a free block pool 81 corresponding to the NVM set 61.

The blocks belonging to the NVM set 61 are managed by using the free block pool 81 and an NVM subset 91. The NVM subset 91 is a data block pool for managing the blocks that belong to the NVM set 61 and store the valid data. A block group included in the NVM subset 91 constitutes one garbage collection group. The free block pool 81 is a dedicated free block pool for one NVM subset 91. Accordingly, the NVM set 61 functions as the NVM set exclusively used by one NVM subset 91 (i.e., an isolated NVM set). One write buffer (WB) 31 is associated with the NVM subset 91.

The NVM set 61 is used as a physical storage space for at least one area. The NVM set 61 may be a dedicated physical storage space for only one namespace. In FIG. 3, the NVM set 61 is used as a physical storage space for one namespace 102.

The NVM set 62 includes the NAND flash memory dies 602, 603, . . . , 605, and 606 connected to the channel Ch0, the NAND flash memory dies 612, 613, . . . , 615, and 616 connected to the channel Ch1, the NAND flash memory dies 622, 623, . . . , 625, and 626 connected to the channel Ch2, and the NAND flash memory dies 642, 643, . . . , 645, and 646 connected to the channel ChN. The blocks that belong to the NVM set 62 and do not store the valid data are managed by the free block pool 82 corresponding to the NVM set 62. In a process of initializing the SSD 3, the controller 4 arranges all blocks belonging to the NVM set 62, that is, all blocks within the NAND flash memory dies 602 to 646 in a free block pool 82 corresponding to the NVM set 62.

The blocks belonging to the NVM set 62 are managed by using the free block pool 82 and NVM subsets 92, 93, 94, and 95. The NVM subsets 92, 93, 94, and 95 are data block pools for managing the blocks that belong to the NVM set 62 and store the valid data. A block group included in the NVM subset 92 constitutes one garbage collection group, a block group included in the NVM subset 93 constitutes a different garbage collection group, a block group included in the NVM subset 94 constitutes a further different garbage collection group, and a block group included in the NVM subset 95 constitutes a still further different garbage collection group. The free block pool 82 is a free block pool shared among the NVM subsets 92, 93, 94, and 95. Accordingly, the NVM set 62 functions as the shared NVM set shared among the plurality of NVM subsets 92 to 95. Write buffers (WBs) 32, 33, 34, and 35 are respectively associated with the NVM subsets 92, 93, 94, and 95.

The NVM set 62 is used as a physical storage space for at least one area. The NVM set 62 may be a dedicated physical storage space for only one namespace, or may be a physical storage space for the plurality of namespaces. In FIG. 3, the NVM set 62 is used as physical storage spaces for four namespaces 103, 104, 105, and 106.

In FIG. 3, the namespace 103 uses two NVM subsets 92 and 93. For example, the LBA range corresponding to the namespace 103 may be divided into two sub-LBA ranges. The write data (for example, cold data having a low update frequency) corresponding to one sub-LBA range may be written in an input block for the NVM subset 92 through the write buffer (WB) 32. The write data (for example, hot data having a high update frequency) corresponding to the other sub-LBA range may be written in an input block for the NVM subset 93 through the write buffer (WB) 33.

In FIG. 3, the data write/read operation for the NVM set 60 is performed according to an I/O command from the host 2 which includes the ID of the namespace 100 or 101. The data write/read operation for the NVM set 61 is performed according to an I/O command from the host 2 which includes the ID of the namespace 102. The data write/read operation for the NVM set 62 is performed according to an I/O command from the host 2 which includes the ID of the namespace of any one of the namespaces 103 to 106. Accordingly, it is possible to simultaneously access the NVM sets 60, 61, and 62, and it is possible to suppress a long latency (particularly, a long read latency) caused by the die contention.

Since the garbage collection is independently performed for every NVM subset, the namespace that exclusively uses one or more NVM subsets is not under the influence caused by the garbage collection of another NVM subset used by another namespace (referred to as GC contention).

The shared NVM set 62 has the following features.

Since the free block pool 82 is shared among the plurality of NVM subsets 92 to 95, the die contention may occur in the share NVM set 62. However, when it is necessary to allocate a new input block for a certain NVM subset, the controller 4 may select the block of which the number of program/erase cycles are small from the free block group within the shared free block pool 82, and may allocate the selected block as the new input block. Accordingly, it is possible to equalize the degrees of wear of the NVM subsets 92, 93, 94, and 95.

The isolated NVM sets 60 and 61 have the following features.

In each of the isolated NVM sets 60 and 61, one NVM subset can exclusively use one free block pool. Accordingly, when one namespace is associated with one NVM subset, the namespace can exclusively uses the isolated NVM set with no die contention. However, since the isolated NVM set does not share the free block group with another NVM set, when a rewrite frequency of the data stored in a specific isolated NVM set is high, a degree of wear of the NVM set may be higher than a degree of wear of another NVM set. As described above, uneven degrees of wear lead to a reduction in the lifespan of the SSD 3.

In the present embodiment, the shared NVM set and the isolated NVM set may be present together in one SSD 3. Accordingly, for example, it is possible to selectively use the shared NVM set and the isolated NVM set depending on a workload.

In FIG. 3, the following environments are provided to individual namespaces.

NVM Set 60

The namespaces 100 and 101 share one NVM subset 90. The die contention between the namespaces 100 and 101 and another namespace does not occur, but the GC contention between the namespaces 100 and 101 may occur.

NVM Set 61

The namespace 102 exclusively uses one NVM subset 91. The die contention and the GC contention between the namespace 102 and another namespace may not occur.

NVM Set 62

The namespace 103 exclusively uses two NVM subsets 92 and 93. The die contention between the namespace 103 and another namespace that uses the NVM set 62 may occur, but the GC contention between the namespace 103 and another namespace may not occur.

The namespaces 104 and 105 share one NVM subset 94. The die contention between the namespaces 104 and 105 and another namespace that uses the NVM set 62 may occur. The GC contention between the namespaces 104 and 105 and another namespace may not occur, but the GC contention between the namespaces 104 and 105 may occur.

The namespace 106 exclusively uses one NVM subset 95. The die contention between the namespace 106 and another namespace that uses the NVM set 62 may occur, but the GC contention between the namespace 106 and another namespace may not occur.

Hereinafter, a host write/garbage collection operation for the isolated NVM sets 60 and 61 will be described with reference to FIG. 4.

Figure 4:
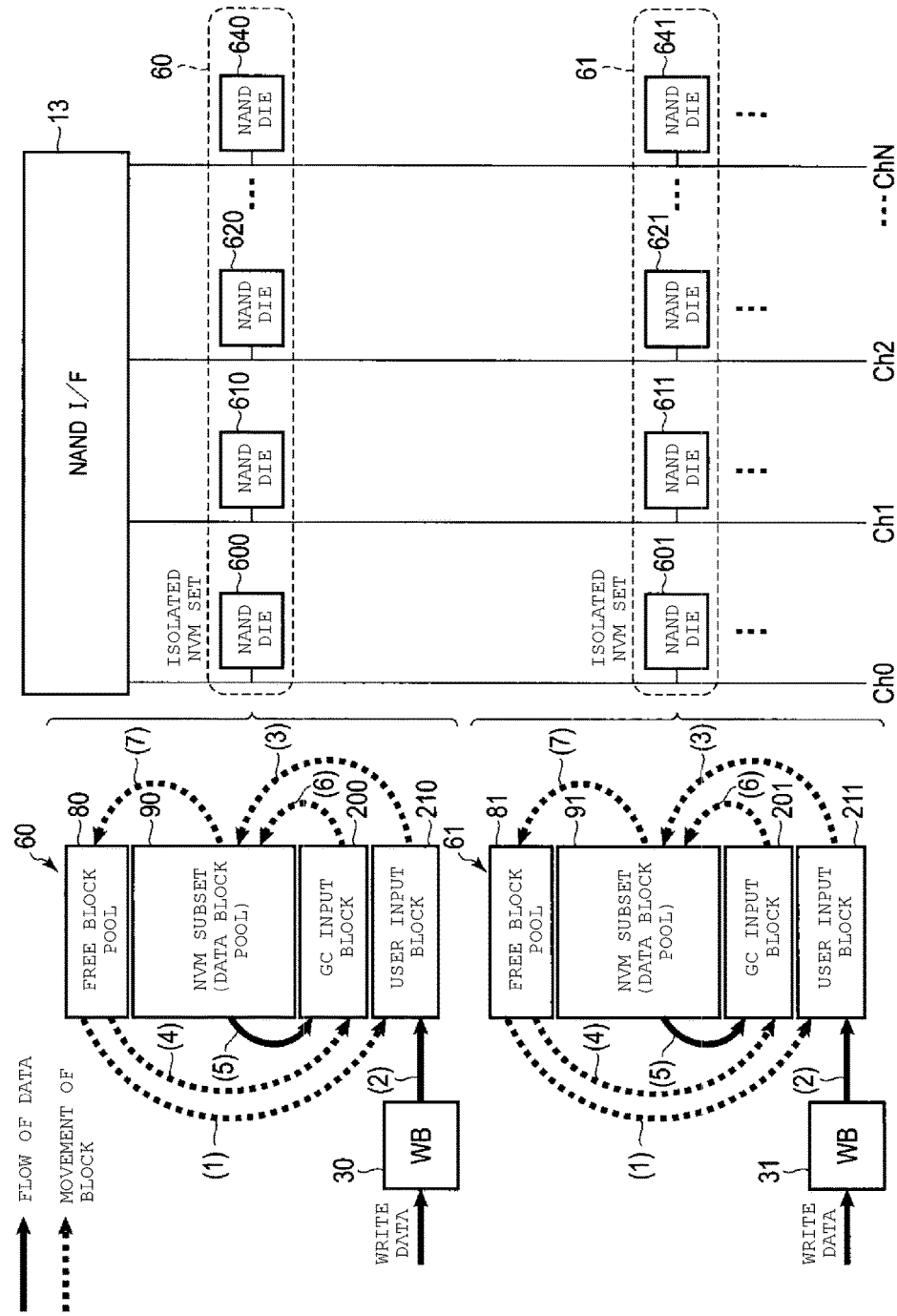
FIG. 4 illustrates a host write/garbage collection operation for an isolated NVM set which is performed by the memory system according to the embodiment.

The host write/garbage collection operation for the NVM set 60 is illustrated on an upper left side of FIG. 4.

(1) Allocation of User Input Block

Initially, one free block within the free block pool 80 is allocated as a user input block 210. The user input block 210 is a block in which write data from the host 2 is written, and is referred to as a writing destination block. When the user input block 210 is previously allocated, this operation is not performed.

(2) Host Write

The write data from the host 2 is written in the user input block 210 from the write buffer 30. The write data associated with the namespace 100 or the namespace 101 is temporarily stored in the write buffer 30. The lookup table corresponding to the NVM set 60 is updated, and thus, the physical address indicating the physical storage position within the user input block 210 in which the write data is written maps to the logical address (LBA) corresponding to the write data.

(3) Movement of User Input Block

When the user input block 210 is filled with the write data, the user input block 210 is moved to the NVM subset 90. That is, the user input block 210 filled with the data is managed by the NVM subset 90.

(4) Allocation of GC Input Block

When it is necessary to perform the garbage collection in the NVM set 60, the garbage collection operation for the block group within the NVM subset 90 is performed independently of another NVM set. For example, the number of blocks included in the NVM subset 90 is greater than a certain threshold X1 corresponding to the NVM subset 90, it may be determined that the garbage collection operation is necessary. The threshold X1 may be determined based on the total number of blocks capable of being allocated for the NVM subset 90. For example, the remainder acquired by subtracting a predetermined number from the total number of blocks capable of being allocated for the NVM subset 90 may be used as a certain threshold X1 corresponding to the NVM subset 90.

When it is necessary to perform the garbage collection in the NVM set 60, one free block within the free block pool 80 is allocated as a GC input block 200. The GC input block 200 is a block which is a copying destination of the valid data in the garbage collection, and is referred to as a copying destination block.

(5) Copy of Valid Data

One or more blocks which store the valid data and the invalid data together are selected as the copying source block from the blocks within the NVM subset 90. Only the valid data of the selected block is copied to the GC input block 200. The lookup table corresponding to the NVM set 60 is updated, and thus, the physical address indicating the physical storage position within the GC input block 200 to which the valid data is copied maps to the logical address (LBA) corresponding to the copied valid data.

(6) Movement of GC Input Block

When the GC input block 200 is filled with the valid data, the GC input block 200 is moved to the NVM subset 90. That is, the GC input block 200 filled with the valid data is managed by the NVM subset 90.

(7) Return of Block

The block that is managed by the NVM subset 90 and does not store the valid data is returned to the free block pool 80 from the NVM subset 90. The block that does not store the valid data is a block in which all data are invalidated through the host write or is a block of which all valid data are copied to the copying destination block through the garbage collection operation.

The host write/garbage collection operation for the NVM set 61 is shown on a lower left side of FIG. 4.

(1) Allocation of User Input Block

One free block within the free block pool 81 is allocated as a user input block 211.

(2) Host Write

The write data from the host 2 is written in the user input block 211 from the write buffer 31. The write data associated with the name space 102 is temporarily stored in the write buffer 31. The lookup table corresponding to the NVM set 61 is updated, and thus, the physical address indicating the physical storage position within the user input block 211 in which the write data is written maps to the logical address (LBA) corresponding to the write data.

(3) Movement of User Input Block

When the user input block 211 is filled with the write data, the user input block 211 is moved to the NVM subset 91. That is, the user input block 211 filled with the data is managed by the NVM subset 91.

(4) Allocation of GC Input Block

When it is necessary to perform the garbage collection in the NVM set 61, the garbage collection operation for the block group within the NVM subset 91 is performed independently of another NVM set. For example, the number of blocks included in the NVM subset 91 is greater than a certain threshold X1 corresponding to the NVM subset 91, it may be determined that the garbage collection operation is necessary. The threshold X1 may be determined based on the total number of blocks capable of being allocated for the NVM subset 91. For example, the remainder acquired by subtracting a predetermined number from the total number of blocks capable of being allocated for the NVM subset 91 may be used as a certain threshold X1 corresponding to the NVM subset 91.

When it is necessary to perform the garbage collection in the NVM set 61, one free block within the free block pool 81 is allocated as a GC input block 201.

(5) Copy of Valid Data

One or more blocks which store the valid data and the invalid data together are selected as the copying source block from the blocks within the NVM subset 91. Only the valid data of the selected block is copied to the GC input block 201. The lookup table corresponding to the NVM set 61 is updated, and thus, the physical address indicating the physical storage position within the GC input block 201 to which the valid data is copied maps to the logical address (LBA) corresponding to the copied valid data.

(6) Movement of GC Input Block

When the GC input block 201 is filled with the valid data, the GC input block 201 is moved to the NVM subset 91. That is, the GC input block 201 filled with the valid data is managed by the NVM subset 91.

(7) Return of Block

The block that is managed by the NVM subset 91 and does not store the valid data is returned to the free block pool 81 from the NVM subset 91. The block that does not store the valid data is a block in which all data are invalidated through the host write or is a block of which all valid data are copied to the copying destination block through the garbage collection operation.

Figure 5:
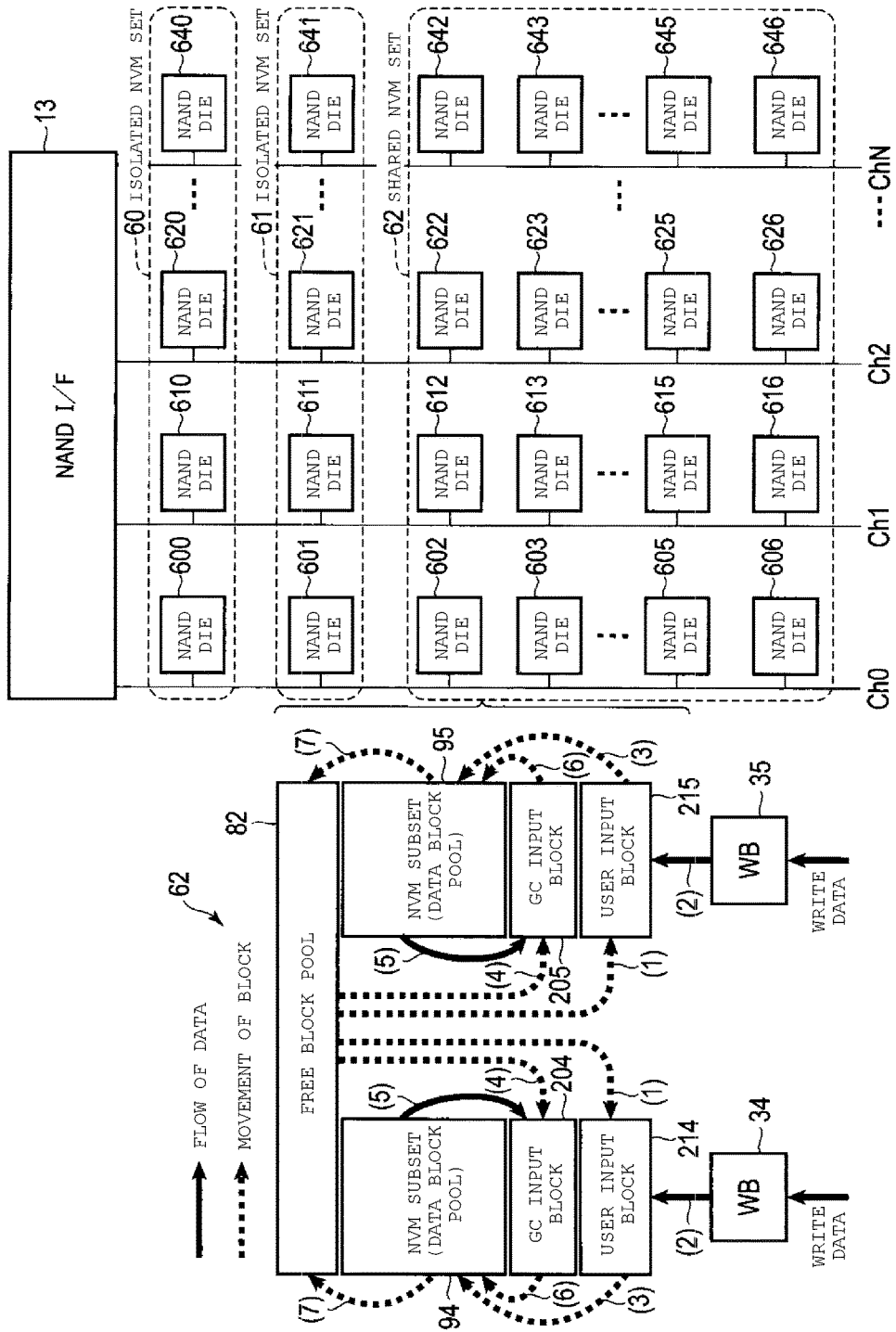
FIG. 5 illustrates a host write/garbage collection operation for a shared NVM set which is performed by the memory system according to the embodiment.

FIG. 5 shows the host write/garbage collection operation performed for the shared NVM set 62. In this example, it is assumed that the shared NVM set 62 includes only two NVM subsets 94 and 95.

The host write/garbage collection operation for the NVM subset 94 is performed as follows.

(1) Allocation of User Input Block

One free block within the free block pool 82 is allocated as a user input block 214.

(2) Host Write

The write data from the host 2 is written in the user input block 214 from the write buffer 34. The write data associated with the namespace 104 or 105 is temporarily stored in the write buffer 34. The lookup table corresponding to the NVM subset 94 is updated, and thus, the physical address indicating the physical storage position within the user input block 214 in which the write data is written maps to the logical address (LBA) corresponding to the write data.

(3) Movement of User Input Block

When the user input block 214 is filled with the write data, the user input block 214 is moved to the NVM subset 94. That is, the user input block 214 filled with the data is managed by the NVM subset 94.

(4) Allocation of GC Input Block

When it is necessary to perform the garbage collection in the NVM subset 94, the garbage collection operation for the block group within the NVM subset 94 is performed independently of another NVM set and another NVM subset within the NVM set 62. For example, the number of blocks included in the NVM subset 94 is greater than a certain threshold X1 corresponding to the NVM subset 94, it may be determined that the garbage collection operation is necessary. The threshold X1 may be determined based on the total number of blocks capable of being allocated for the NVM subset 94. For example, the remainder acquired by subtracting a predetermined number from the total number of blocks capable of being allocated for the NVM subset 94 may be used as a certain threshold X1 corresponding to the NVM subset 94.

When it is necessary to perform the garbage collection in the NVM subset 94, one free block within the free block pool 82 is allocated as a GC input block 204.

(5) Copy of Valid Data

One or more blocks which store the valid data and the invalid data together are selected as the copying source block from the blocks within the NVM subset 94. Only the valid data of the selected block is copied to the GC input block 204. The lookup table corresponding to the NVM subset 94 is updated, and thus, the physical address indicating the physical storage position within the GC input block 204 to which the valid data is copied maps to the logical address (LBA) corresponding to the copied valid data.

(6) Movement of GC Input Block

When the GC input block 204 is filled with the valid data, the GC input block 204 is moved to the NVM subset 94. That is, the GC input block 204 filled with the valid data is managed by the NVM subset 94.

(7) Return of Block

The block that is managed by the NVM subset 94 and does not store the valid data is returned to the free block pool 82 from the NVM subset 94. The block that does not store the valid data is a block in which all data are invalidated through the host write or is a block of which all valid data are copied to the copying destination block through the garbage collection operation.

The host write/garbage collection operation for the NVM subset 95 is performed in the same order as the host write/garbage collection operation for the NVM subset 94.

Figure 6:
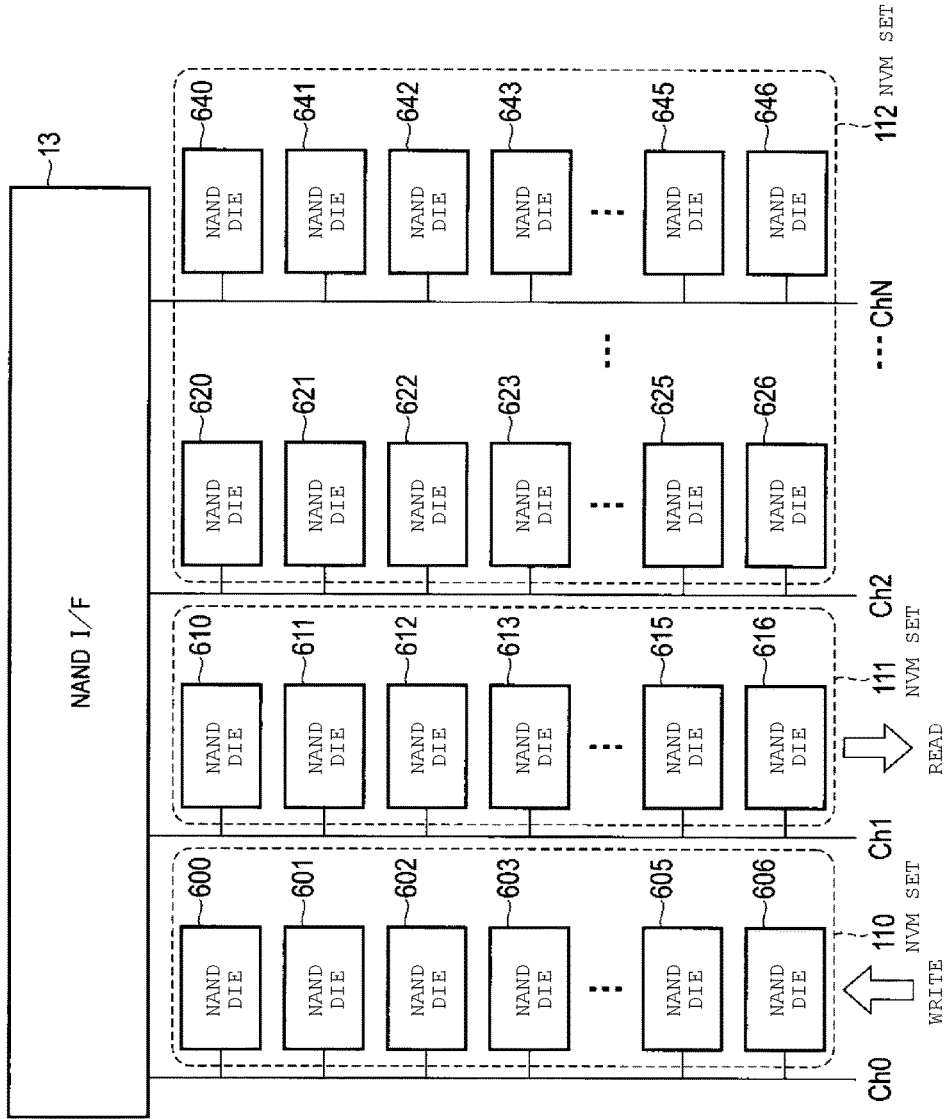
FIG. 6 is a block diagram showing a plurality of NVM sets formed of the NAND flash memory dies within the memory system according to the embodiment.

FIG. 6 shows another configuration example of the plurality of NVM sets.

In FIG. 6, each NVM set includes a set of NAND flash memory dies connected to the same channel. That is, an NVM set 110 includes NAND flash memory dies 600, 601, 602, 603, . . . , 605, and 606 connected to a channel Ch0. An NVM set 111 includes NAND flash memory dies 610, 611, 612, 613, . . . , 615, and 616 connected to a channel Ch1. An NVM set 112 includes NAND flash memory dies 620, 621, 622, 623, . . . , 625, and 626 connected to a channel Ch2 and NAND flash memory dies 640, 641, 642, 643, . . . , 645, and 646 connected to a channel ChN.

In the NVM set configuration of FIG. 6, the NVM sets 110, 111, and 112 are accessed through different channels. Accordingly, even though the data write/read operation for any NAND flash memory die within a certain NVM set is being performed, it is possible to immediately perform the data write/read operation for an arbitrary NAND flash memory die within another NVM set.

In the NVM set configuration of FIG. 2 in which each NVM set extends over the plurality of channels, one channel is shared between the NVM sets. Accordingly, in the NVM set configuration of FIG. 2, when the write/read requests for the NAND flash memory die 600 within the NVM set 60 and the write/read requests for the NAND flash memory die 601 within the NVM set 61 are simultaneously received, the latency caused by the contention of the access to the channel Ch0 may be lengthened.

In the NVM set configuration of FIG. 6, since the NVM sets 110, 111, and 112 are accessed through different channels, even though the write/read requests for the NVM sets 110, 111, and 112 are simultaneously received, it is possible to immediately execute the write/read request. Accordingly, it is possible to shorten the latency for an access request from the host 2.

However, in the NVM set configuration of FIG. 6, the peak I/O capabilities of each NVM set is limited by the capabilities of a single channel. Accordingly, the NVM set configuration of FIG. 6 is appropriately used by being combined with a mechanism capable of improving the capabilities of a single channel.

Figure 7:
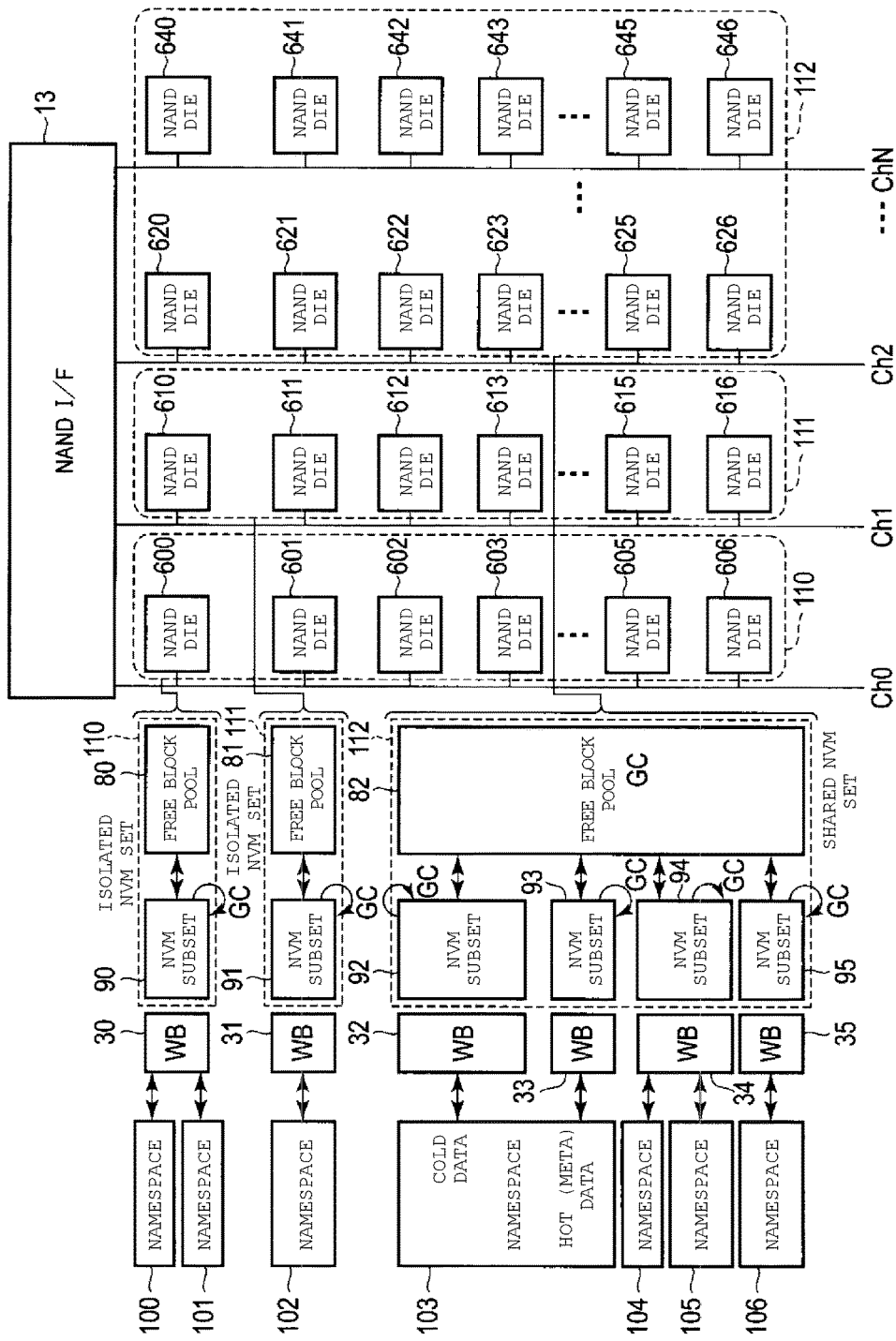
FIG. 7 is a block diagram showing the relationship between block management corresponding to each NVM set of FIG. 6 and one or more areas corresponding to each NVM set.

FIG. 7 shows the relationship between the block management corresponding to each NVM set of FIG. 6 and one or more areas corresponding to each NVM set.

Similarly to the NVM set 60 of FIG. 2, the NVM set 110 may function as the isolated NVM set. In the process of initializing the SSD 3, all blocks belonging to the NVM set 110 are arranged in the dedicated free block pool 80 for the NVM subset 90. Similarly to the NVM set 61 of FIG. 2, the NVM set 111 may function as the isolated NVM set. In the process of initializing the SSD 3, all blocks belonging to the NVM set 111 are arranged in the dedicated free block pool 81 for the NVM subset 91. Similarly to the NVM set 62 of FIG. 2, the NVM set 112 may function as the classified NVM set. In the process of initializing the SSD 3, all blocks belonging to the NVM set 112 are arranged in the free block pool 82 shared among the NVM subsets 92 to 95.

Figure 8:
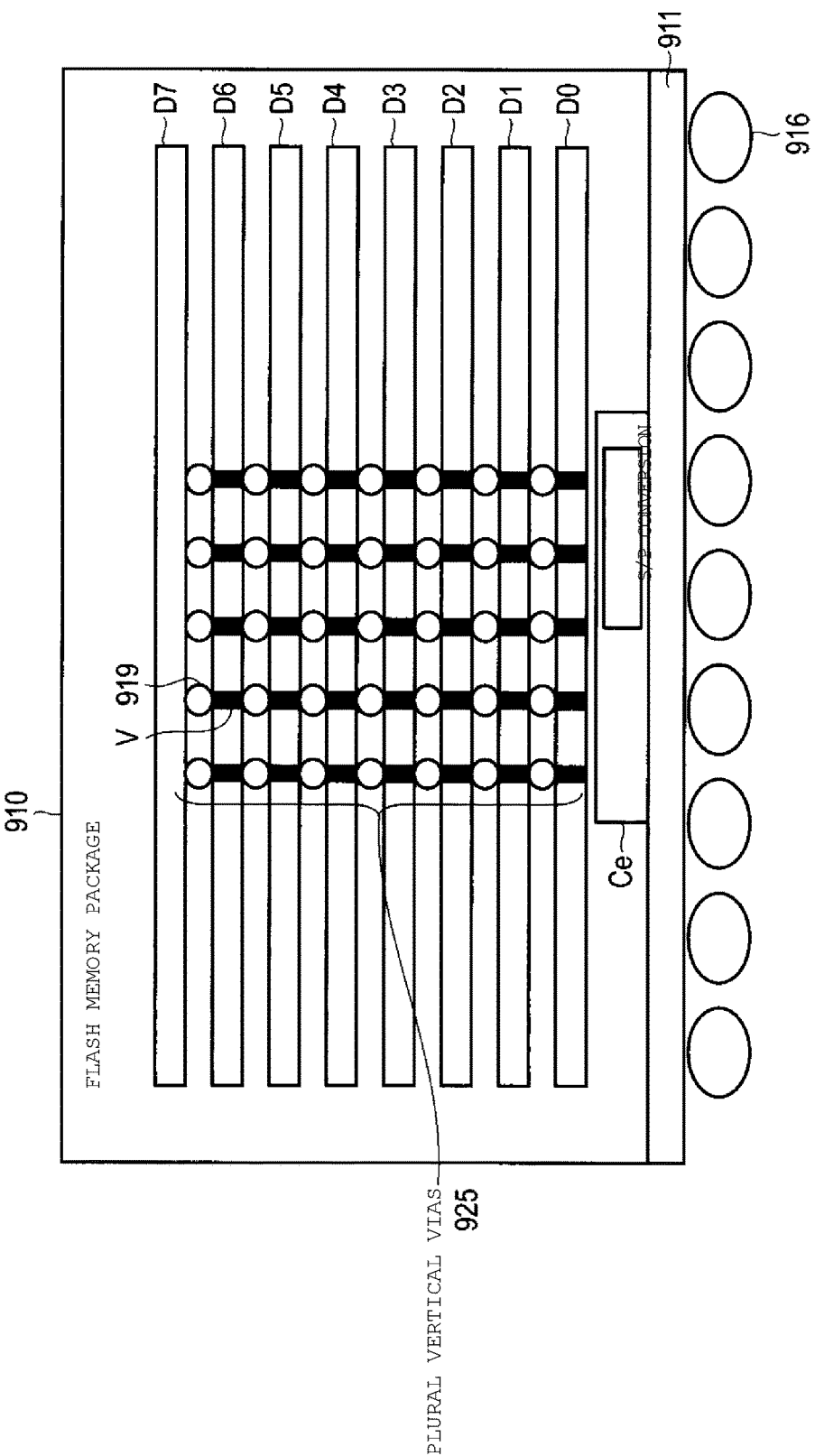
FIG. 8 schematically illustrates a flash memory package applied to the memory system according to the embodiment.

FIG. 8 is a schematic diagram of a flash memory package capable of being used as the NAND flash memory 5 mounted on the SSD 3.

A flash memory package 910 is a memory package capable of accelerating data input and output and reducing power consumption by a through-silicon via (TSV) technology that uses an electrode passing vertically through the inside of the NAND flash memory dies stacked within the package. In the flash memory package 910, the plurality of stacked NAND flash memory dies is accommodated in a single package. Although it has been described in this example that eight NAND flash memory dies D0 to D7 are accommodated in a single package, the number of NAND flash memory dies accommodated in the package is not limited to this example.

The flash memory package 910 includes a package substrate 911 such as a printed wiring board, an interface die (also referred to as an interface chip) Ce, and the stacked NAND flash memory dies D0 to D7. A plurality of solder bumps 916 functioning as a plurality of external I/O terminals (electrodes) for inputting and outputting signals is arranged on a rear surface of the package substrate 911. These signals include a 8-bit I/O signal, and various control signals (a plurality of chip enable signals CE, a command latch enable signal CLE, an address latch enable signal ALE, a write enable signal WE, a read enable signal RE, a plurality of ready/busy signals RB, and the like). The 8-bit I/O signal is used for transmitting a command, an address, data, and the like. Apart of the address may include a chip address. The NAND flash memory die which is an accessing target may be selected by the combination of the chip enable signal CE and the chip address.

The interface die Ce is disposed on a front surface of the package substrate 911. The interface die Ce is connected to the plurality of solder bumps 916 through a wiring layer (not shown).

The stacked NAND flash memory dies D0 to D7 are connected to one another through a plurality of vertical vias 925. The interface die Ce transmits the I/O signal, the chip enable signals CE, the command latch enable signal CLE, the address latch enable signal ALE, the write enable signal WE, the read enable signal RE, and the like to the NAND flash memory dies D0 to D7 through the plurality of vertical vias 925, and receives the I/O signal, the ready/busy signal RB, and the like from the NAND flash memory dies D0 to D7 through the plurality of vertical vias 925.

The interface die Ce may be built in a parallel/serial conversion circuit. For example, the interface die Ce may convert the 8-bit I/O signals from the controller 4 into 64-bit I/O signals by using the parallel/serial conversion circuit, and may transmit the 64-bit I/O signals to the NAND flash memory dies D0 to D7 through 64 specific vertical vias provided in the plurality of vertical vias 925.

Each of the vertical vias 925 includes a plurality of through-electrodes V passing through semiconductor substrates of the stacked NAND flash memory dies D0 to D7, and a plurality of bump electrodes (solder bumps) 919 that connects the stacked NAND flash memory dies D0 to D7.

In a memory package that uses wire bonding in the related art, when the number of stacked dies is increased, parasitic capacitance and parasitic resistance of the external I/O terminal of the package are increased, and thus, it is difficult to operate the memory package at a high frequency.

In the flash memory package 910 of FIG. 8, the stacked NAND flash memory dies D0 to D7 are connected to one another through the plurality of vertical vias 925 instead of the bonding wire. Accordingly, it is possible to decrease the parasitic capacitance and parasitic resistance of the external I/O terminal, and it is possible to operate each NAND flash memory die within the flash memory package 910 in a high frequency.

Figure 9:
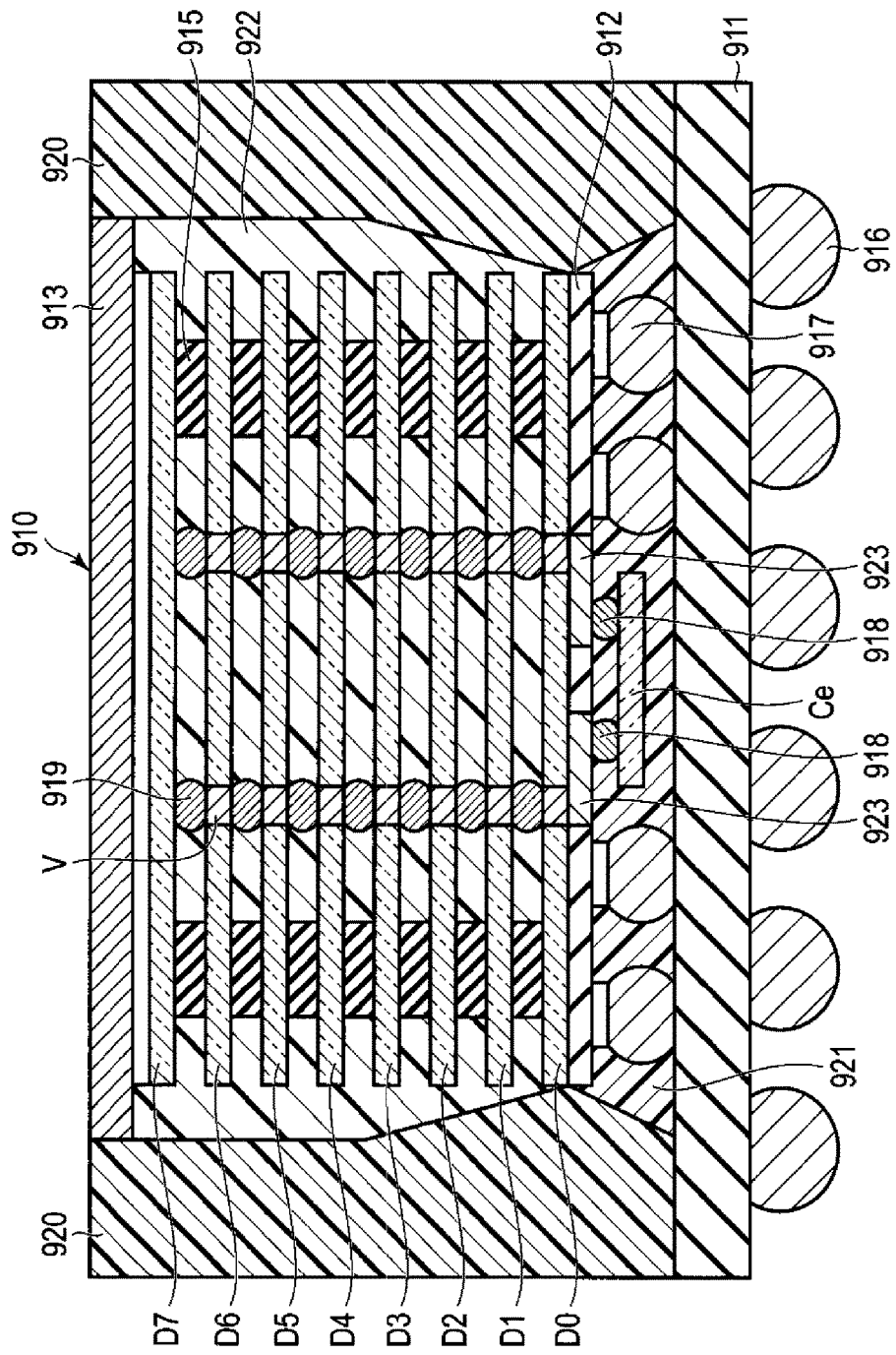
FIG. 9 is a cross-sectional view of the flash memory package of FIG. 8.

FIG. 9 is a cross-sectional view of the flash memory package 910.

The stacked NAND flash memory dies D0 to D7 are mounted on a rear surface of a supporting substrate 912. The through-electrodes V are embedded in each of the NAND flash memory dies D0 to D7. The through-electrode V is an electrode passing through the semiconductor substrate of the corresponding NAND flash memory die. The through-electrodes V of two adjacent NAND flash memory dies are connected through the solder bumps 919. The through-electrodes V may be connected to the solder bumps 919 through the wiring layer formed on the semiconductor substrate on the front surface of each NAND flash memory die. The two adjacent NAND flash memory dies may be physically coupled through an adhesive layer 915.

The interface die Ce is mounted on a rear surface of the supporting substrate 912. A wiring layer 923 is formed on the supporting substrate 912. The interface die Ce is connected to the wiring layer 923 through a plurality of solder bumps 918. The through-electrodes V of the NAND flash memory die D0 which is the bottommost layer are connected to the wiring layer 923. Accordingly, the interface die Ce is electrically connected to the NAND flash memory dies D0 to D7.

The supporting substrate 912 is connected to the package substrate 911 through a plurality of solder bumps 917. The interface die Ce is sealed with a sealing resin 921. The NAND flash memory dies D0 to D7 are sealed with a sealing resin 922. An area around the sealing resins 921 and 922 are sealed with a sealing resin 920, and an upper area above the sealing resin 922 is sealed with a metal plate 913.

Figure 10:
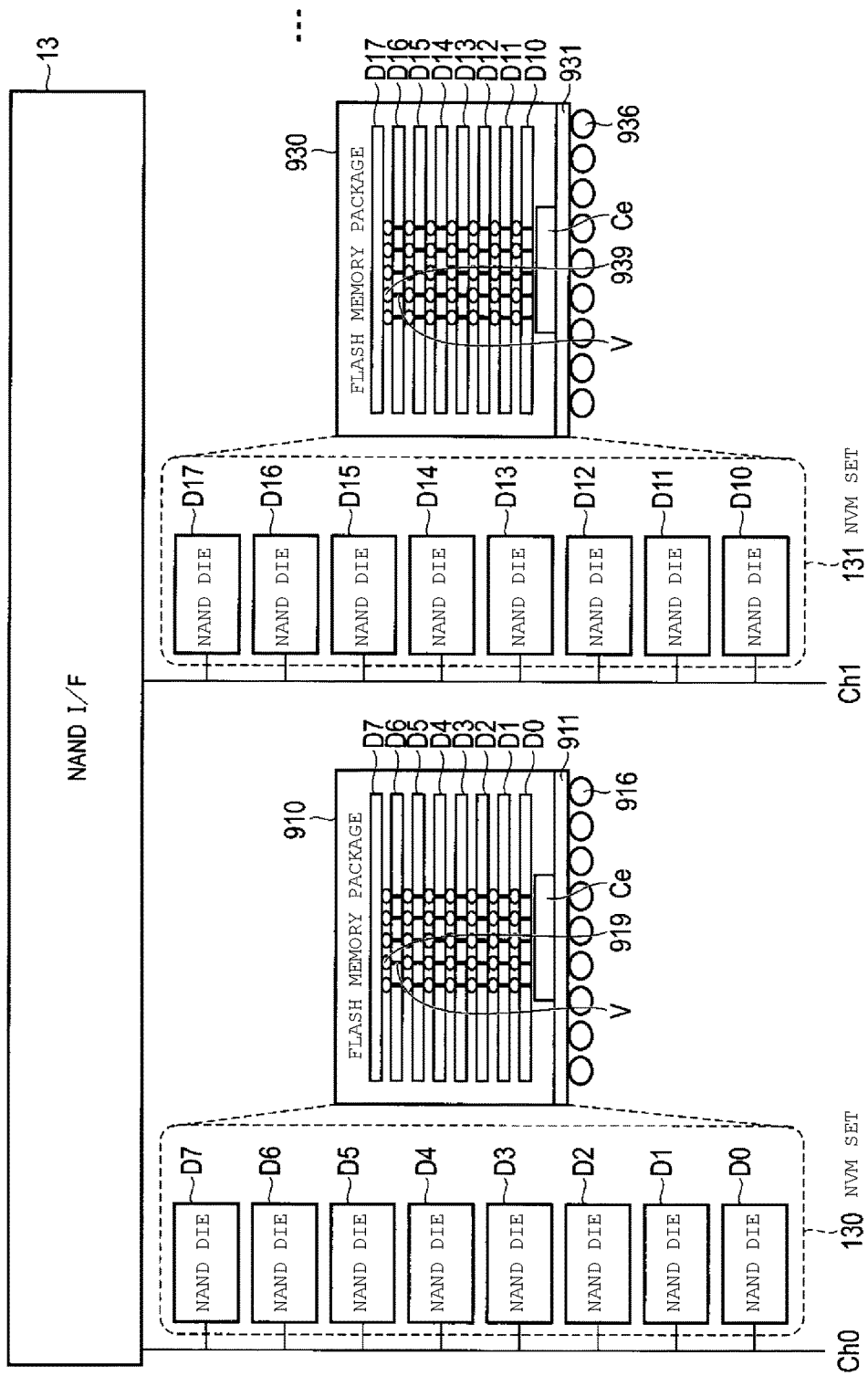
FIG. 10 illustrates the relationship between the plurality of NVM sets each including the set of NAND flash memory dies connected to the same channel and one or more flash memory packages used as the NVM sets.

FIG. 10 shows the relationship between the plurality of NVM sets illustrated in FIG. 6 and one or more flash memory packages used as these NVM sets. In FIG. 10, the plurality of NAND flash memory dies within the NAND flash memory 5 is classified into two NVM sets 130 and 131. The NVM sets 130 and 131 correspond to the isolated NVM sets 110 and 111 described in FIG. 6. The NVM set 130 includes NAND flash memory dies D0 to D7 connected to a channel Ch0, and the NVM set 131 includes NAND flash memory dies D10 to D17 connected to a channel Ch1.

The NAND flash memory dies D0 to D7 within the NVM set 130 are implemented by a single flash memory package 910. In the flash memory package 910, the NAND flash memory dies D0 to D7 are stacked and the NAND flash memory dies D0 to D7 are connected to one another through a plurality of vertical vias (each vertical via including a through-electrode V and a solder bump 919) as shown in FIGS. 8 and 9. A plurality of external I/O terminals (e.g., solder bumps 916) formed on a rear surface of a package substrate 911 of the flash memory package 910 is connected to a plurality of signal lines within the channel Ch0. These signal lines may include a 8-bit I/O signal line and a plurality of control signal lines for various control signals (e.g., a plurality of chip enable signals CE, a command latch enable signal CLE, an address latch enable signal ALE, a write enable signal WE, a read enable signal RE, a plurality of ready/busy signals RB, and the like). The signals received from the NAND interface 13 through the channel Ch0 are transmitted to the NAND flash memory dies D0 to D7 through the interface die Ce and the plurality of vertical vias.

Similarly, the NAND flash memory dies D10 to D17 within the NVM set 131 are also implemented by a single flash memory package 930. The flash memory package 930 has the same structure as that of the flash memory package 910. That is, in the flash memory package 930, the NAND flash memory dies D10 to D17 are stacked and the NAND flash memory dies D10 to D17 are connected to one another through the plurality of vertical vias (each vertical via including a through-electrode V and a solder bump 939). A plurality of external I/O terminals (e.g., solder bumps 936) formed on a rear surface of a package substrate 931 of the flash memory package 930 is connected to a plurality of signal lines within the channel Ch1. These signal lines may include a 8-bit I/O signal line and a plurality of control signal lines for various control signals (e.g., a plurality of chip enable signals CE, a command latch enable signal CLE, an address latch enable signal ALE, a write enable signal WE, a read enable signal RE, a plurality of ready/busy signals RB, and the like). The signals received from the NAND interface 13 through the channel Ch1 are transmitted to the NAND flash memory dies D10 to D17 through the interface die Ce and the plurality of vertical vias.

The controller 4 performs the data write/read operation for the NVM set 130 through the channel Ch0 according to an I/O command from the host 2 to designate an area (e.g., namespace) corresponding to the NVM set 130. The controller 4 performs the data write/read operation for the NVM set 131 through the channel Ch1 according to an I/O command from the host 2 which is received from the host 2 to designate an area (e.g., namespace) corresponding to the NVM set 131.

In FIG. 10, the peak I/O capabilities of each NVM set is limited to the capabilities of a single channel, but the capabilities of each channel is further improved than in a typical memory package in which a plurality of dies is connected through the wire bonding. Accordingly, in the configuration of FIG. 10, it is possible to simultaneously execute the write/read requests for the NVM sets 130 and 131, and it is possible to minimize deterioration in the peak I/O capabilities of each NVM set.

Although it has been described in FIG. 10 that the plurality of NAND flash memory dies included in each isolated NVM set is implemented by the memory package using the plurality of vertical vias (TSVs), the plurality of NAND flash memory dies included in the shared NVM set may also be implemented by the memory package using the plurality of vertical vias (TSVs).

When a single memory package using the plurality of vertical vias (TSVs) supports two or more channels, the plurality of NAND flash memory dies included in two or more NVM sets corresponding to two or more channels may be implemented by a single memory package.

Hereinafter, the garbage collection operation for the NVM set 60 described in FIGS. 2 and 3 will be described in detail with reference to FIGS. 11 to 13.

Figure 11:
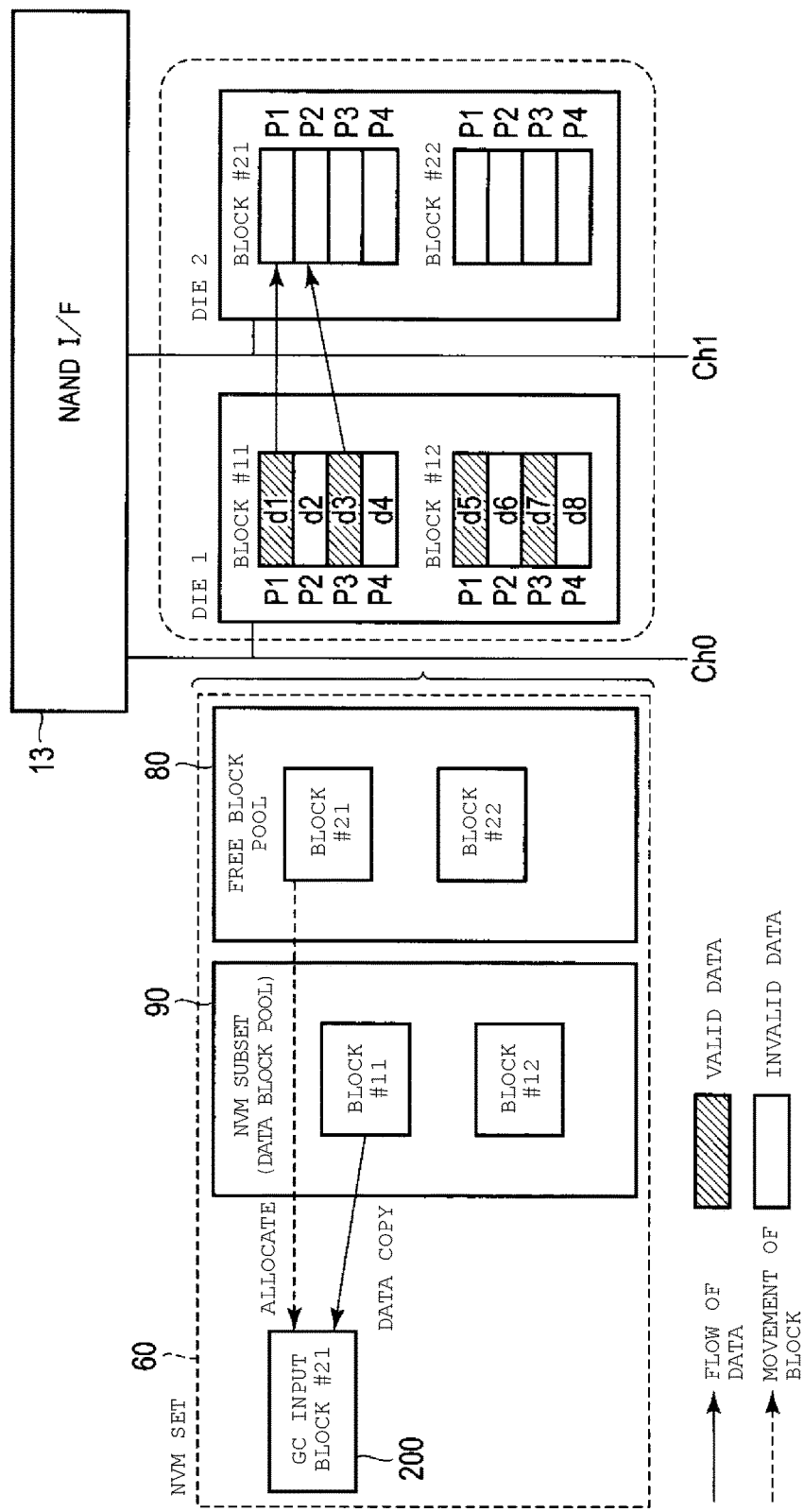
FIG. 11 illustrates some processes of a garbage collection operation for a certain NVM subset which is performed by the memory system according to the embodiment.
Figure 12:
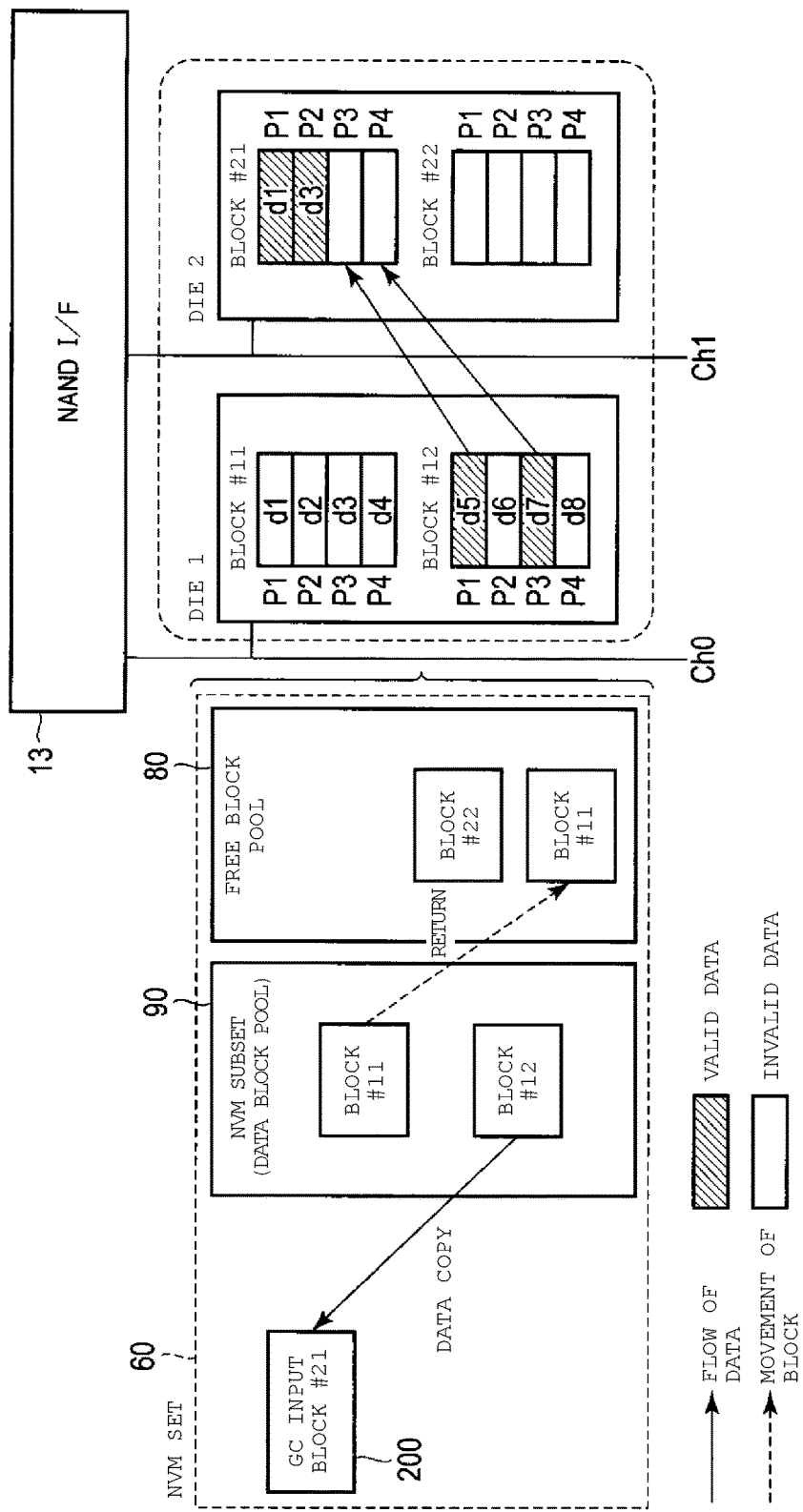
FIG. 12 illustrates some remaining processes of the garbage collection operation for the certain NVM subset which is performed by the memory system according to the embodiment.
Figure 13:
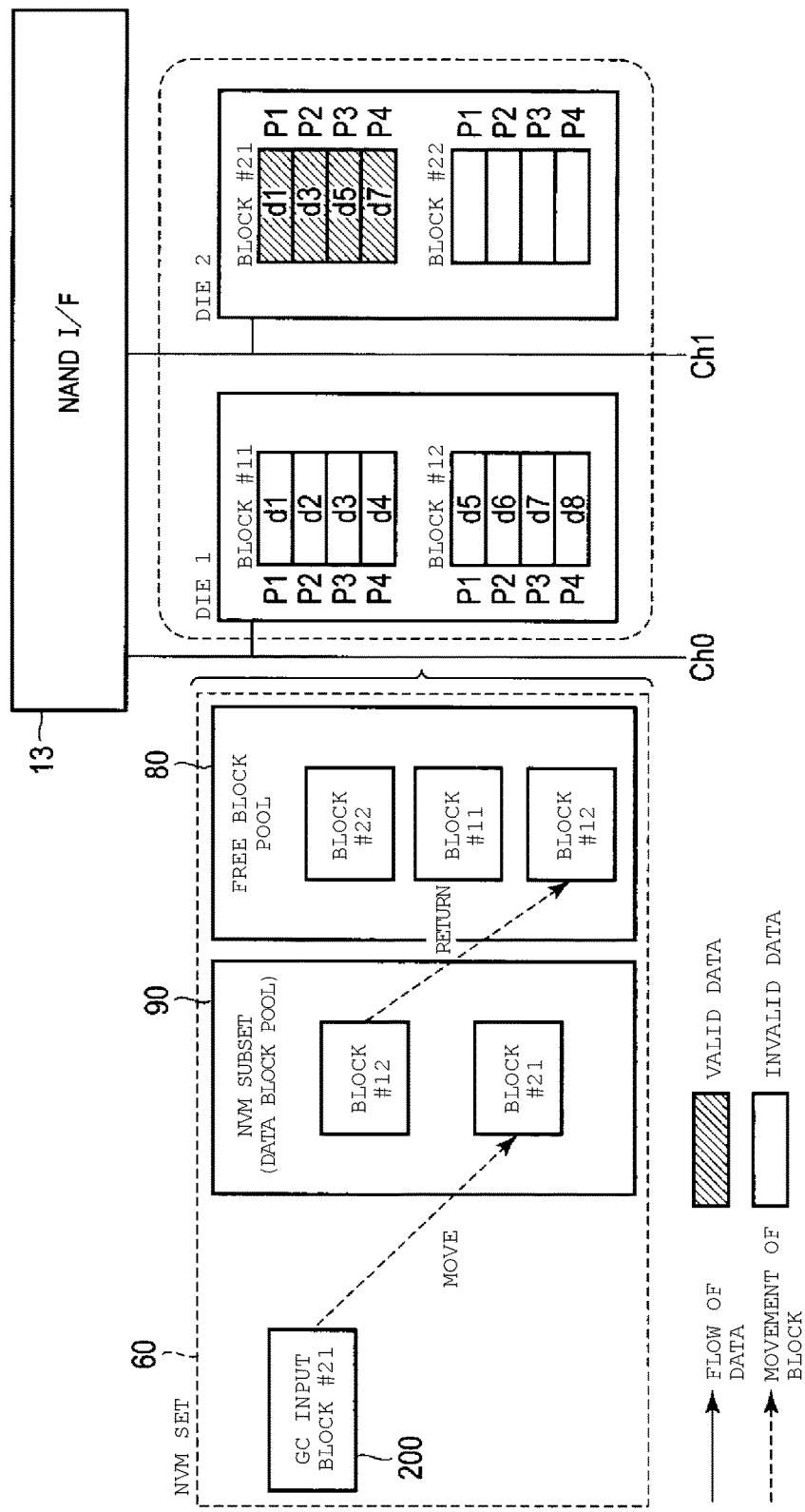
FIG. 13 illustrates the other remaining processes of the garbage collection operation for the certain NVM subset which is performed by the memory system according to the embodiment.

In FIGS. 11 to 13, it is assumed that the NVM set 60 includes two NAND flash memory dies 1 and 2 and each die includes two blocks including pages P1 to P4 for simplicity of illustration.

As shown in FIG. 11, the free block (free block #21 in this example) within the free block pool 80 is allocated as a GC input block 200.

Subsequently, the block (block #11 in this example) which stores the valid data and the invalid data together is selected as the copying source block from the NVM subset 90, and only the valid data within the selected copying source block (block #11 in this example) is copied to the GC input block 200 (block #21 in this example).

When valid data d1 and d3 and invalid data d2 and d4 are stored together in the block #11, only the valid data d1 and the data d3 are copied to the GC input block 200. In this case, the data d1 is copied to the page P1 of the block #21, and the data d3 is copied to the page P2 of the block #21.

When the valid data (i.e., the data d1 and the data d3) of the block #11 is copied to the GC input block 200, the data d1 and the data d3 of the block #11 are invalidated. Accordingly, since the block #11 is the block that does not store the valid data, the block #11 is returned to the free block pool 80 as shown in FIG. 12.

A block #12 which stores valid data d5 and d7 and invalid data d6 and d8 is present in the NVM subset 90. When the block #12 is selected as the copying source block, only the valid data (i.e., the data d5 and the data d7) of the block #12 are copied to the GC input block 200. In this case, the data d5 is copied to the page P3 of the block #21, and the data d7 is copied to the page P4 of the block #21.

When the valid data (i.e., the data d5 and the data d7) of the block #12 is copied to the GC input block 200, the data d5 and the data d7 of the block #12 are invalidated. Accordingly, since the block #12 is the block that does not store the valid data, the block #12 is returned to the free block pool 80 as shown in FIG. 13. When the data d5 and the data d7 are copied to the GC input block 200, the block #21 is filled with the valid data. In this case, the block #21 is moved to the NVM subset 90.

Figure 14:
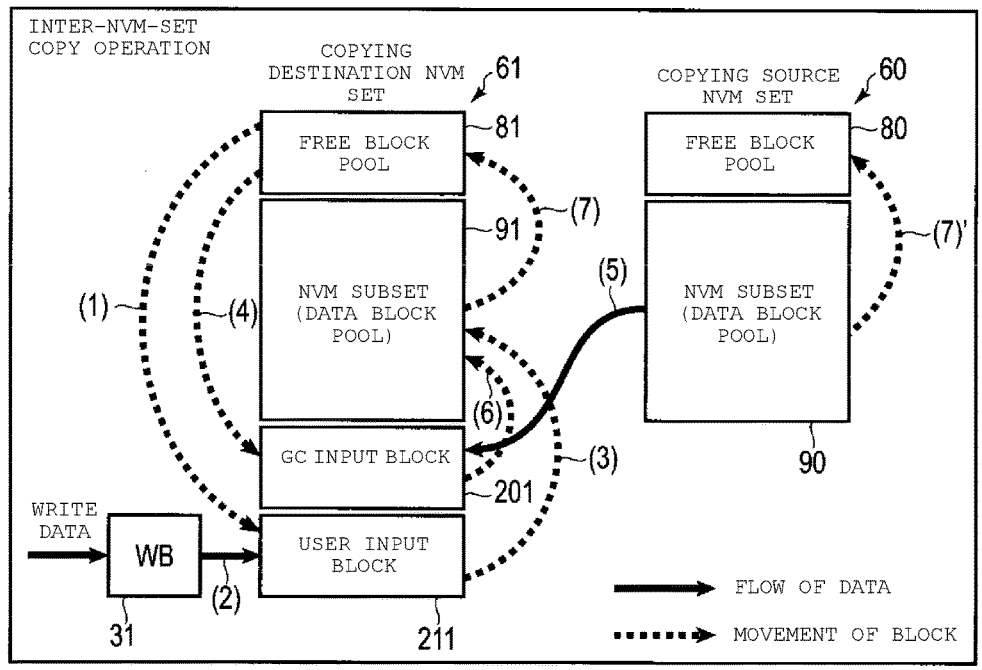
FIG. 14 illustrates an inter-NVM-set copy operation performed by the memory system according to the embodiment.

FIG. 14 shows the inter-NVM-set copy operation. In this example, the NVM set 60 of FIG. 2 is the copying source NVM set and the NVM set 61 of FIG. 2 is the copying destination NVM set will. The host 2 may designate the copying source NVM set and the copying destination NVM set. The copying destination NVM set may be the NVM set that is not currently used by the host 2. The NVM set that is not currently used by the host 2 is used as the copying destination NVM set, and thus, it is possible to prevent the hot data and the cold data from being stored together in the copying destination NVM set by performing the inter-NVM-set copy operation. When the NVM set that is not being currently used is not present, the host 2 may send a command for requesting the generation of a new NVM set to the SSD 3.

The inter-NVM-set copy operation is performed in the following order.

(1) Allocation of User Input Block

In the copying destination NVM set (NVM set 61 in this example), one free block within the free block pool 81 is allocated as the user input block 211.

(2) Host Write

The write data from the host 2 is written in the user input block 211 from the write buffer 31. The write data associated with the namespace 102 corresponding to the copying destination NVM set is typically stored in the write buffer 31, but the write data associated with the namespace 100 or 101 corresponding to the copying source NVM set is stored in the write buffer 31 after the inter-NVM-set copy operation is started. The lookup table corresponding to the NVM subset 90 is updated, and thus, the physical address indicating the physical storage position within the user input block 211 in which the write data is written maps to the logical address (LBA) corresponding to the write data.

As described above, the writing destination of the write data associated with the namespace 101 or the namespace 100 is the user input block 210 of the copying source NVM set (NVM set 60 in this example) before the inter-NVM-set copy operation, and the writing destination of the write data associated with the namespace 101 or the namespace 100 is the user input block 211 of the copying destination NVM set (NVM set 61 in this example) after the inter-NVM-set copy operation.

(3) Movement of User Input Block

When the user input block 211 is filled with the write data, the user input block 211 is moved to the NVM subset 91. That is, the user input block 211 filled with the data is managed by the NVM subset 91.

(4) Allocation of GC Input Block

In the copying destination NVM set, one free block within the free block pool 81 is allocated as the GC input block 201.

(5) Copy of Valid Data from Copying Source NVM Set to Copying Destination NVM Set The block that stores the valid data is selected as the copying source block from the blocks within the NVM subset 90 of the copying source NVM set. Only the valid data within the copying source block is copied to the GC input block 201 of the copying destination NVM set. In this case, the valid data which is the copying target is initially selected from the copying source block. The selected valid data is read from the copying source block, and is written in the GC input block 201.

When the valid data is copied to the GC input block 201, the lookup table corresponding to the NVM subset 90 is updated, and thus, the physical address indicating the physical storage position within the GC input block 201 to which the valid data is copied maps to the logical address (LBA) corresponding the copied valid data.

(6) Movement of GC Input Block

When the GC input block 201 is filled with the valid data from the block of the copying source NVM set in the copying destination NVM set, the GC input block 201 is moved to the NVM subset 91. That is, the GC input block 201 filled with the valid data is managed by the NVM subset 91.

(7) Return of Block

In the copying destination NVM set, the block that is managed by the NVM subset 91 and does not retina the valid data is returned to the free block pool 81 from the NVM subset 91. For example, when all data stored in a certain block within the NVM subset 91 are invalidated by writing new write data in the user input block 211, this block is returned to the free block pool 81 from the NVM subset 91.

(7)' Return of Copying Source Block

When there is no valid data in the copying source block through the copying of the valid data of the copying source block to the GC input block 201 in the copying source NVM set, the copying source block is returned to the free block pool 80 from the NVM subset 90.

For example, through the inter-NVM-set copy operation, the physical storage space for the data (e.g., hot data) stored in the copying source NVM set may be changed to the copying destination NVM set of which the number of times of rewrite is small (i.e., the number of program/erase cycles are small). Accordingly, it is possible to perform the wear leveling for equalizing the degrees of wear among the NVM sets.

Before the valid data selected as the copying target is actually copied to the GC input block 201, write data (e.g., new data corresponding to LBAx) having the same LBAx as the LBAx of the valid data may be written in the user input block 211. When the write data (e.g., new data corresponding to the LBAx) is written in the user input block 211, the lookup table corresponding to the NVM subset 90 is updated, and thus, the physical address indicating the physical storage position within the user input block 211 in which the write data is written maps to the LBAx corresponding to the write data.

In this case, the selected valid data is old data which is not read by the host 2. Accordingly, before the valid data selected as the copying target is actually copied to the GC input block 201, when the write data having the same LBAx as the LBAx of the valid data is written in the user input block 211, the copy operation of the valid data may be stopped. Accordingly, it is possible to prevent an unnecessary copy operation from being performed.

Alternatively, instead of stopping the copy operation of the valid data, the copy operation of the selected valid data may be performed, and the lookup table corresponding to the NVM subset 90 may not be updated. Accordingly, it is possible to prevent the physical address corresponding to the LBAx from being changed to a value indicating the physical storage position to which the valid data (which is old data) is copied. More specifically, each time the valid data corresponding to a certain LBA is copied to the GC input block 201, it may be determined whether the physical address corresponding to this LBA is a physical address corresponding to the copying source NVM set or a physical address corresponding to the copying destination NVM set by referring to the lookup table. When this physical address is the physical address corresponding to the copying destination NVM set, it is not recognized that the new data corresponding to the LBA is written in the user input block 211, and the lookup table is not updated. Meanwhile, when this physical address is the physical address corresponding to the copying source NVM set, it is recognized that the copied valid data is the latest data corresponding to the LBA, and the lookup table is updated. Through the updating of the lookup table, the physical address indicating the physical storage position to which the valid data is copied maps to this LBA.

Figure 15:
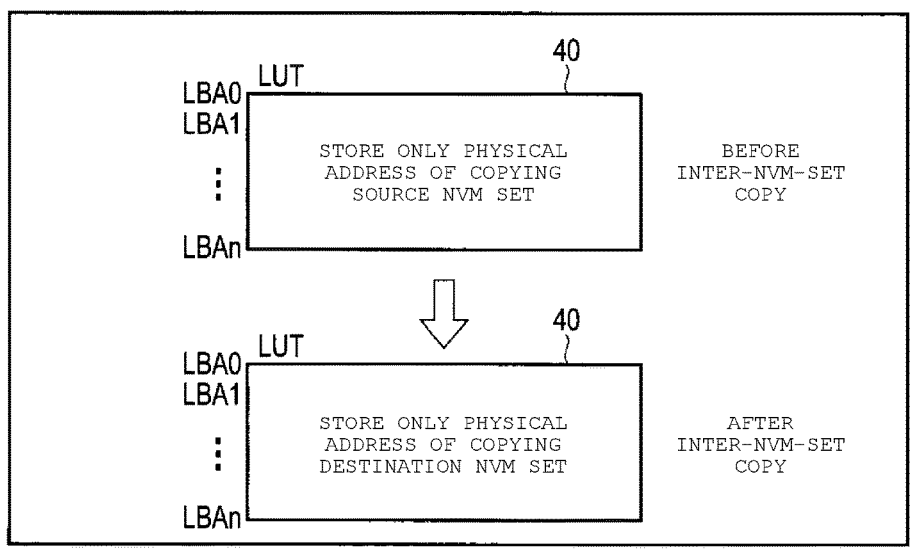
FIG. 15 illustrates the relationship between the contents of an address translation table before the inter-NVM-set copy operation of FIG. 14 and the contents of the address translation table after the inter-NVM-set copy operation.

FIG. 15 shows the relationship between the contents of the address translation table before the inter-NVM-set copy operation of FIG. 14 and the contents of the address translation table after the inter-NVM-set copy operation. The LUT 40 corresponding to the NVM subset 90 stores only the physical addresses of the copying source NVM set before the inter-NVM-set copy operation.

When the inter-NVM-set copy operation from the copying source NVM set from the copying destination NVM set is started, the physical addresses of the LUT 40 are sequentially updated. For example, when data d10 corresponding to LBA 10 is copied to the GC input block 201 of the copying destination NVM set from the copying source NVM set, the physical address indicating the physical storage position within the copying destination NVM set to which the data d10 is copied maps to the LBA 10 of the LUT 40. Accordingly, when the inter-NVM-set copy operation is completed, the LUT 40 stores only the physical address of the NVM set 61.

As described above, the inter-NVM-set copy operation is performed by using the same mechanism as that of the GC, and thus, the controller 4 does not a special process of generating address conversion information corresponding to the data copied to the copying destination NVM set, and may read the data requested from the host 2 from the copying destination NVM set by referring to the LUT 40.

Hereinafter, the inter-NVM-set copy operation will be described in detail with reference to FIGS. 16 to 18.

Figure 16:
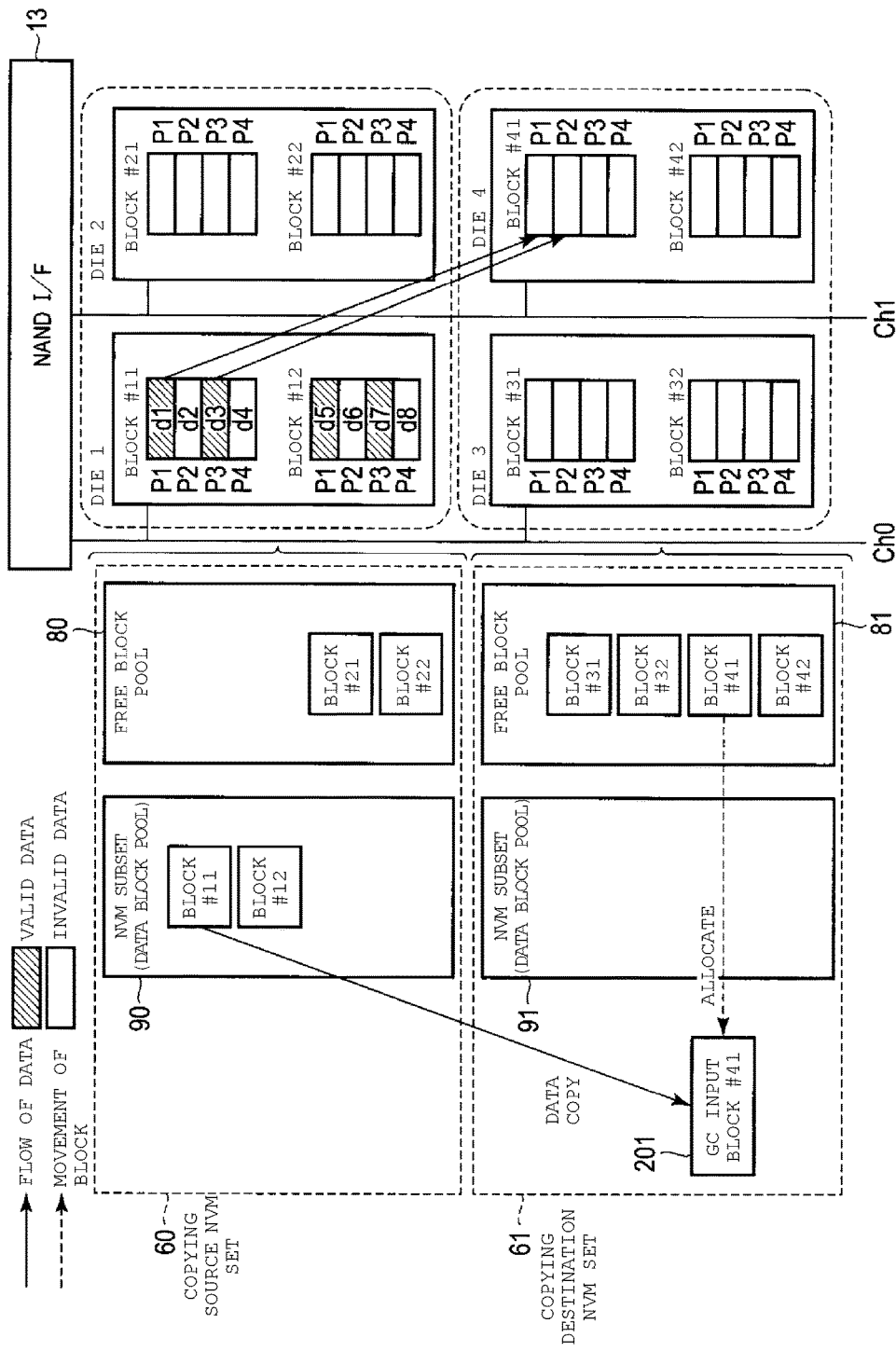
FIG. 16 illustrates some processes of the inter-NVM-set copy operation performed by the memory system according to the embodiment.
Figure 17:
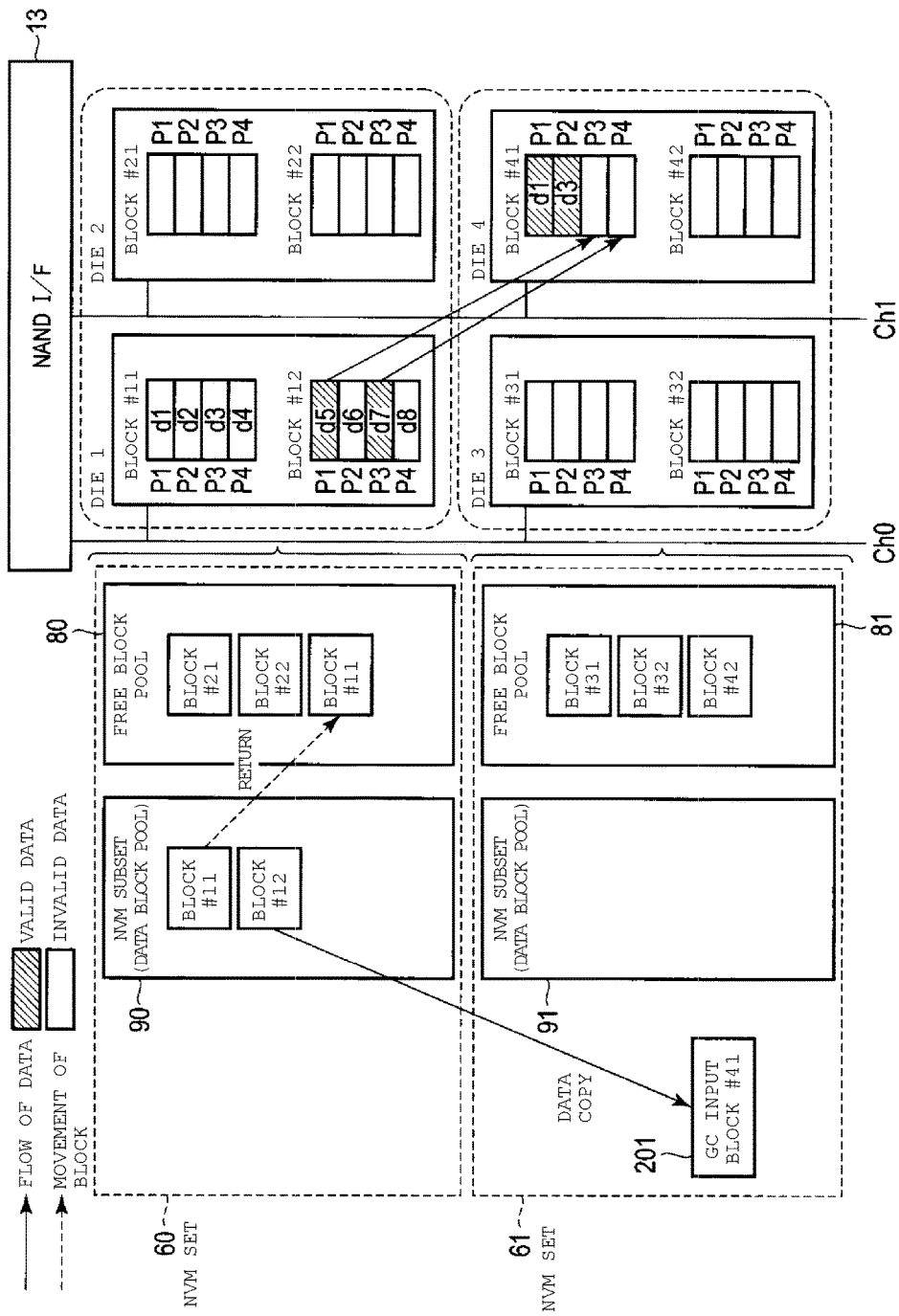
FIG. 17 illustrates some remaining processes of the inter-NVM-set copy operation performed by the memory system according to the embodiment.
Figure 18:
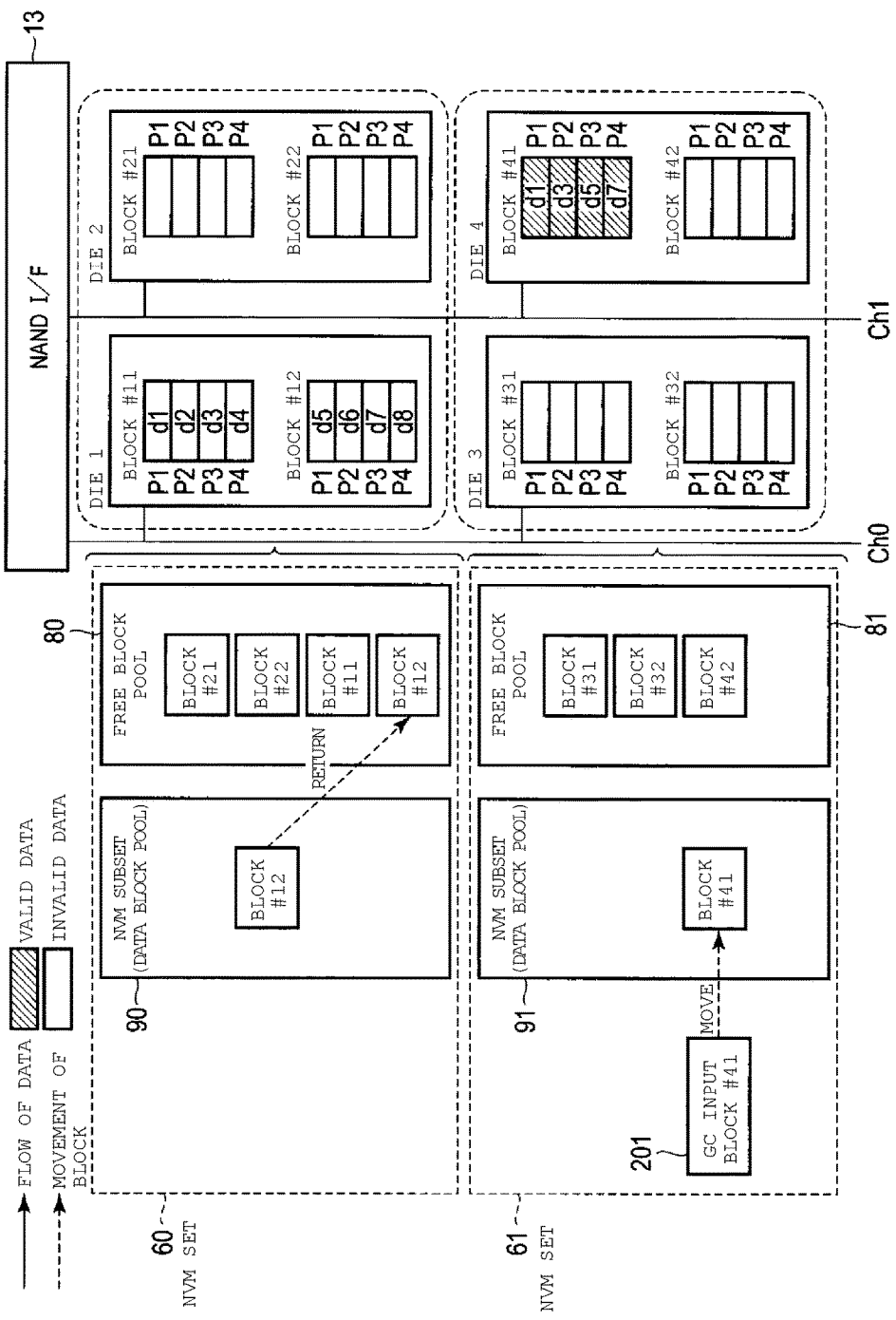
FIG. 18 illustrates the other remaining processes of the inter-NVM-set copy operation performed by the memory system according to the embodiment.

In FIGS. 16 to 18, it is assumed that the NVM set 60 includes NAND flash memory dies 1 and 2, the NVM set 61 includes NAND flash memory dies 3 and 4, and each die includes two blocks including pages P1 to P4 for simplicity of illustration. It is assumed that the valid data is copied to the NVM set 61 from the NVM set 60.

As shown in FIG. 16, a free block (block #41 in this example) within the free block pool 81 is allocated as the GC input block 201 in the copying destination NVM set.

Subsequently, in the copying source NVM set, the block that stores the valid data is selected as the copying source block from the blocks within the NVM subset 90, and only the valid data within the selected copying source block (block #11 in this example) is copied to the GC input block 201 of the copying destination NVM set.

When the valid data d1 and d3 and the invalid data d2 and d4 are stored together in the block #11, only the valid data d1 and the data d3 are copied to the GC input block 201. In this case, the data d1 is copied to the page P1 of the block #41, and the data d3 is copied to the page P2 of the block #41.

When the valid data (i.e., the data d1 and the data d3) of the block #11 are copied to the GC input block 201, the data d1 and the data d3 of the block #11 are invalidated. Accordingly, since the block #11 is the block that does not store the valid data, the block #11 is returned to the free block pool 80 as shown in FIG. 17.

A block #12 which stores valid data d5 and d7 and invalid data d6 and d8 together is present in the NVM subset 90. When the block #12 is selected as the copying source block, only the valid data (i.e., the data d5 and the data d7) of the block #12 are copied to the GC input block 201. In this case, the data d5 is copied to the page P3 of the block #41, and the data d7 is copied to the page P4 of the block #41.

When the valid data (i.e., the data d5 and the data d7) of the block #12 are copied to the GC input block 201, the data d5 and the data d7 of the block #12 are invalidated. Accordingly, since the block #12 is the block that does not store the valid data, the block #12 is returned to the free block pool 80 as shown in FIG. 18. When the data d5 and the data d7 are copied to the GC input block 201, the block #41 is filled with the valid data. In this case, the block #41 is moved to the NVM subset 91.

Figure 19:
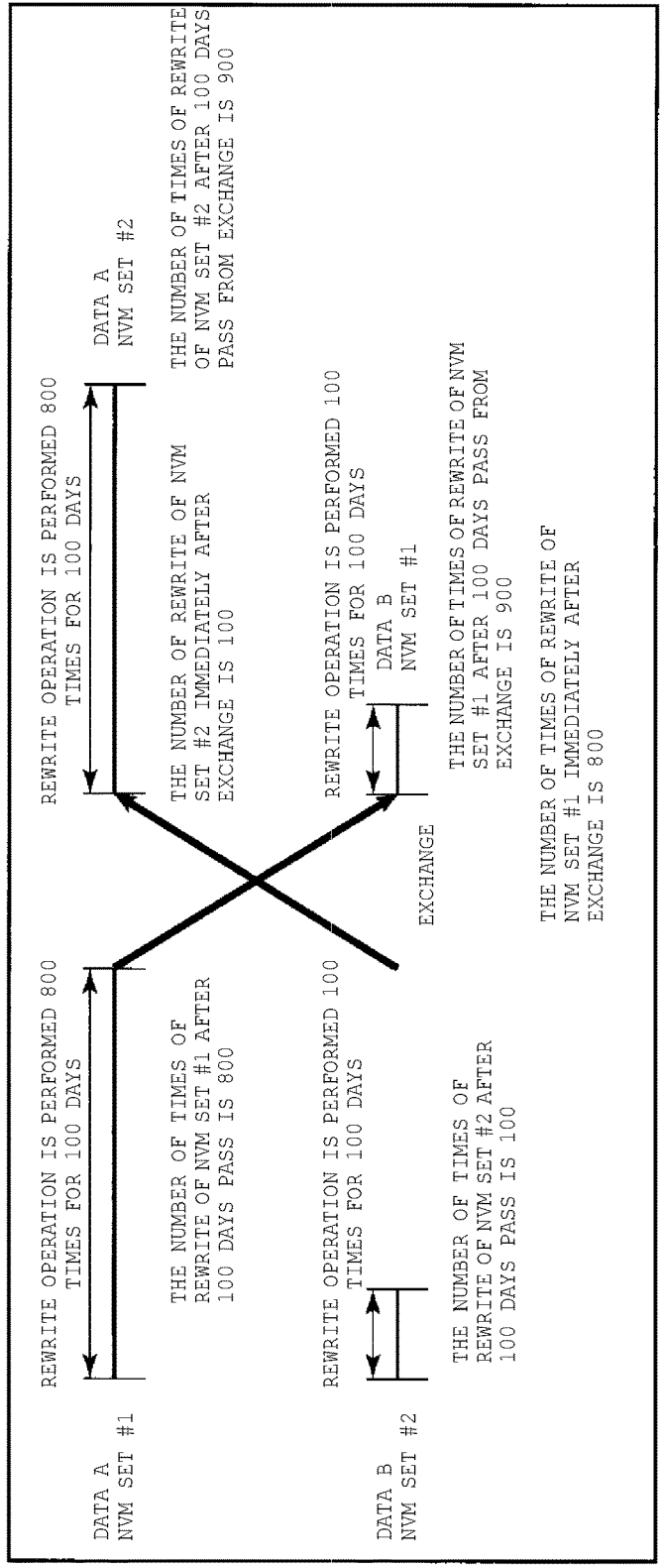
FIG. 19 illustrates an outline of an NVM set exchange operation performed by the memory system according to the embodiment.

FIG. 19 shows an outline of the NVM set exchange operation for exchanging data between two NVM sets (NVM set #1 and NVM set #2 in this example).

In this example, it is assumed that the NVM set #1 is the NVM set 60 and the NVM set #2 is the NVM set 61. It is assumed that data A having a high update frequency is stored in the NVM set #1 (NVM set 60 in this example) and data B having a low update frequency is stored in the NVM set #2 (NVM set 61 in this example) before the NVM set exchange operation.

In this case, the number of times of rewrite (i.e., the number of program/erase cycles) of the NVM set #1 is greater than the number of times of rewrite of the NVM set #2. In this example, the number of times of rewrite of the NVM set may be expressed by an average of the numbers of program/erase cycles of all blocks belonging to the NVM set, or may be expressed by the sum of the numbers of program/erase cycles of all blocks belonging to this NVM set.

For example, the rewrite operation is performed on the NVM set #1 800 times (i.e., the number of program/erase cycles =800) during a period of 100 days, whereas the rewrite operation is performed on the NVM set #2 as little as 100 times (i.e., the number of program/erase cycles=100) during the same period of 100 days. When a limit value of the number of times of rewrite of an individual block is, for example, 1000, and when the rewrite operation (i.e., program/erase operation) is performed 200 times (=1000 times– 800 times) in the NVM set #1, the number of times of rewrite of the NVM set #1 reaches this limit value. In this case, there is a possibility that each block within the NVM set #1 will not normally function.

In the present embodiment, it is possible to perform an operation for exchanging data between the NVM set #1 and the NVM set #2 if necessary. For example, when 100 days pass from the start of the use of the SSD 3, the data may be exchanged between the NVM set #1 and the NVM set #2 according to the command from the host 2 for requesting the NVM set exchange.

In the NVM set exchange operation, the valid data stored in the NVM set #1 is copied to the NVM set #2. The lookup table corresponding to the NVM set #1 is updated, and thus, the physical address indicating the physical storage position within the NVM set #2 to which the valid data is copied maps to the logical address (LBA) corresponding to the copied valid data.

The valid data stored in the NVM set #2 is copied to the NVM set #1. The lookup table corresponding to the NVM set #2 is updated, and thus, the physical address indicating the physical storage position within the NVM set #1 to which the valid data is copied maps to the logical address (LBA) corresponding to the copied valid data.

When the NVM set exchange operation is completed, the physical storage space for the data A having a high update frequency is changed to the NVM set #2, and the physical storage space for the data B having a low update frequency is changed to the NVM set #1.

The number of times of rewrite of the NVM set #2 immediately after the NVM set exchange operation is completed is 100, the number of times of rewrite of the NVM set #2 immediately after the data exchange is completed is 100, and the number of times of rewrite of the NVM set #1 is 800.

Thereafter, the data A is updated with a high frequency again, and the number of times of rewrite of the NVM set #2 is increased by 800 for 100 days. The data B is updated with a relatively low frequency, and thus, the number of times of rewrite of the NVM set #1 is increased by 100 for 100 days. As a result, when 200 days pass from an initial state (when 100 days pass from the NVM set exchange), the number of times of rewrite of the NVM set #2 is 900, and the number of times of rewrite of the NVM set #1 is 900.

As described above, the NVM set exchange operation is performed, and thus, it is possible to equalize the number of times of rewrite of the blocks between the NVM set #1 and the NVM set #2. Thus, it is possible to equalize the degrees of wear among the NVM sets.

Figure 20:
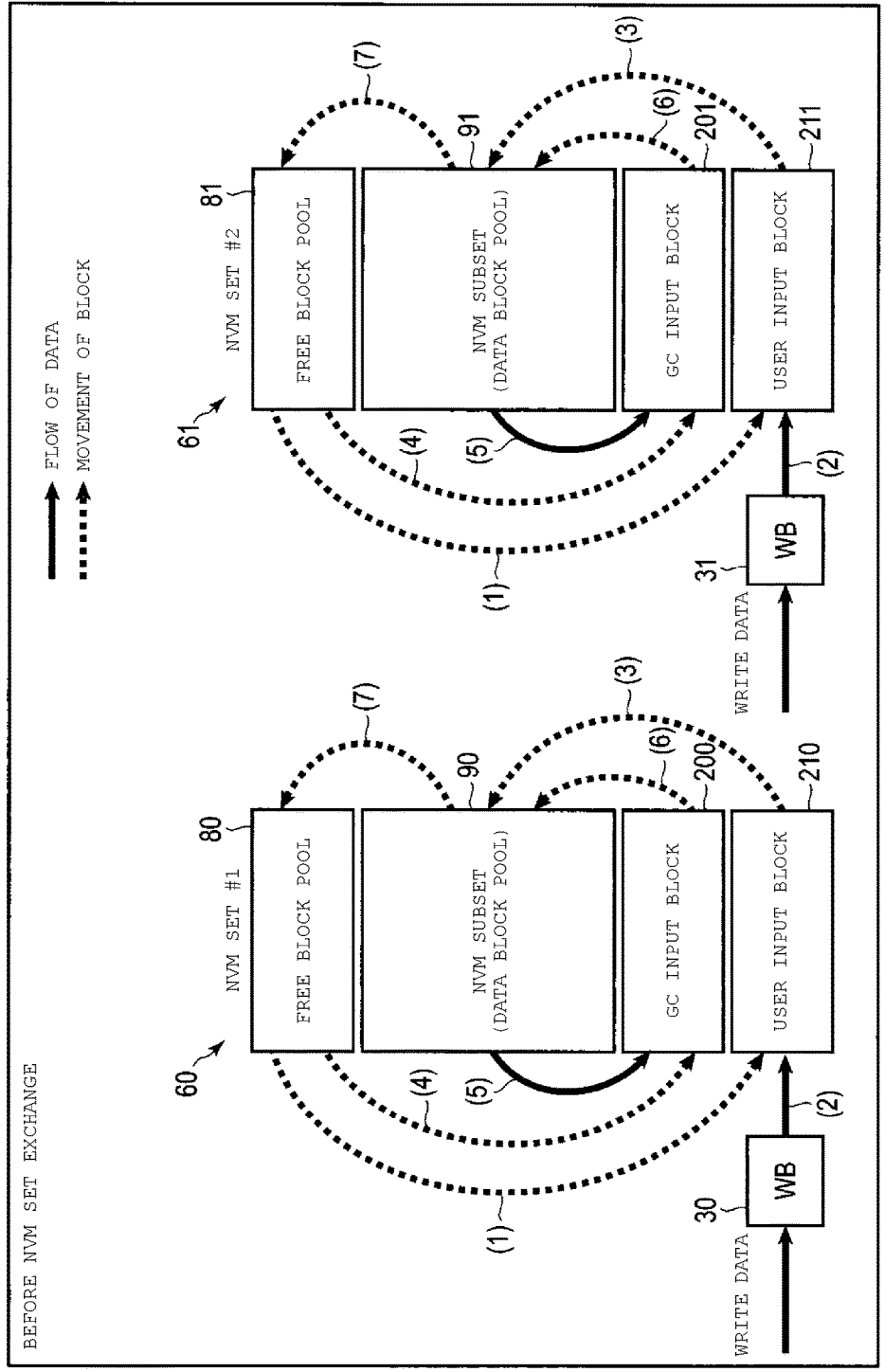
FIG. 20 illustrates the host write/garbage collection operation performed for two NVM sets before the NVM set exchange operation.

FIG. 20 shows the host write/garbage collection operation performed for two NVM sets before the NVM set exchange operation. Before the NVM set exchange operation is performed, the host write/garbage collection operations are performed independently of each other between the NVM set #1 and the NVM set #2. The specific host write/garbage collection operation is as described in FIG. 4.

Figure 21:
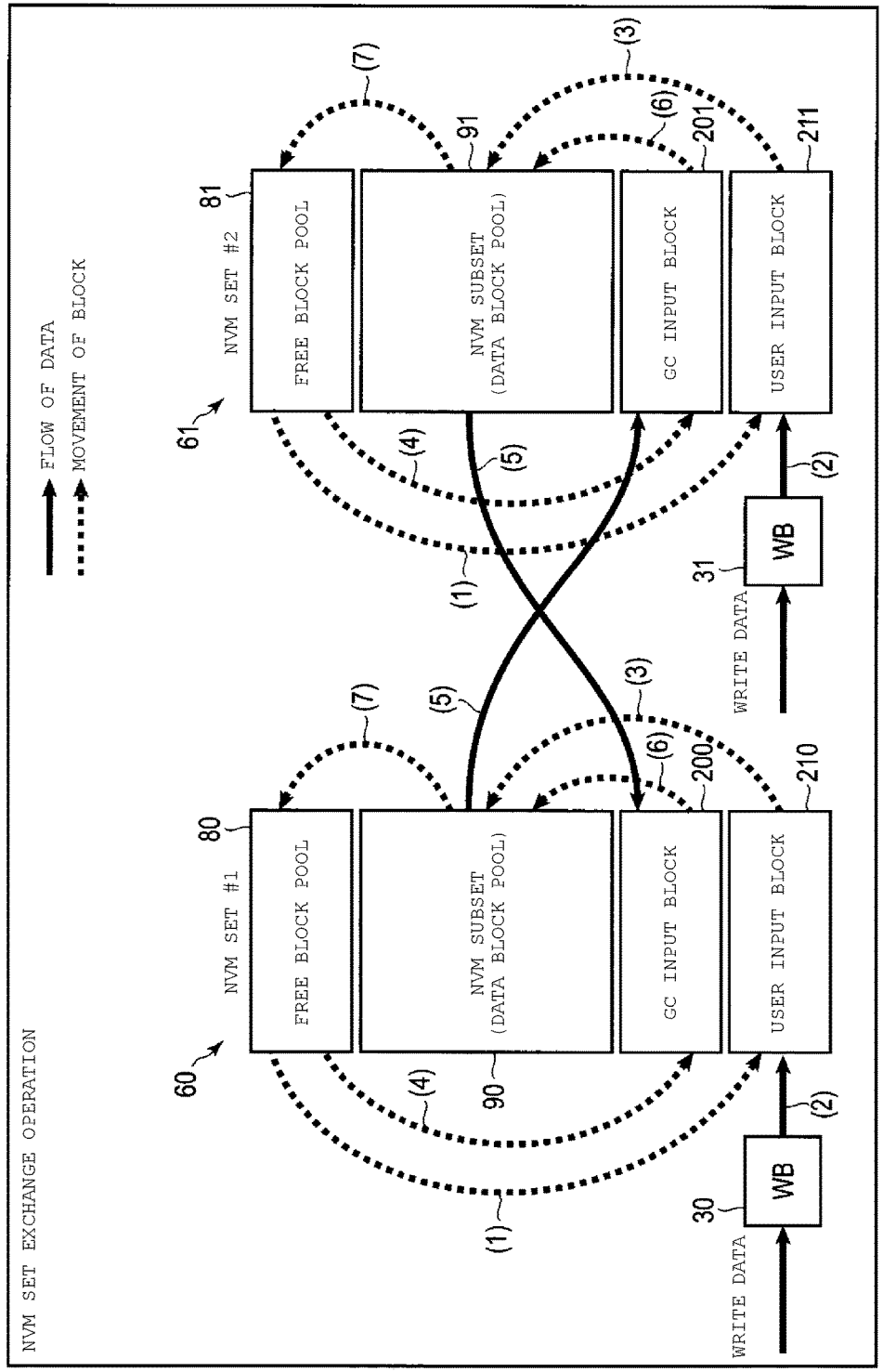
FIG. 21 illustrates the host write/garbage collection performed between two NVM sets for the NVM set exchange operation.

FIG. 21 shows the host write/garbage collection operation performed between two NVM sets in order to perform the NVM set exchange operation.

(1) Allocation of User Input Block

In the NVM set #1, one block within the free block pool 80 is allocated as the user input block 210. In the NVM set #2, one block within the free block pool 81 is allocated as the user input block 211.

(2) Host Write

The write data from the host 2 is written in the user input block 210 from the write buffer 30. The write data associated with the namespace 100 or the namespace 101 corresponding to the NVM set #1 is typically stored in the write buffer 30, but the write data associated with the namespace 102 corresponding to the NVM set #2 is stored in the write buffer 30 after the NVM set exchange operation is started. The lookup table corresponding to the NVM set #2 is updated, and thus, the physical address indicating the physical storage position within the user input block 210 in which the write data is written maps to the logical address (LBA) corresponding to the write data.

As described above, the writing destination of the write data associated with the namespace 102 is the user input block 211 of the NVM set #2 before the NVM set exchange operation, but the writing destination of the write data associated with the namespace 102 is changed to the user input block 210 of the NVM set #1 when the NVM set exchange operation is started.

The write data from the host 2 is written in the user input block 211 from the write buffer 31. The write data associated with the namespace 102 corresponding to the NVM set #2 is typically stored in the write buffer 31, but the write data associated with the namespace 100 or 101 corresponding to the NVM set #1 is stored in the write buffer 31 after the NVM set exchange operation is started. The lookup table corresponding to the NVM set #1 is updated, and thus, the physical address indicating the physical storage position within the user input block 211 in which the write data is written maps to the logical address (LBA) corresponding to the write data.

As described above, the writing destination of the write data associated with the namespace 101 or the namespace 100 is the user input block 210 of the NVM set #1 before the NVM set exchange operation, but the writing destination of the write data associated with the namespace 101 or the namespace 100 is changed to the user input block 211 of the NVM set #2 when the NVM set exchange operation is started.

(3) Movement of User Input Block

When the user input block 210 is filled with the write data, the user input block 210 is moved to the NVM subset 90. That is, the user input block 210 filled with the data is managed by the NVM subset 90.

When the user input block 211 is filled with the write data, the user input block 211 is moved to the NVM subset 91. That is, the user input block 211 filled with the data is managed by the NVM subset 91.

(4) Allocation of GC Input Block

In the NVM set #1, one free block within the free block pool 80 is allocated as the GC input block 200.

In the NVM set, one free block within the free block pool 81 is allocated as the GC input block 201.

(5) Exchange of Valid Data

The block that stores the valid data is selected as the copying source block from the blocks within the NVM subset 90 of the copying source NVM set. Only the valid data within the copying source block is copied to the GC input block 201 of the NVM set #2. The lookup table corresponding to the NVM subset 90 is updated, and thus, the physical address indicating the physical storage position within the GC input block 201 to which the valid data is copied maps to the logical address (LBA) corresponding to the copied valid data.

The block that stores the valid data is selected as the copying source block from the blocks within the NVM subset 91 of the NVM set #2. Only the valid data within the copying source block is copied to the GC input block 200 of the NVM set #1. The lookup table corresponding to the NVM subset 91 is updated, and thus, the physical address indicating the physical storage position within the GC input block 200 to which the valid data is copied maps to the logical address (LBA) corresponding to the copied valid data.

(6) Movement of GC Input Block

When the GC input block 200 is filled with the valid data from one or more blocks of the NVM set #2 in the NVM set #1, the GC input block 200 is moved to the NVM subset 90. That is, the GC input block 200 filled with the valid data is managed by the NVM subset 90.

When the GC input block 201 is filled with the valid data from one or more blocks of the NVM set #1 in the NVM set #2, the GC input block 201 is moved to the NVM subset 91.

That is, the GC input block 201 filled with the valid data is managed by the NVM subset 91.

(7) Return of Copying Source Block

In the NVM set #1, the block that is managed by the NVM subset 90 and does not store the valid data is returned to the free block pool 80 from the NVM subset 90. For example, when all data stored by a certain block within the NVM subset 90 are invalidated by writing new write data in the user input block 210, this block is returned to the free block pool 80 from the NVM subset 90.

In the NVM set #2, the block that is managed by the NVM subset 91 and does not store the valid data is returned to the free block pool 81 from the NVM subset 91. For example, when all data stored by a certain block within the NVM subset 91 are invalidated by writing new write data in the user input block 211, this block is returned to the free block pool 81 from the NVM subset 91.

Figure 22:
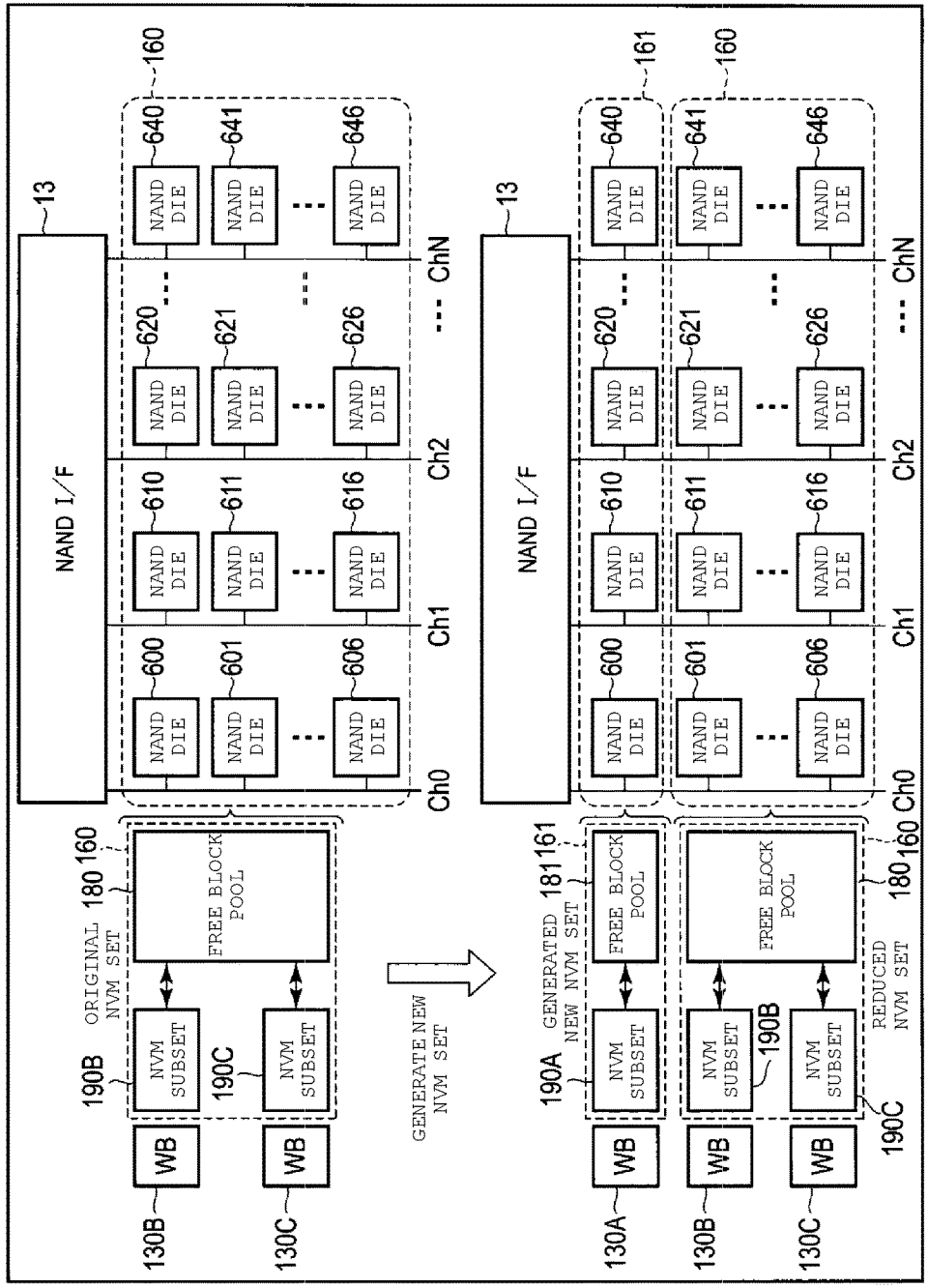
FIG. 22 illustrates an outline of a new NVM set generation operation performed by the memory system according to the embodiment.

FIG. 22 shows an outline of a new NVM set generation operation. It is assumed that an NVM set 160 including NAND flash memory dies 600 to 606, 610 to 616, 620 to 626, . . . , and 640 to 646 is used. A free block pool 180 is present in the NVM set 160. The free block pool 180 is shared between an NVM subset 190B and an NVM subset 190C. A write buffer 130B is provided so as to correspond to the NVM subset 190B, and a write buffer 130C is provided so as to correspond to the NVM subset 190C.

The controller 4 may generate a new NVM set 161 from the NVM set 160, as shown in the lower side of FIG. 22. In this case, the NAND flash memory dies to be ensured for a new NVM set 161 are initially determined among the plurality of NAND flash memory dies included in the NVM set 160. In the example of FIG. 22, the NAND flash memory dies 600, 610, 620, . . . , and 640 are determined as the NAND flash memory dies for the NVM set 161. The valid data within the NAND flash memory dies 600, 610, 620, . . . , and 640 are copied to the block group belonging to the remaining NAND flash memory dies within the NVM set 160.

Accordingly, a free block pool 181, an NVM subset 190A, and a write buffer 130A for the NVM set 161 are generated. The free blocks within the NAND flash memory dies 600, 610, 620, . . . , and 640 are managed by the free block pool 181 for the NVM set 161. The original NVM set 160 is a reduced NVM set. The free block pool 180 manages only the free block group belonging to the remaining dies except for the NAND flash memory dies 600, 610, 620, . . . , and 640.

Figure 23:
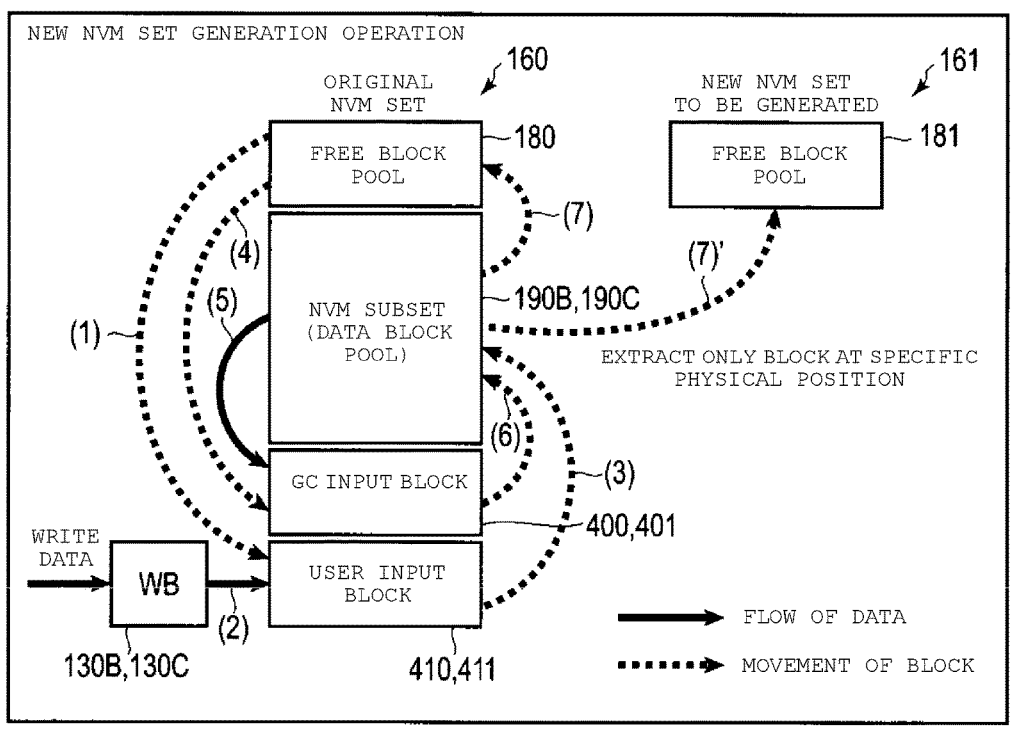
FIG. 23 illustrates the host write/garbage collection operation performed for the new NVM set generation.

FIG. 23 shows the host write/garbage collection operation performed for the new NVM set generation. In this example, it is assumed that the new NVM set 161 is generated from the original NVM set 160 including two NVM subsets.

(1) Allocation of User Input Block

One free block within the free block pool 180 corresponding to the original NVM set 160 is allocated as a user input block 410 corresponding to the NVM subset 190B. One free block within the free block pool 180 is allocated as a user input block 411 corresponding to the NVM subset 190C. When the user input blocks 410 and 411 are previously allocated, this operation is not performed.

(2) Host Write

The write data from the host 2 is written in the user input block 410 from the write buffer 130B. The lookup table corresponding to the NVM subset 190B is updated, and thus, the physical address indicating the physical storage position within the user input block 410 in which the write data is written maps to the logical address (LBA) corresponding to the write data.

The write data from the host 2 is written in the user input block 411 from the write buffer 130C. The lookup table corresponding to the NVM subset 190C is updated, and thus, the physical address indicating the physical storage position within the user input block 411 in which the write data is written maps to the logical address (LBA) corresponding to the write data.

(3) Movement of User Input Block

When the user input block 410 is filled with the write data, the user input block 410 is moved to the NVM subset 190B. That is, the user input block 410 filled with the data is managed by the NVM subset 190B.

When the user input block 411 is filled with the write data, the user input block 411 is moved to the NVM subset 190C. That is, the user input block 411 filled with the data is managed by the NVM subset 190C.

(4) Allocation of GC Input Block

In the original NVM set (NVM set 160 in this example), one block is allocated as a GC input block 400 corresponding to the NVM subset 190B from the free blocks within the free block pool 180. One block is allocated as a GC input block 401 corresponding to the NVM subset 190C from the free blocks within the free block pool 180.

(5) Copy of Valid Data

One or more blocks which store the valid data and the invalid data together are selected as the copying source block from the blocks within the NVM subset 190B (or the NVM subset 190C), and only the valid data within the copying source block is copied to the GC input block 400 (or the GC input block 401). The lookup table corresponding to the NVM subset 190B (or the NVM subset 190C) is updated, and thus, the physical address indicating the physical storage position within the GC input block 400 (or the GC input block 401) to which the valid data is copied maps to the logical address (LBA) corresponding to the copied valid data.

(6) Movement of GC Input Block

When the GC input block 400 (or the GC input block 401) is filled with the valid data, the GC input block 400 (or the GC input block 401) is moved to the NVM subset 190B (or the NVM subset 190C). That is, the GC input block filled with the valid data is managed by the corresponding NVM subset.

(7) and (7)' Return of Block

The block that is managed by the NVM subset 190B (or the NVM subset 190C) and does not store the valid data is returned to the free block. In this case, the block that does not belong to a die set to be allocated to the new NVM set 161 is returned to the free block pool 180 from the NVM subset 190B (or the NVM subset 190C). The block that belongs to a die set to be allocated to the new NVM set 161 is returned to the free block pool 181 of the new NVM set from the NVM subset 190B (or the NVM subset 190C).

Although the GC is performed on the whole original NVM set 160 in the present embodiment, the block that stores the valid data may be preferentially selected as the copying source block from the blocks belonging to the die set to be allocated to the new NVM set 161, and only the valid data within the copying source block may be copied to the GC input block. Accordingly, it is possible to generate the new NVM set 161 for a short time.

Figure 24:
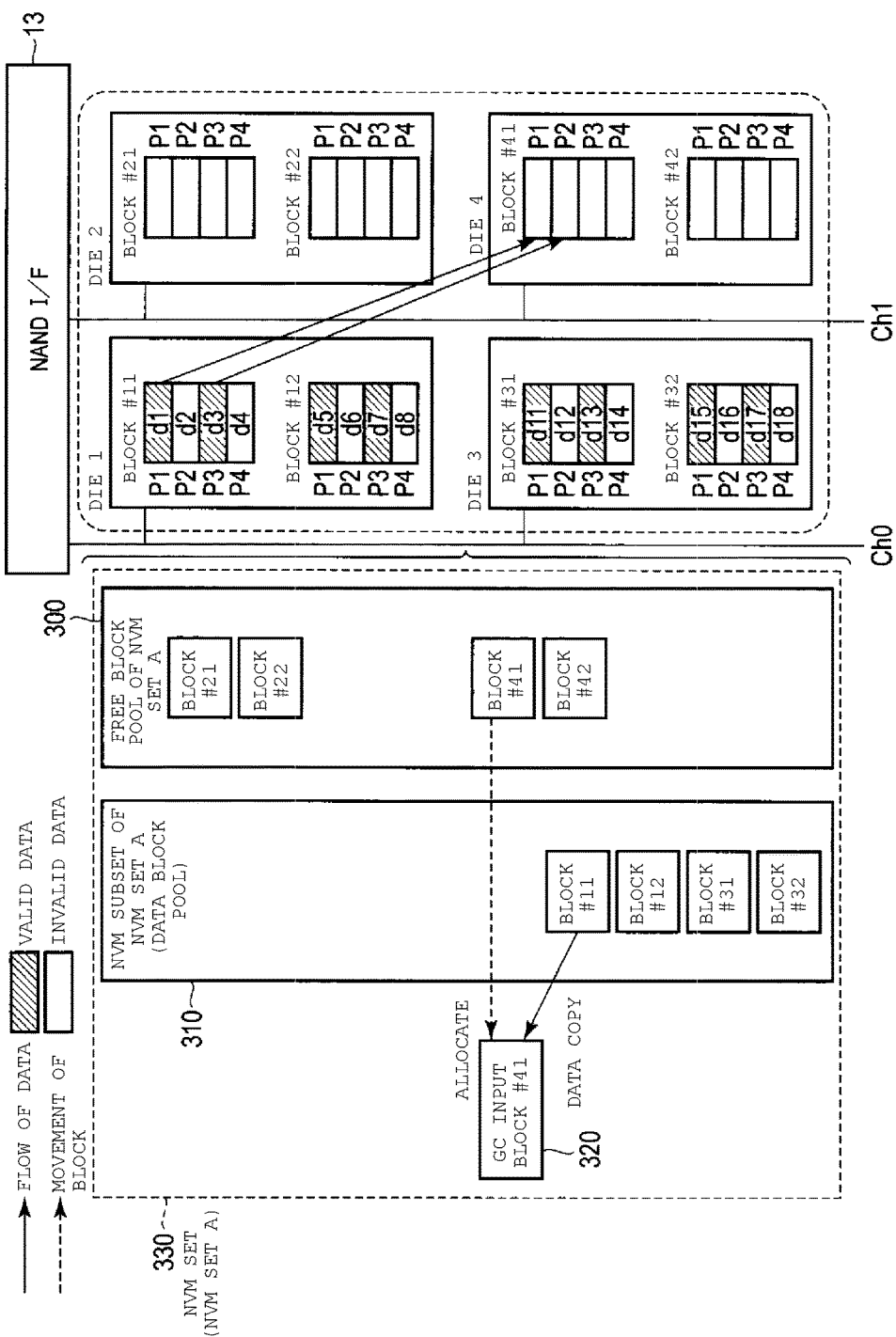
FIG. 24 illustrates some processes of the new NVM set generation operation performed by the memory system according to the embodiment.
Figure 25:
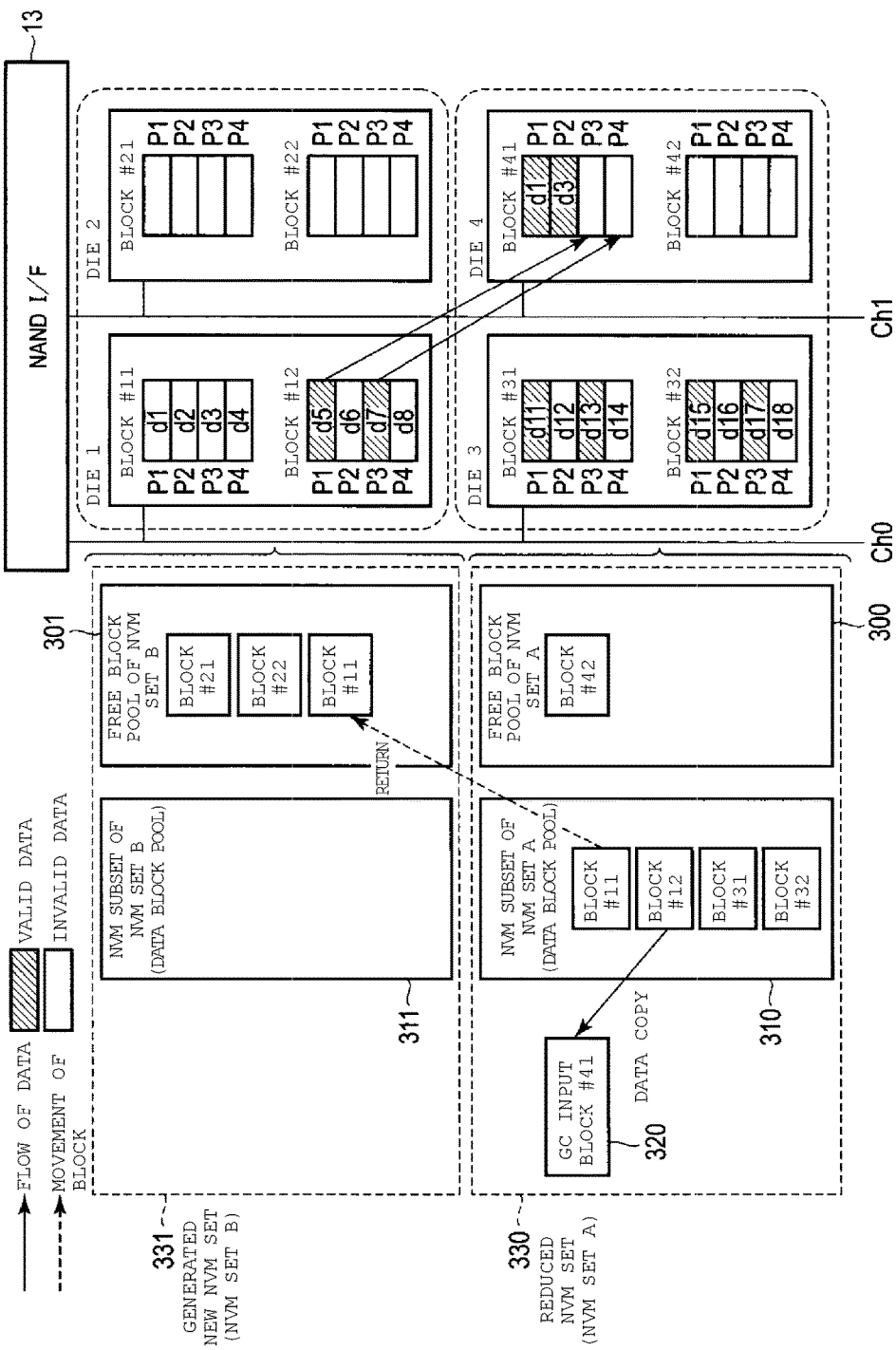
FIG. 25 illustrates some remaining processes of the new NVM set generation operation performed by the memory system according to the embodiment.
Figure 26:
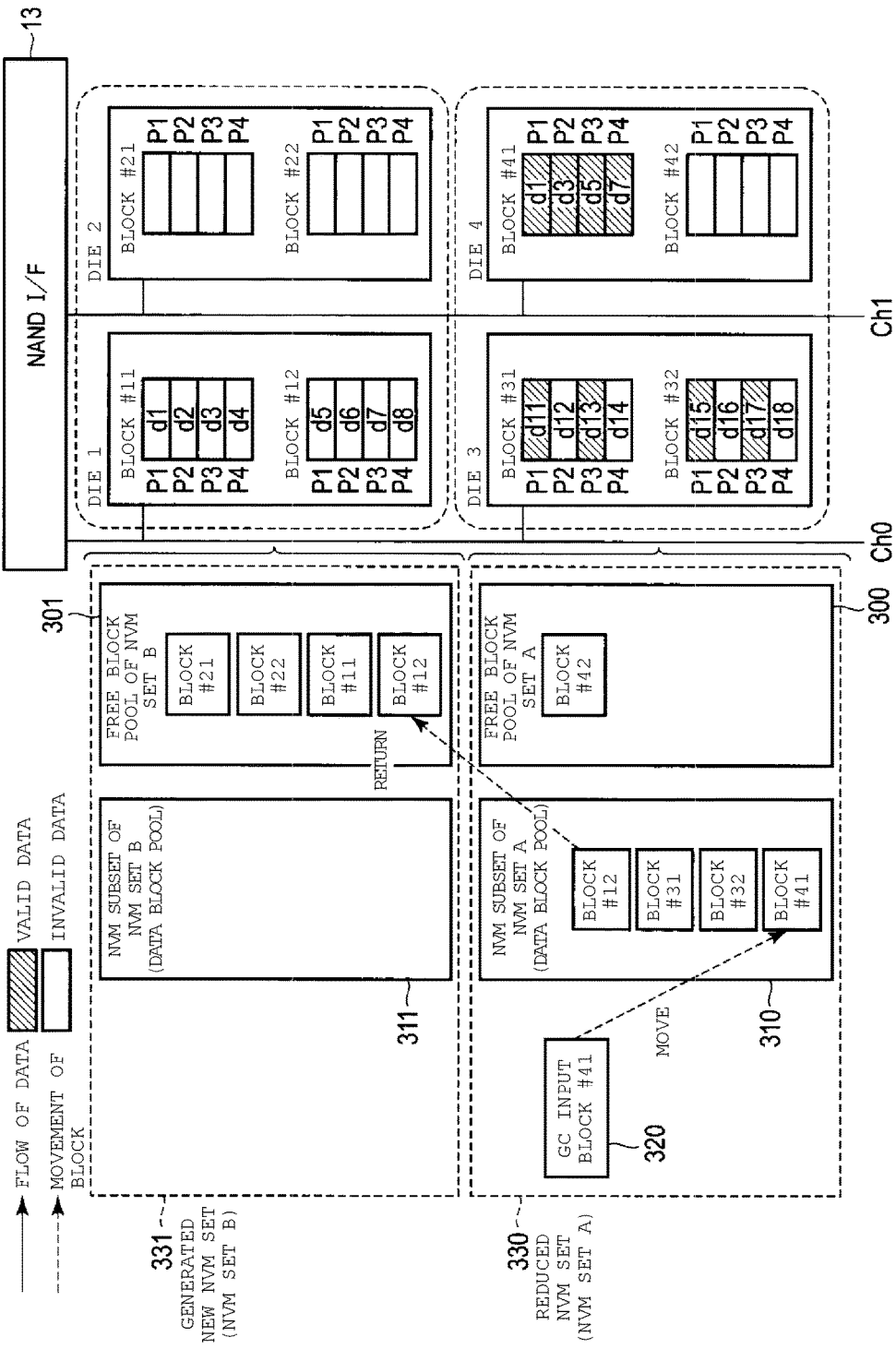
FIG. 26 illustrates the other remaining processes of the new NVM set generation operation performed by the memory system according to the embodiment.

Hereinafter, the new NVM set generation operation will be described in detail with reference to FIGS. 24 to 26. In FIGS. 24 to 26, it is assumed that an NVM set 330 (NVM set A in this example) includes NAND flash memory dies 1 to 4 and each die includes two blocks each including the pages P1 to P4 for simplicity of illustration.

Initially, the NAND flash memory dies 1 and 2 to be secured for a new NVM set B are determined from the NAND flash memory dies 1 to 4 belonging to the NVM set A.

Subsequently, a block (block #41 in this example) within a free block pool 300 of the NVM set A is allocated as a GC input block 320 as shown in FIG. 24. A block (block #11 in this example) that stores the valid data is selected as the copying source block from the blocks of the NAND flash memory dies 1 and 2 secured for the NVM set B, and the valid data within the selected copying source block is copied to the GC input block 320.

When valid data d1 and d3 and invalid data d2 and d4 are stored together in the block #11, only the valid data d1 and the data d3 are copied to the GC input block 320. In this case, the data d1 is copied to the page P1 of the block #41, and the data d3 is copied to the page P2 of the block #41.

When the valid data (i.e., the data d1 and the data d3) of the block #11 are copied to the GC input block 320, the data d1 and the data d3 of the block #11 are invalidated. Accordingly, since the block #11 is the block that does not store the valid data, the block #11 is returned to the free block pool 301 newly generated for the NVM set B (which is the new NVM set) as shown in FIG. 25.

A block #12 which stores valid data d5 and d7 and invalid data d6 and d8 together is present in the NAND flash memory die secured for the NVM set B. When the block #12 is selected as the copying source block, only the valid data (the data d5 and the data d7) of the block #12 are copied to the GC input block 320. In this case, the data d5 is copied to the page P3 of a block #21, and the data d7 is copied to the page P4 of the block #41.

When the valid data (i.e., the data d5 and the data d7) of the block #12 are copied to the GC input block 320, the data d5 and the data d7 of the block #12 are invalidated. Accordingly, since the block #12 is the block that does not store the valid data, the block #12 is returned to the free block pool 301 of the NVM set B as shown in FIG. 26.

Figure 27:
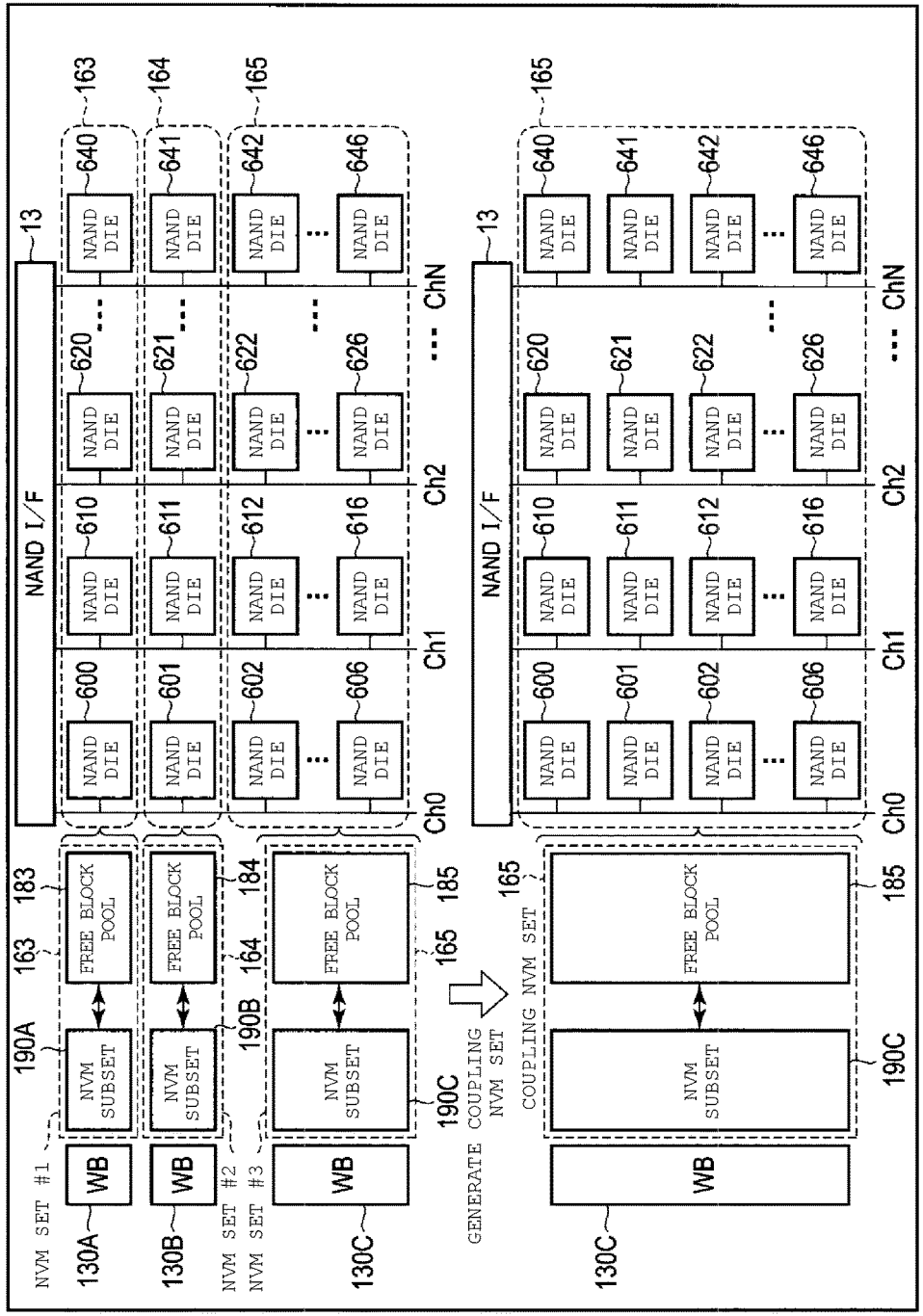
FIG. 27 illustrates an outline of an NVM set coupling operation performed by the memory system according to the embodiment.

FIG. 27 shows an outline of an NVM set coupling operation. FIG. 27 shows an operation for coupling the NVM set #1 (NVM set 163 in this example) and the NVM set #2 (NVM set 164 in this example) to an NVM set #3 (NVM set 165 in this example).

The NVM set #1 includes NAND flash memory dies 600, 610, 620, ..., and 640. The NVM set #2 includes NAND flash memory dies 601, 611, 621, ..., and 641. The NVM set #3 includes NAND flash memory dies 602 to 606, 612 to 616, 622 to 626, ..., and 642 to 646.

When the NVM set #1 and the NVM set #2 are coupled to the NVM set #3, a free block pool 183 corresponding to the NVM set #1 and a free block pool 184 corresponding to the NVM set #2 are also coupled to a free block pool 185 corresponding to the NVM set #3. The NVM subset 190A of the NVM set #1 and the NVM subset 190B of the NVM set #2 are also coupled to the NVM subset 190C of the NVM set #3.

Figure 28:
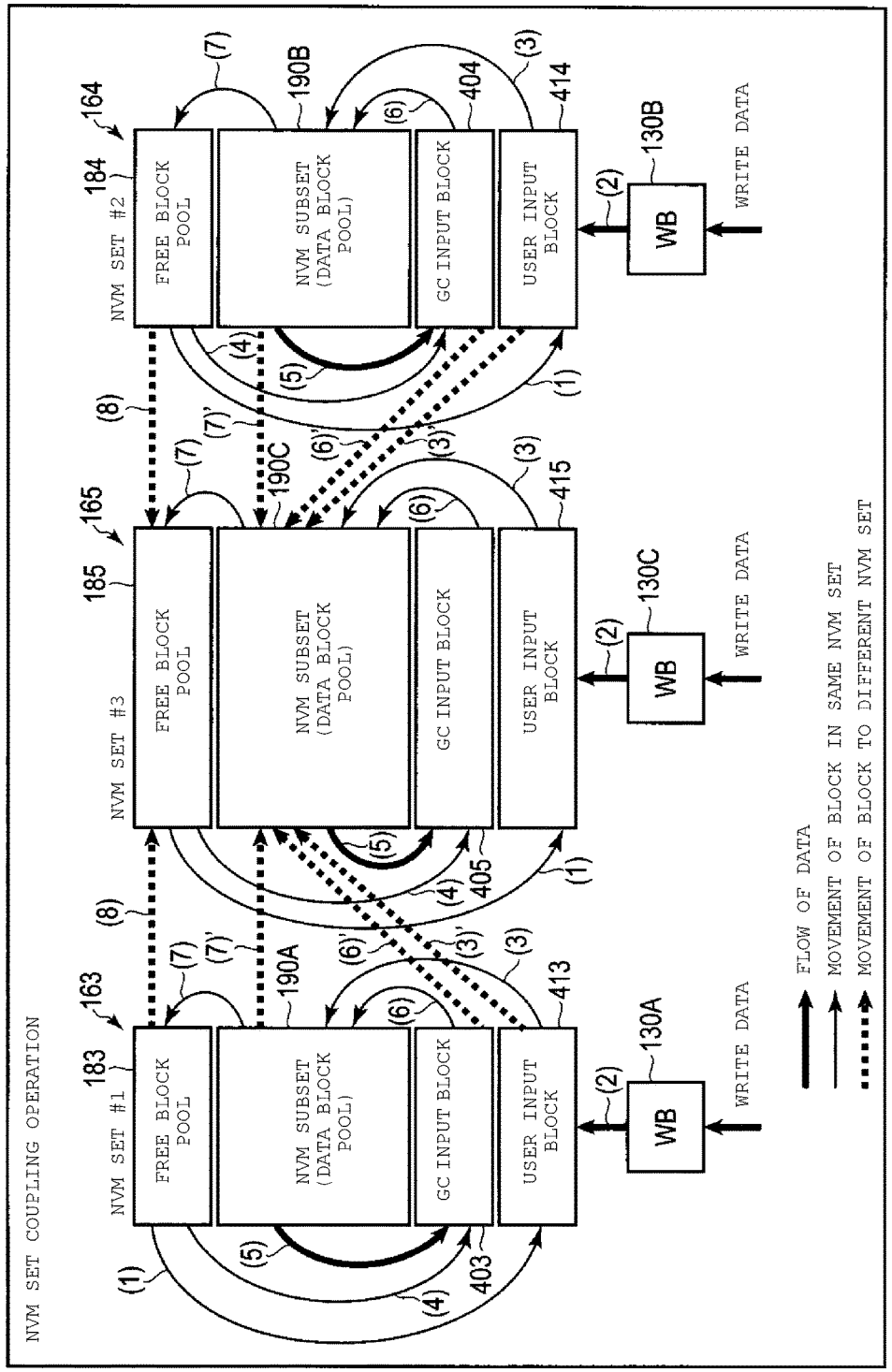
FIG. 28 illustrates the host write/garbage collection operation performed for NVM set coupling.

FIG. 28 shows the host write/garbage collection operation performed for the NVM set coupling. Before the NVM set coupling operation is performed, the write operation and the garbage collection operation of the write data are performed independently of each other in the NVM sets #1 to #3.

(1) Allocation of User Input Block

One free block within the free block pool 183 is allocated as a user input block 413. One free block within the free block pool 184 is allocated as a user input block 414. One free block within the free block pool 185 is allocated as a user input block 415. When the user input blocks 413, 414, and 415 are previously allocated, this operation is not performed.

(2) Host Write

In the NVM set #1, the write data from the host 2 is written in the user input block 413 from the write buffer 130A. The write data associated with the NVM subset 190A is temporarily stored in the write buffer 130A. The lookup table corresponding to the NVM set 163 is updated, and thus, the physical address indicating the physical storage position within the user input block 413 in which the write data is written maps to the logical address (LBA) corresponding to the write data.

In the NVM set #2, the write data from the host 2 is written in the user input block 414 from the write buffer 130B. The write data associated with the NVM subset 190B is temporarily stored in the write buffer 130B. The lookup table corresponding to the NVM set 164 is updated, and thus, the physical address indicating the physical storage position within the user input block 414 in which the write data is written maps to the logical address (LBA) corresponding to the write data.

In the NVM set #3, the write data from the host 2 is written in the user input block 415 from the write buffer 130C. The write data associated with the NVM subset 190C is temporarily stored in the write buffer 130C. The lookup table corresponding to the NVM set 165 is updated, and thus, the physical address indicating the physical storage position within the user input block 415 in which the write data is written maps to the logical address (LBA) corresponding to the write data.

(3) Movement of User Input Block

When the user input block 415 is filled with the write data in the NVM set #3, the user input block 415 is moved to the NVM subset 190C. That is, the user input block 415 filled with the data is managed by the NVM subset 190C.

Before the NVM set coupling operation is performed, when the user input block 413 is filled with the write data in the NVM set #1, the user input block 413 is moved to the NVM subset 190A, and when the user input block 414 is filled with the write data in the NVM set #2, the user input block 414 is moved to the NVM subset 190B. However, after the NVM set coupling operation is performed, an operation shown in (3)' is performed instead of (3).

(3)' Movement of User Input Block to Coupling Destination NVM Set

When the user input block 413 within the NVM set #1 is filled with the write data, the user input block 413 is moved to the NVM subset 190C of the NVM set #3. That is, the user input block 413 filled with the data is managed by the NVM subset 190C.

When the user input block 414 within the NVM set #2 is filled with the write data, the user input block 414 is moved to the NVM subset 190C of the NVM set #3. That is, the user input block 414 filled with the data is managed by the NVM subset 190C.

(4) Allocation of GC Input Block

When it is necessary to perform the garbage collection in the NVM subset 190A, the garbage collection operation for the block group within the NVM subset 190A is performed independently of another NVM set. For example, the number of blocks included in the NVM subset 190A is greater than a certain threshold X1 corresponding to the NVM subset 190A, it may be determined that the garbage collection operation is necessary. The threshold X1 may be determined based on the total number of blocks capable of being allocated for the NVM subset 190A. For example, the remainder acquired by subtracting a predetermined number from the total number of blocks capable of being allocated for the NVM subset 190A may be used as a certain threshold X1 corresponding to the NVM subset 190A.

When it is necessary to perform the garbage collection in the NVM subset 190A, one free block within the free block pool 183 is allocated as a GC input block 403.

When it is necessary to perform the garbage collection in the NVM subset 190B, the garbage collection operation for the block group within the NVM subset 190B is performed independently of another NVM set. For example, the number of blocks included in the NVM subset 190B is greater than a certain threshold X1 corresponding to the NVM subset 190B, it may be determined that the garbage collection operation is necessary. The threshold X1 may be determined based on the total number of blocks capable of being allocated for the NVM subset 190B. For example, the remainder acquired by subtracting a predetermined number from the total number of blocks capable of being allocated for the NVM subset 190B may be used as a certain threshold X1 corresponding to the NVM subset 190B.

When it is necessary to perform the garbage collection in the NVM subset 190B, one free block within the free block pool 184 is allocated as a GC input block 404.

When it is necessary to perform the garbage collection in the NVM subset 190C, the garbage collection operation for the block group within the NVM subset 190C is performed independently of another NVM set. For example, the number of blocks included in the NVM subset 190C is greater than a certain threshold X1 corresponding to the NVM subset 190C, it may be determined that the garbage collection operation is necessary. The threshold X1 may be determined based on the total number of blocks capable of being allocated for the NVM subset 190C. For example, the remainder acquired by subtracting a predetermined number from the total number of blocks capable of being allocated for the NVM subset 190C may be used as a certain threshold X1 corresponding to the NVM subset 190C.

When it is necessary to perform the garbage collection in the NVM subset 190C, one free block within the free block pool 185 is allocated as a GC input block 405.

(5) Copy of Valid Data

One or more blocks which store the valid data and the invalid data together are selected as the copying source block from the blocks within the NVM subset 190A. Only the valid data of the selected block is copied to the GC input block 403. The lookup table corresponding to the NVM set 163 is updated, and thus, the physical address indicating the physical storage position within the GC input block 403 to which the valid data is copied maps to the logical address (LBA) corresponding to the valid data.

One or more blocks which store the valid data and the invalid data together are selected as the copying source block from the blocks within the NVM subset 190B. Only the valid data of the selected block is copied to the GC input block 404. The lookup table corresponding to the NVM set 164 is updated, and thus, the physical address indicating the physical storage position within the GC input block 404 to which the valid data is copied maps to the logical address (LBA) corresponding to the valid data.

One or more blocks which store the valid data and the invalid data together are selected as the copying source block from the blocks within the NVM subset 190C. Only the valid data of the selected block is copied to the GC input block 405. The lookup table corresponding to the NVM set 165 is updated, and thus, the physical address indicating the physical storage position within the GC input block 405 to which the valid data is copied maps to the logical address (LBA) corresponding to the valid data.

(6) Movement of GC Input Block

When the GC input block 405 is filled with the valid data in the NVM set #3, the GC input block 405 is moved to the NVM subset 190C. That is, the GC input block 405 filled with the valid data is managed by the NVM subset 190C.

Before the NVM set coupling operation is performed, when the valid data is filled with the GC input block 403 in the NVM set #1, the GC input block 403 is moved to the NVM subset 190A, and when the GC input block 404 is filled with the valid data in the NVM set #2, the GC input block 404 is moved to the NVM subset 190B. However, after the NVM set coupling operation is performed, an operation shown in (6)' is performed instead of (6).

(6)' Movement of GC Input Block to Coupling Destination NVM Set

When the GC input block 403 within the NVM set #1 is filled with the valid data, the GC input block 403 is moved to the NVM subset 190C within the NVM set #3. The user input block 403 filled with the valid data is managed by the NVM subset 190C.

When the GC input block 404 within the NVM set #2 is filled with the valid data, the GC input block 404 is moved to the NVM subset 190C within the NVM set #3. The user input block 404 filled with the valid data is managed by the NVM subset 190C.

(7) Return of Block

In the NVM set #3, the block that is managed by the NVM subset 190C and does not store the valid data is returned to the free block pool 185 from the NVM subset 190C. The block that does not store the valid data is a block in which all data are invalidated through the host write or is a block of which all valid data are copied to the copying destination block through the garbage collection operation.

Before the NVM set coupling operation is performed, the block that is managed by the NVM subset 190A and does not store the valid data is returned to the free block pool 183 from the NVM subset 190A in the NVM set #1, and the block that is managed by the NVM subset 190B and does not store the valid data is returned to the free block pool 184 from the NVM subset 190B. However, after the NVM set coupling operation is performed, an operation shown in (7)' is performed instead of (7).

(7)' Movement of Block of NVM Subset to Coupling Destination NVM Set

The block of the NVM subset 190A is moved to the NVM subset 190C of the NVM set #3. That is, the block of the NVM subset 190A is managed by the NVM subset 190C.

The block of the NVM subset 190B is moved to the NVM subset 190C of the NVM set #3. That is, the block of the NVM subset 190B is managed by the NVM subset 190C.

(8) Movement of Free Block to Coupling Destination NVM Set

The free block within the free block pool 183 of the NVM set #1 is moved to the free block pool 185 of the NVM set #3. The free block within the free block pool 184 of the NVM set #2 is moved to the free block pool 185 of the NVM set #3.

Figure 29:
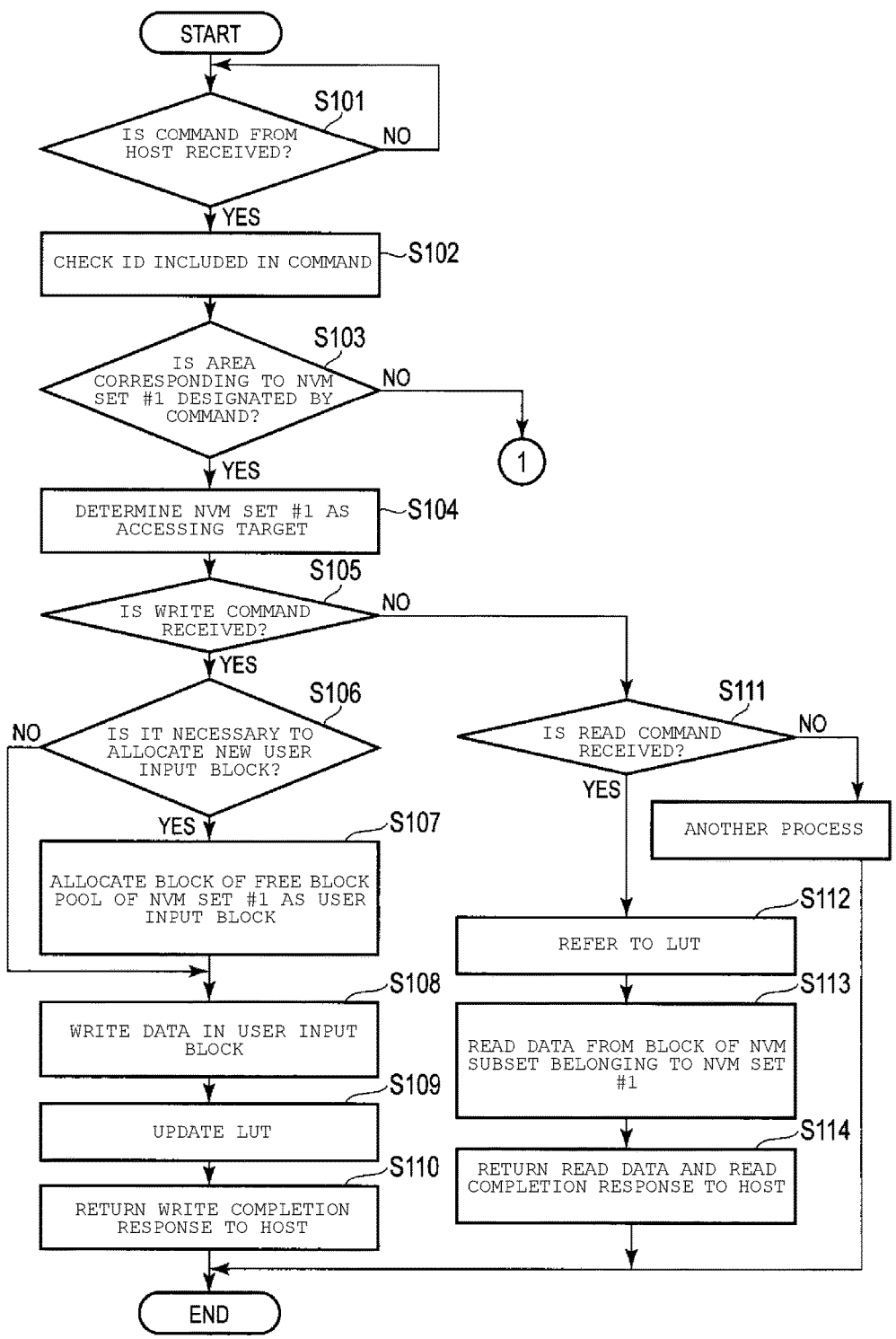
FIG. 29 is a flowchart showing some processes of a procedure of a data write/read operation performed by the memory system according to the embodiment.
Figure 30:
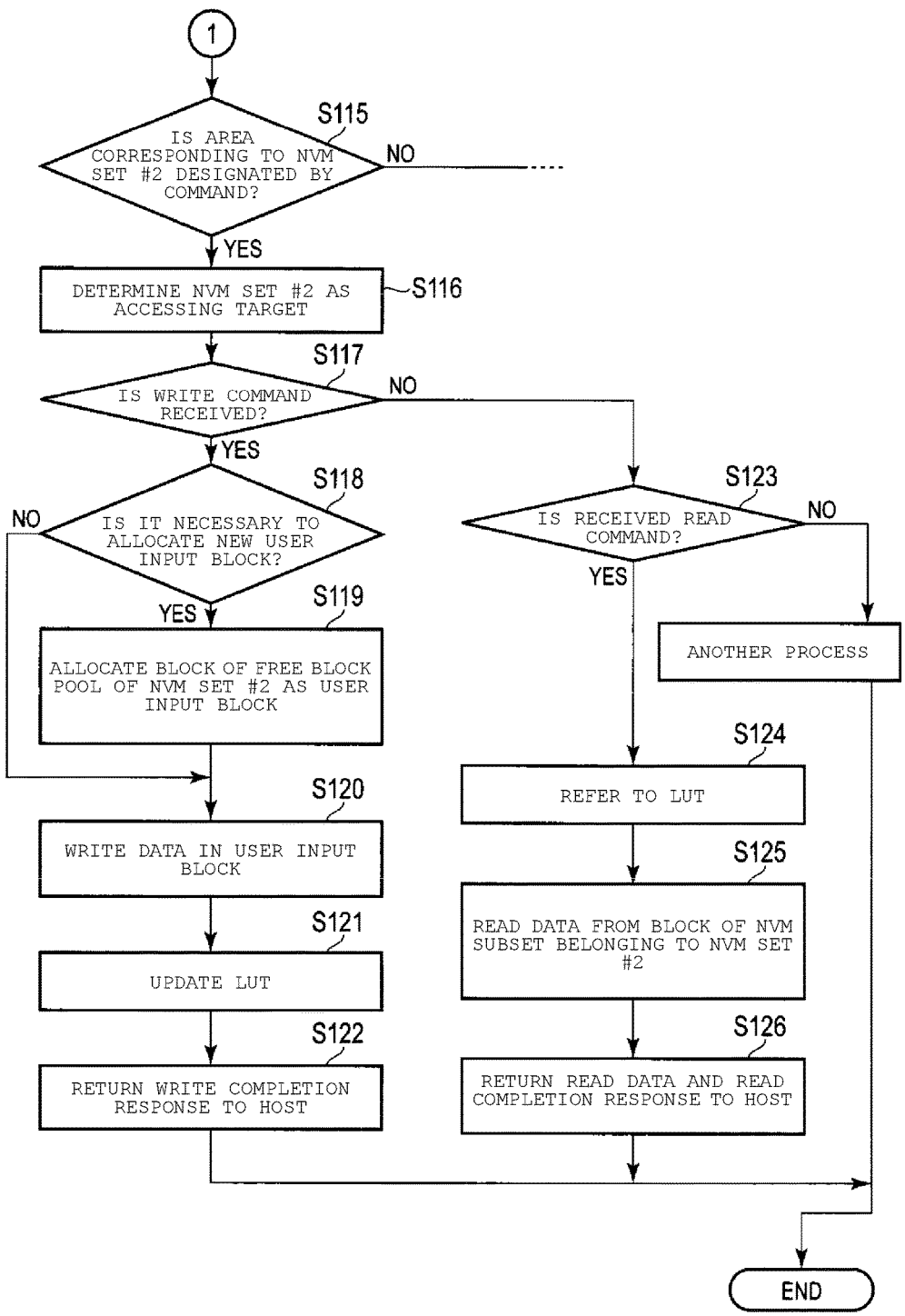
FIG. 30 is a flowchart showing some remaining processes of a procedure of a data write/read operation performed by the memory system according to the embodiment.

Flowcharts of FIGS. 29 and 30 show the data write/read operation performed by the controller 4.

When the command from the host 2 is received (Yes in step S101), the NVM set control unit 21 checks the namespace ID included in the received command (step S102). When the area corresponding to the NVM set #1 is designated by the received command (Yes in step S103), the NVM set control unit 21 determines the NVM set #1 as the accessing target (step S104). For example, in a case where the namespace of NSID1 corresponds to the NVM set #1, when the received command includes NSID1, it may be determined that the area corresponding to the NVM set #1 is designated.

When the received command is the write command (Yes in step S105), the NVM set control unit 21 determines whether or not it is necessary to allocate a new user input block (step S106). When it is necessary to allocate the new user input block (Yes in step S106), the NVM set control unit 21 allocates the free block within the free block pool of the NVM set #1, as the user input block, (step S107), and writes the write data in the allocated user input block (step S108). When it is not necessary to allocate the new user input block (NO in step S106), the NVM set control unit 21 writes the write data in the previously allocated user input block (step S108).

When the write data is written in the user input block, the NVM set control unit 21 updates the LUT corresponding to the NVM set #1 (step S109). The NVM set control unit 21 returns a response indicating the write completion to the host 2 (step S110).

When the received command is the read command (NO in step S105 and YES in step S111), the NVM set control unit 21 refers to the LUT corresponding to the NVM set #1 (step S112), and acquires the physical address corresponding to the start LBA within the read command. The NVM set control unit 21 reads the data designated by the read command from the blocks of the NVM subset belonging to the NVM set #1 based on the physical address (step S113). The NVM set control unit 21 returns the read data and a response indicating the read completion to the host 2 (step S114).

When the area corresponding to the NVM set #1 is not designated by the received command (NO in step S103), the NVM set control unit 21 determines whether or not the area corresponding to the NVM set #2 is designated by the received command (step S115). When the area corresponding to the NVM set #2 is designated by the received command (Yes in step S115), the NVM set control unit 21 determines the NVM set #2 as the accessing target (step S116). For example, in a case where the namespace of NSID2 corresponds to the NVM set #2, when the received command includes NSID2, it may be determined that the area corresponding to the NVM set #2 is designated.

When the received command is the write command (Yes in step S117), the NVM set control unit 21 determines whether or not it is necessary to allocate the new user input block (step S118). When it is necessary to allocate the new user input block (Yes in step S118), the NVM set control unit 21 allocates the free block within the free block pool of the NVM set #2, as the user input block (step S119), and writes the write data in the allocated user input block (step S120). When it is not necessary to allocate the new user input block (NO in step S118), the NVM set control unit 21 writes the write data in the previously allocated user input block (step S120).

When the write data is written in the user input block, the NVM set control unit 21 updates the LUT corresponding to the NVM set #2 (step S121). The NVM set control unit 21 returns the response indicating the write completion to the host 2 (step S122).

When the received command is the read command (NO in step S117 and YES in step S123), the NVM set control unit 21 refers to the LUT corresponding to the NVM set #2 (step S124), and acquires the physical address corresponding to the start LBA within the read command. The NVM set control unit 21 reads the data designated by the read command from the block of the NVM subset belonging to the NVM set #2 based on the physical address (step S125). The NVM set control unit 21 returns the read data and the response indicating the read completion to the host 2 (step S126).

Figure 31:
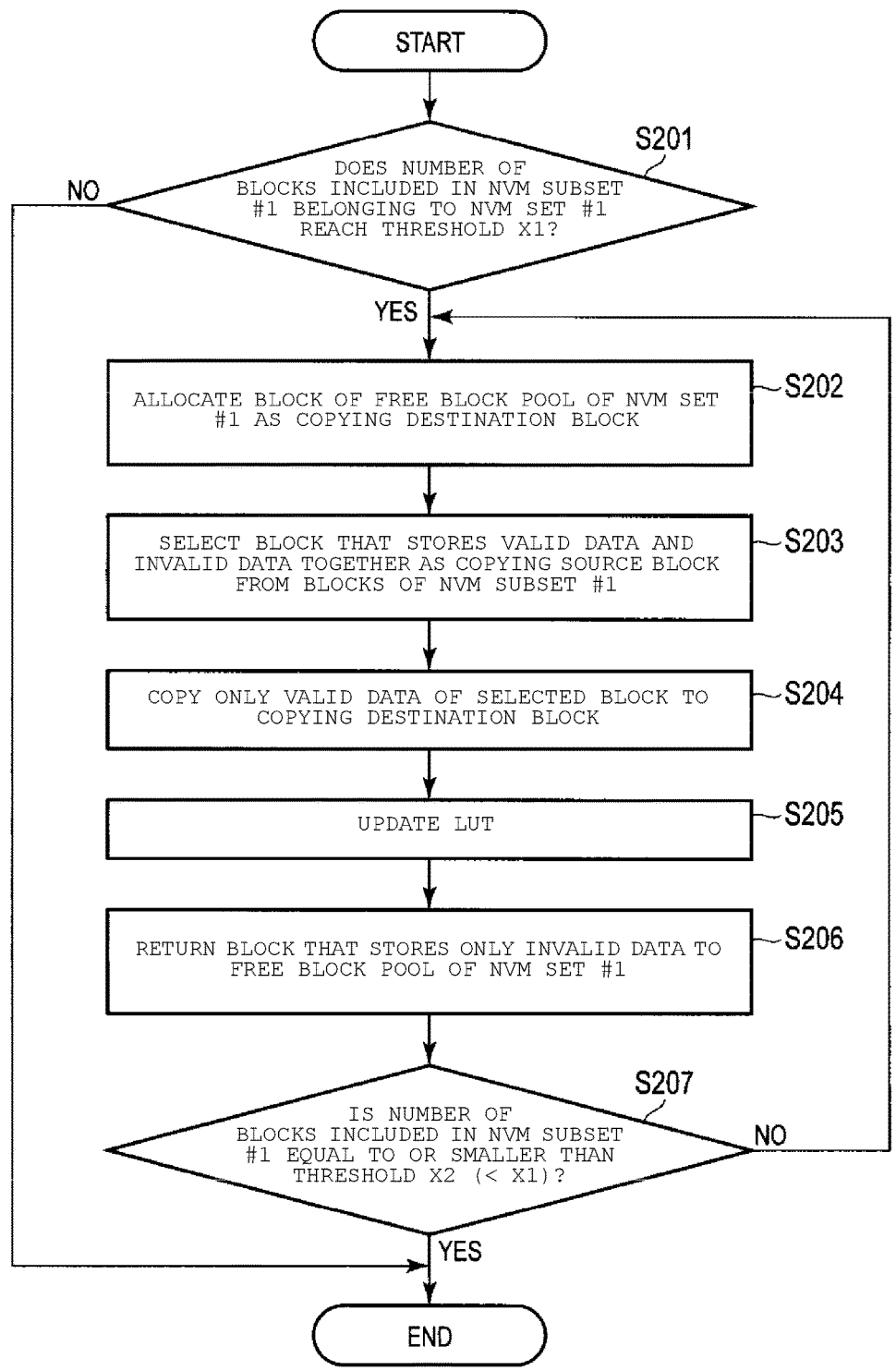
FIG. 31 is a flowchart showing a procedure of a garbage collection operation performed for every certain NVM subset which is performed by the memory system according to the embodiment.

A flowchart of FIG. 31 shows a procedure of the garbage collection operation performed on each NVM subset belonging to a certain NVM set by the GC operation control unit 22.

The GC operation control unit 22 determines whether or not the number of blocks included in the NVM subset #1 belonging to the NVM set #1 reaches the threshold X1 corresponding to the NVM subset #1 (step S201). When the number of blocks included in the NVM subset #1 belonging to the NVM set #1 reaches the threshold X1 (Yes in step S201), the GC operation control unit 22 starts the GC of the NVM subset #1.

Initially, the GC operation control unit 22 allocates the free block within the free block pool of the NVM set #1, as the copying destination block (step S202). The GC operation control unit 22 selects the block which stores the valid data and the invalid data together, as the copying source block, from the blocks of the NVM subset #1 (step S203).

Subsequently, the GC operation control unit 22 copies only the valid data of the selected block to the copying destination block (step S204). The GC operation control unit 22 updates the LUT corresponding to the NVM subset #1 (step S205). Thereafter, the GC operation control unit 22 returns the block in which only the invalid data is present to the free block pool of the NVM set #1 (step S206).

Subsequently, the GC operation control unit 22 determines whether or not the number of blocks included in the NVM subset #1 is equal to or less than a threshold X2 (<X1) corresponding to the NVM subset #1 (step S207). When the number of blocks included in the NVM subset #1 is equal to or less than the threshold X2 (<X1) (Yes in step S207), the GC operation control unit 22 ends the garbage collection operation. When the number of blocks included in the NVM subset #1 is equal to or less than the threshold X2 (<X1) (No in step S207), the GC operation control unit 22 continues the garbage collection operation (steps S202 to S206).

Figure 32:
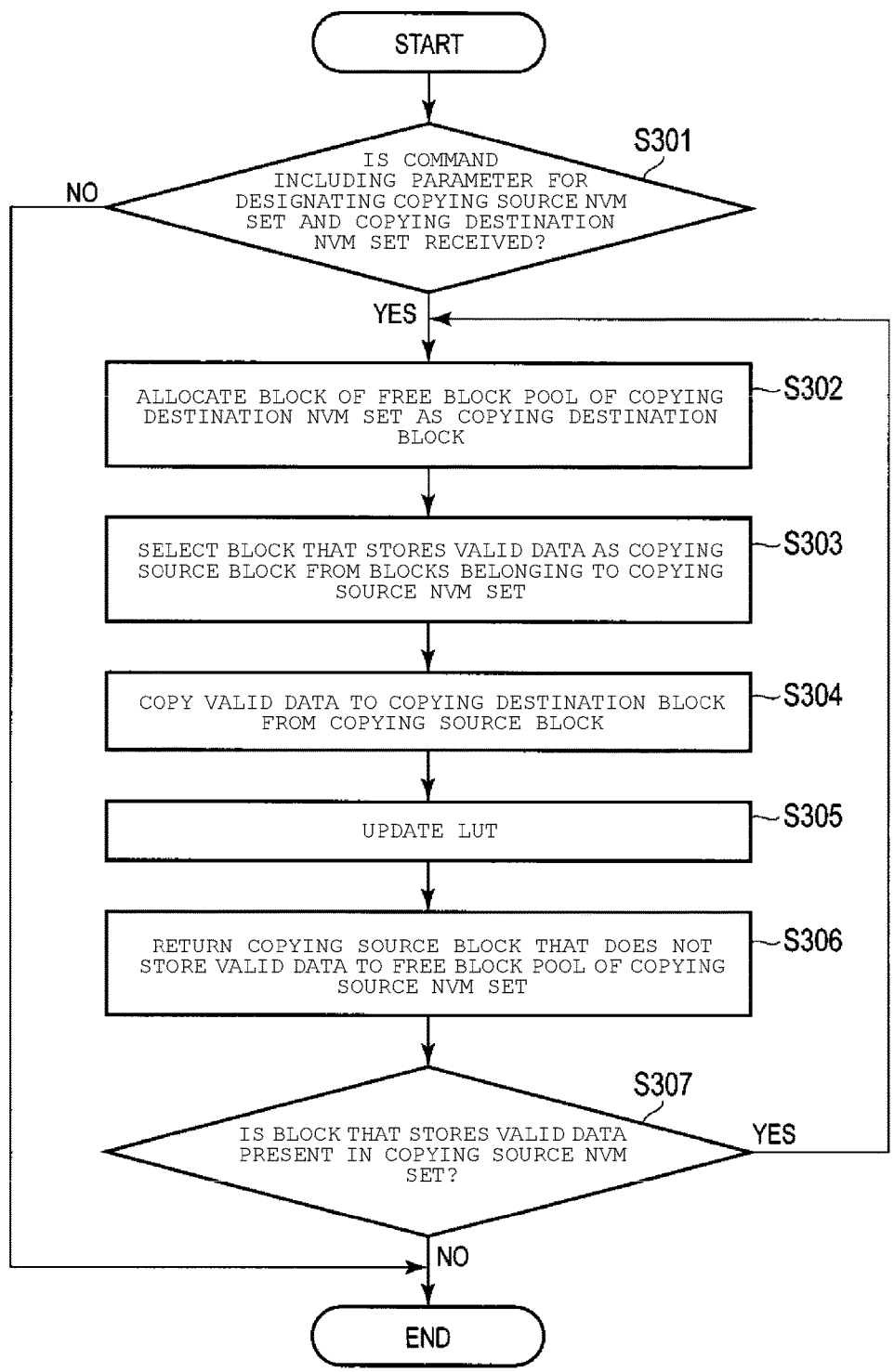
FIG. 32 is a flowchart showing a procedure of the inter-NVM-set copy operation performed by the memory system according to the embodiment.

A flowchart of FIG. 32 shows a procedure of the inter-NVM-set copy operation performed by the inter-NVM-set copy control unit 23.

When the inter-NVM-set copy command from the host 2 including the parameter for designating the copying source NVM set and the copying destination NVM set is received (Yes in step S301), the inter-NVM-set copy control unit 23 allocates the free block within the free block pool of the copying destination NVM set, as the copying destination block (step S302). The inter-NVM-set copy control unit 23 selects the block including the valid data, as the copying source block, from the blocks belonging to the copying source NVM set (step S303).

Subsequently, the inter-NVM-set copy control unit 23 copies the valid data to the copying destination block from the copying source block (step S304). When the valid data is copied, the inter-NVM-set copy control unit 23 updates the LUT corresponding to the NVM subset of the copying source NVM set (step S305).

Subsequently, the inter-NVM-set copy control unit 23 returns the copying source block that does not include the valid data to the free block pool of the copying source NVM set (step S306).

The inter-NVM-set copy control unit 23 repeats the processes of step S302 to S306 until the block including the valid data is not present in the copying source NVM set (step S307).

Figure 33:
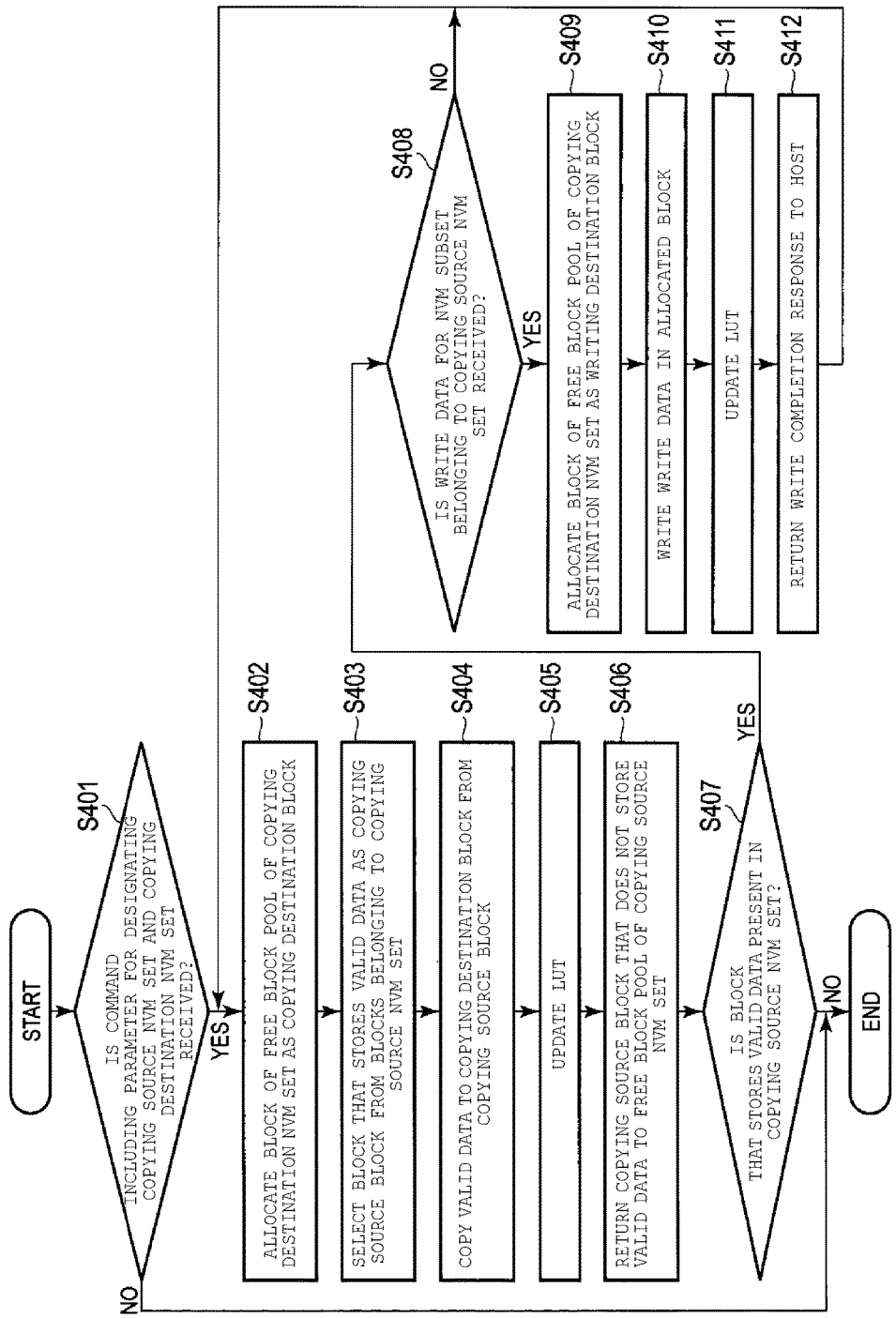
FIG. 33 is a flowchart showing another procedure of the inter-NVM-set copy operation performed by the memory system according to the embodiment.

A flowchart of FIG. 33 shows another procedure of the inter-NVM-set copy operation performed by the inter-NVM-set copy control unit 23. In this example, it is assumed that the host write operation is permitted during the inter-NVM-set copy operation.

When the inter-NVM-set copy command from the host 2 including the parameter for designating the copying source NVM set and the copying destination NVM set is received (Yes in step S401), the inter-NVM-set copy control unit 23 allocates the free block within the free block pool of the copying destination NVM set, as the copying destination block (step S402). The inter-NVM-set copy control unit 23 selects the block including the valid data from the blocks belonging to the copying source NVM set, as the copying source block (step S403).

Subsequently, the inter-NVM-set copy control unit 23 copies the valid data to the copying destination block from the copying source block (step S404). When the valid data is copied, the inter-NVM-set copy control unit 23 updates the LUT corresponding to the NVM subset of the copying source NVM set (step S405).

Subsequently, the inter-NVM-set copy control unit 23 returns the copying source block that does not include the valid data to the free block pool of the copying source NVM set (step S406).

Subsequently, the inter-NVM-set copy control unit 23 determines whether or not the block including the valid data is not present in the copying source NVM set (step S407). When the block including the valid data is not present in the copying source NVM set (Yes in step S407), the inter-NVM-set copy control unit 23 ends the inter-NVM-set copy operation.

When the block including the valid data is present in the copying source NVM set (No in step S407), the NVM set control unit 21 of the controller 4 determines whether or not the write data for the NVM subset belonging to the copying source NVM set is received (step S408). When the write data for the NVM subset belonging to the copying source NVM set is not received (No in step S408), the process proceeds to step S402.

When the write data for the NVM subset belonging to the copying source NVM set is received (Yes in step S408), the NVM set control unit 21 allocates the free block of the free block pool of the copying destination NVM set, as the writing destination block (step S409). The NVM set control unit 21 writes the write data in the allocated block (step S410). When the write data is written, the NVM set control unit 21 updates the LUT corresponding to the NVM subset belonging to the copying source NVM set (step S411).

Subsequently, the controller 4 returns the response indicating the write completion to the host 2 (step S412). When the response indicating the write completion is returned to the host 2, the process proceeds to step S402.

The processes of step S402 to S412 are repeated until the block including the valid data is not present in the copying source NVM set (step S407).

Figure 34:
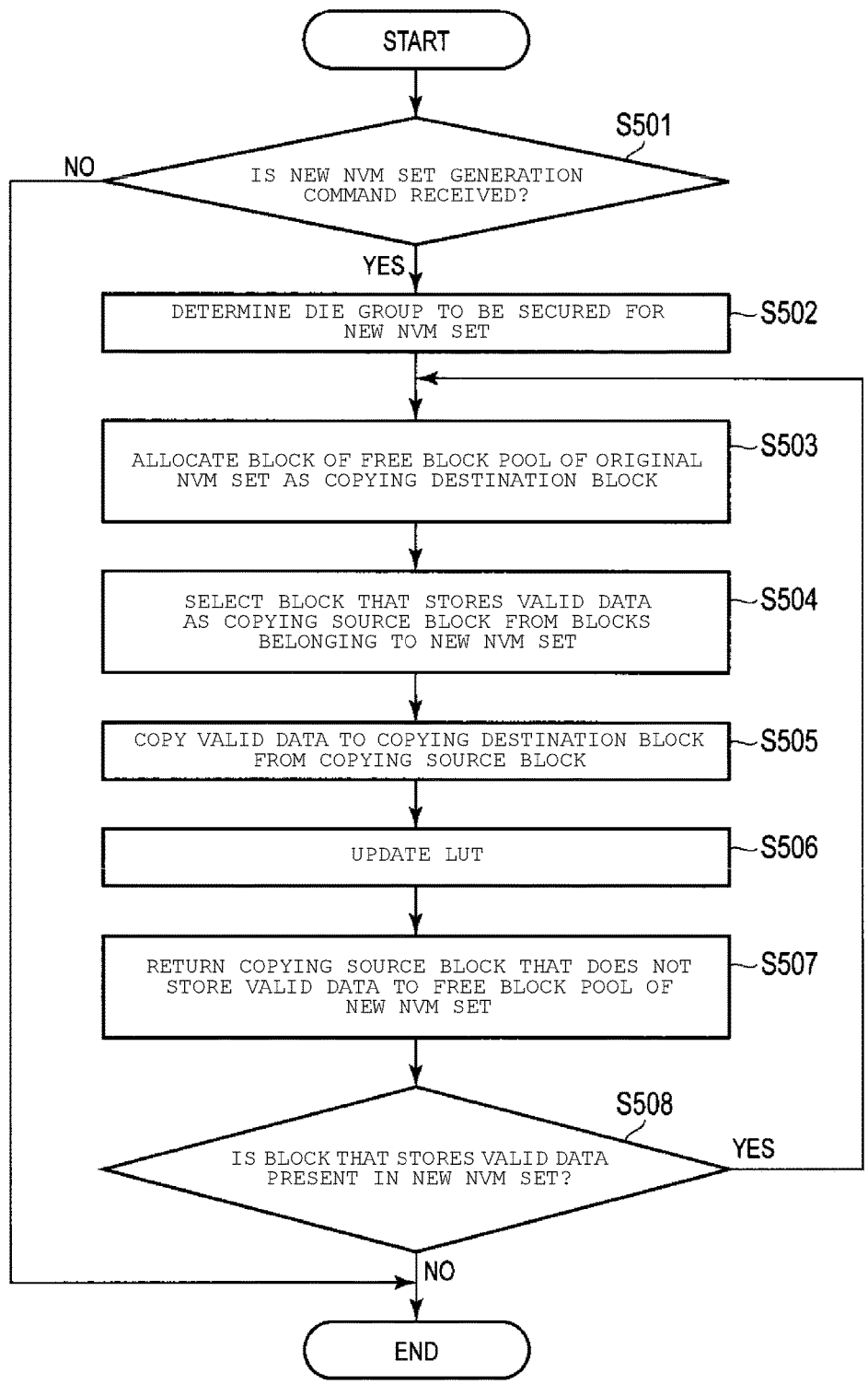
FIG. 34 is a flowchart showing a procedure of the new NVM set generation operation performed by the memory system according to the embodiment.

A flowchart of FIG. 34 shows a procedure of the new NVM set generation operation performed by a new NVM set generation control unit 24.

When a new NVM set generation command is received (Yes in step S501), the new NVM set generation control unit 24 determines the group of NAND flash memory dies to be secured for the new NVM set from all NAND flash memory dies belonging to the original NVM set (step S502). The original NVM set may be designated by the new NVM set generation command.

Subsequently, the new NVM set generation control unit 24 allocates the free block of the free block pool of the original NVM set, as the copying destination block (step S503). The new NVM set generation control unit 24 selects the block that stores the valid data, as the copying source block, from the blocks (that is, the blocks belonging to the group of secured NAND flash memory dies) belonging to the new NVM set (step S504).

Subsequently, the new NVM set generation control unit 24 copies the valid data to the copying destination block from the copying source block (step S505). When the valid data is copied, the new NVM set generation control unit 24 updates the LUT corresponding to the NVM subset of the copying source NVM set (step S506). Subsequently, the new NVM set generation control unit 24 returns the copying source block which does not the valid data to the free block pool of the new NVM set (step S507).

Subsequently, the new NVM set generation control unit 24 determines whether or not the block including the valid data is not present in the new NVM set (step S508). When the block including the valid data is not present in the new NVM set (Yes in step S508), the new NVM set generation control unit 24 ends the new NVM set generation operation. When the block including the valid data is present in the new NVM set (No in step S508), the new NVM set generation control unit 24 continues the new NVM set generation operation (steps S503 to S507).

The processes of steps S503 to S507 are repeated until the block including the valid data is not present in the new NVM set.

Figure 35:
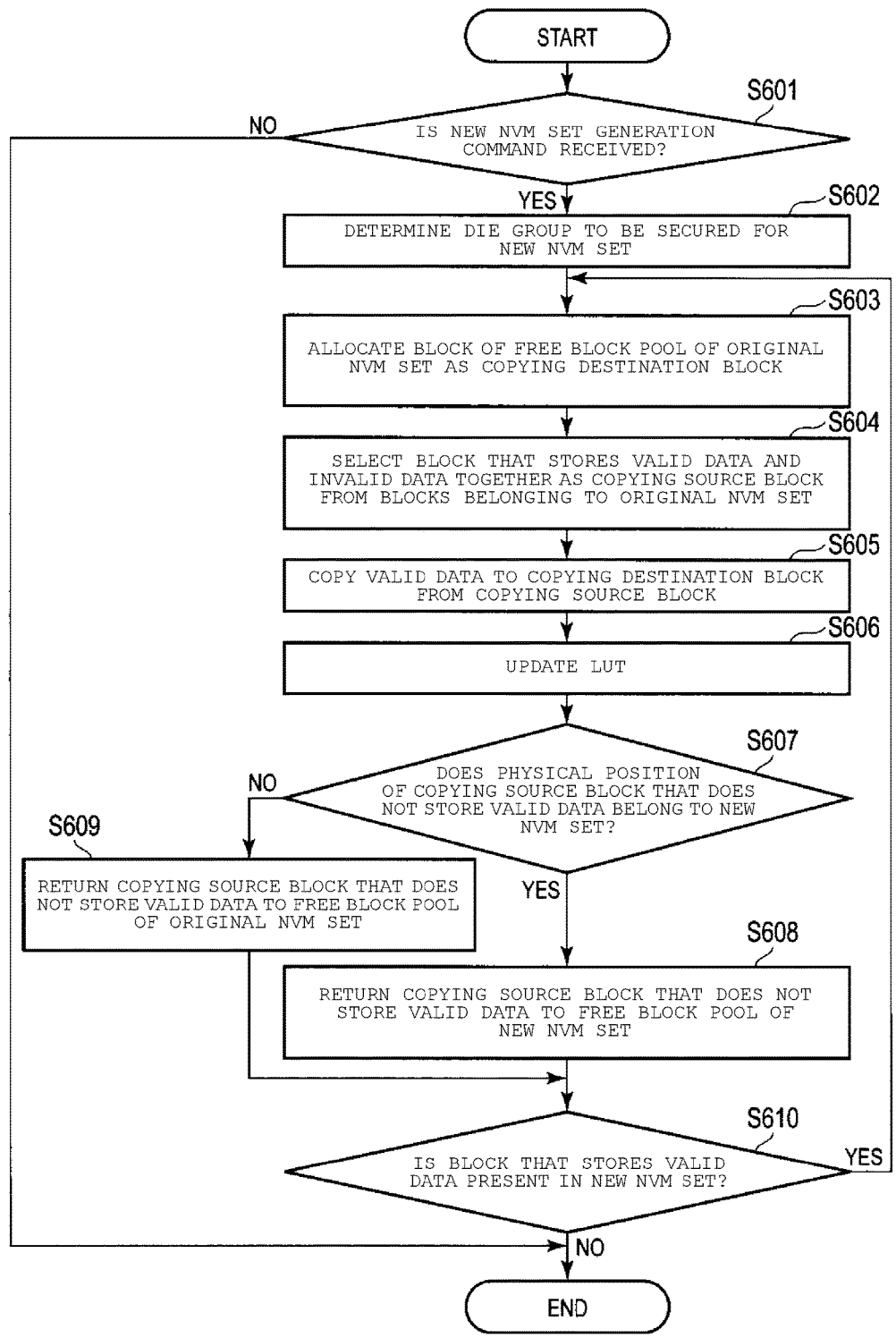
FIG. 35 is a flowchart showing another procedure of the new NVM set generation operation performed by the memory system according to the embodiment.

A flowchart of FIG. 35 shows another procedure of the new NVM set generation operation performed by the new NVM set generation control unit 24. In this example, the procedure in which the new NVM set generation operation and the garbage collection operation in the original NVM set are performed in parallel is illustrated.

When the new NVM set generation command is received (step S601), the new NVM set generation control unit 24 determines the group of NAND flash memory dies to be secured for the new NVM set (step S602). Subsequently, the new NVM set generation control unit 24 allocates the free block of the free block pool of the original NVM set, as the copying destination block (step S603). The new NVM set generation control unit 24 selects the block which stores the valid data and the invalid data together, as the copying source block, from the blocks belonging to the original NVM set (step S604). In step S604, the new NVM set generation control unit 24 may preferentially select the block having a smaller number of valid data, as the copying source block.

Subsequently, the new NVM set generation control unit 24 copies the valid data to the copying destination block from the copying source block (step S605). When the valid data is copied, the new NVM set generation control unit 24 updates the LUT corresponding to the NVM subset of the copying source NVM set (step S606).

Subsequently, the new NVM set generation control unit 24 determines whether or not the physical position of the copying source block that does not include the valid data belongs to the new NVM set (step S607). When the physical position of the copying source block that does not include the valid data belongs to the new NVM set (Yes in step S607), the new NVM set generation control unit 24 returns the copying source block that does not include the valid data to the free block pool of the new NVM set (step S608). When the physical position of the copying source block that does not include the valid data does not belong to the new NVM set (No in step S607), the new NVM set generation control unit 24 returns the copying source block that does not include the valid data to the free block pool of the original NVM set (step S609).

Subsequently, the new NVM set generation control unit 24 determines whether or not the block including the valid data is not present in the new NVM set (step S610). When the block including the valid data is not present in the new NVM set (Yes in step S610), the new NVM set generation control unit 24 ends the new NVM set generation operation. When the block including the valid data is present in the new NVM set (No in step S610), the new NVM set generation control unit 24 performs the process of step S603.

The processes of step S603 to S607 are repeated until the block including the valid data is not present in the new NVM set.

Figure 36:
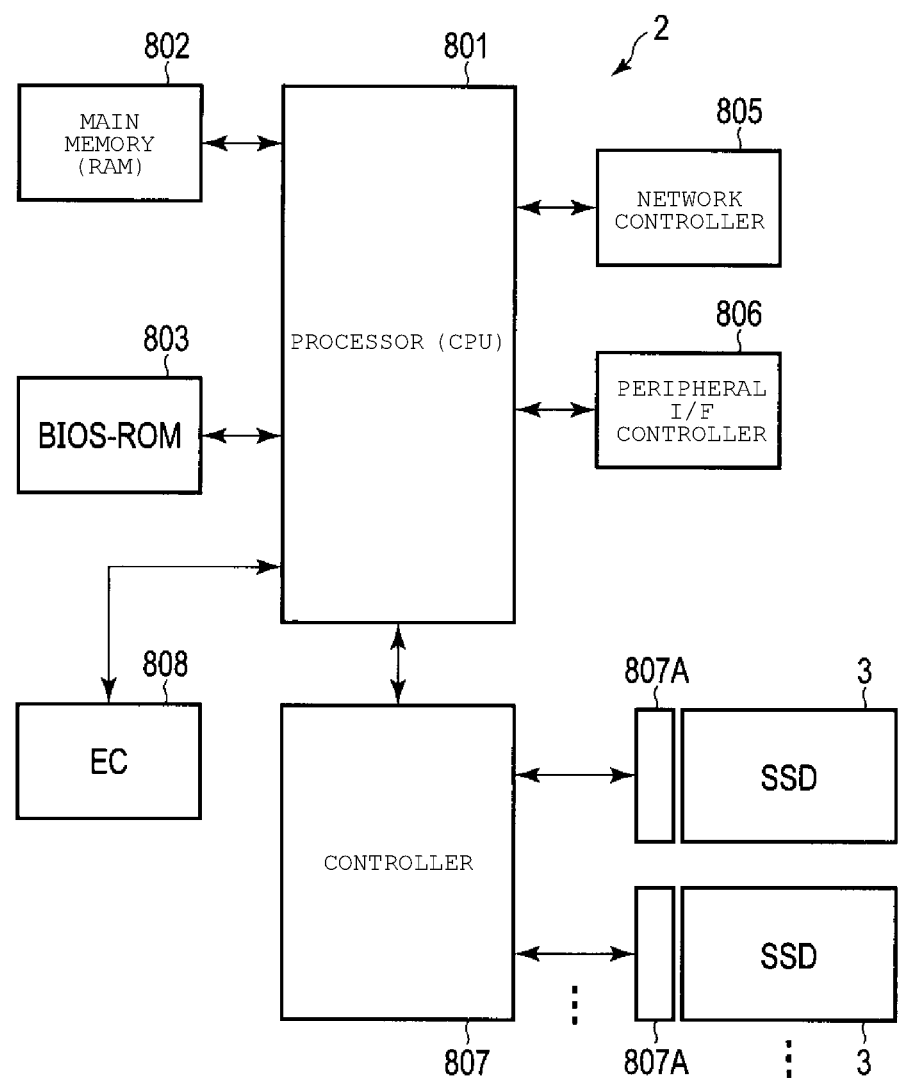
FIG. 36 is a block diagram of a configuration example of a host applied to the memory system according to the embodiment.

FIG. 36 shows an example of a hardware configuration of the information processing device (e.g., computing device) functioning as the host 2.

The information processing device is implemented as a computing device such as a server. The information processing device includes a processor (CPU) 801, a main memory 802, a BIOS-ROM 803, a network controller 805, a peripheral interface controller 806, a controller 807, and an embedded controller (EC) 808.

The processor 801 is a CPU configured to control operations of components of the information processing device. The processor 801 executes various programs loaded to the main memory 802 from any one of the plurality of SSDs 3. The main memory 802 is a random-access memory such as a DRAM. The program may include a setting program for issuing the commands for instructing the inter-NVM-set copy, the NVM set exchange, the new NVM set generation, and the NVM set coupling.

The processor 801 executes a basic input and output system (BIOS) stored in the BIOS-ROM 803 which is the non-volatile memory. BIOS is a system program for hardware control.

The network controller 805 is a communication device such as a wired LAN controller or a wireless LAN controller. The peripheral interface controller 806 is configured to perform communication with a peripheral device such as a USB device.

The controller 807 is configured to perform communication with devices connected to a plurality of connectors 807A. The plurality of SSDs 3 may be connected to the plurality of connectors 807A, respectively. The controller 807 is an SAS expander, a PCIe switch, a PCIe expander, a flash array controller, or a RAID controller.

The EC 808 functions as a system controller configured to perform power management of the information processing device.

Figure 37:
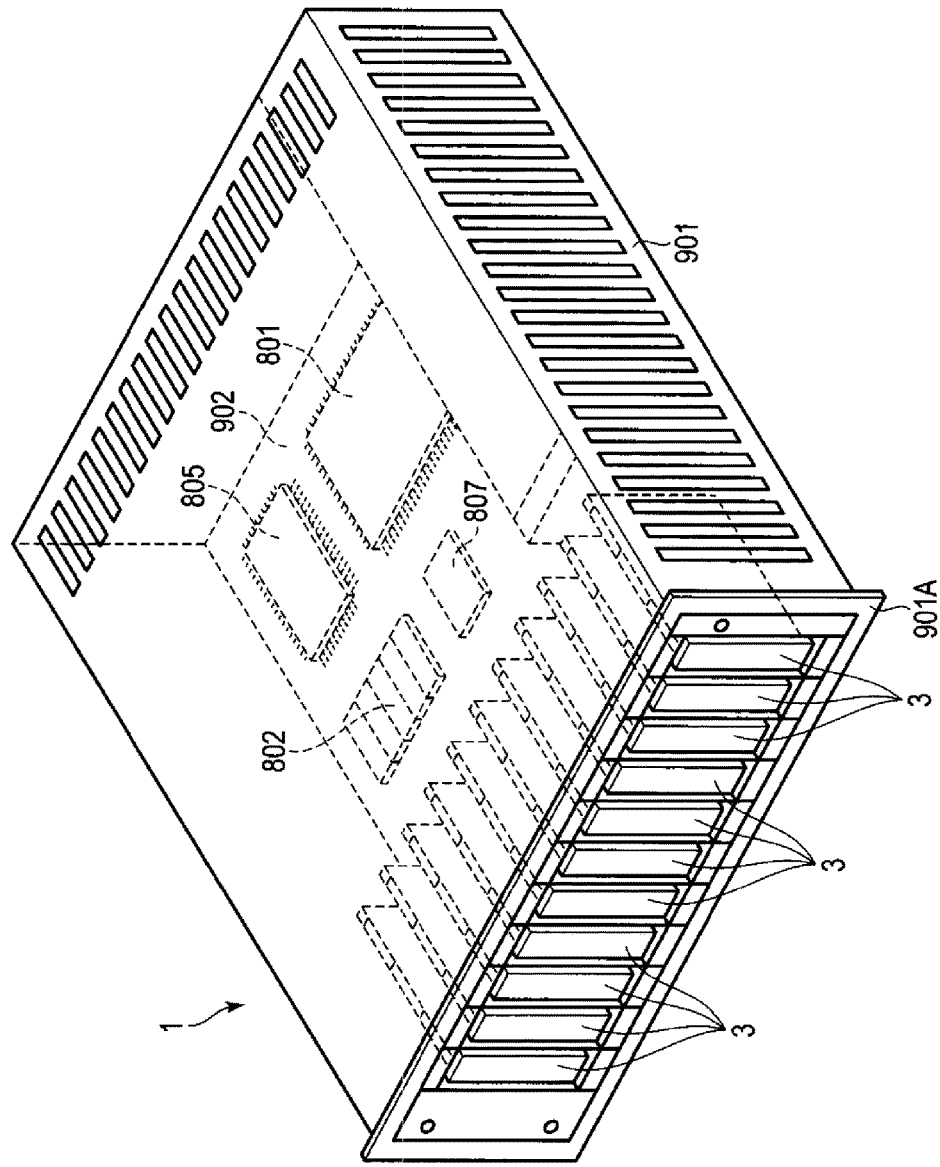
FIG. 37 is a block diagram showing a configuration example of a computer including the host and the memory system according to the embodiment.

FIG. 37 shows a configuration example of the information processing device including the plurality of SSDs 3 and the host 2.

The information processing device includes a thin box-shaped casing 901 capable of being accommodated in a rack. The plurality of SSDs 3 may be disposed in the casing 901. In this case, each SSD 3 may be detachably inserted into a slot provided in a front surface 901A of the casing 901.

A system board (e.g., motherboard) 902 is disposed in the casing 901. Various electronic components including the CPU 801, the main memory 802, the network controller 805, and the controller 807 are mounted on the system board 902. These electronic components function as the host 2.

As described above, according to the present embodiment, the memory package in which the plurality of stacked non-volatile memory dies is connected to one another through the plurality of vertical vias is used, and the plurality of NAND flash memory dies is classified into the first NVM set including the set of the plurality of first NAND flash memory dies connected to the first channel and the second NVM set including the set of the plurality of second NAND flash memory dies connected to the second channel. The data write/read operation for the first NVM set is performed through the first channel according to the first I/O command from the host 2 which is received from the host 2 to designate the first area corresponding to the first NVM set. The data write/read operation for the second NVM set is performed through the second channel according to the second I/O command from the host 2 to designate the second area corresponding to the second NVM set. As described above, the memory package in which the plurality of stacked non-volatile memory dies is connected to one another through the plurality of vertical vias and the configuration in which the plurality of NVM sets is accessed through different channels are combined. Thus, it is possible to minimize a deterioration in the peak I/O capabilities of each NVM set, and it is possible to immediately execute the write/read requests even though the write/read requests for the NVM sets are simultaneously received.

The free block group of the NAND flash memory 5 is individually managed by the plurality of free block pools corresponding to the plurality of NVM sets for every NVM set. The operation for allocating one of the free blocks within the corresponding free block pool, as the input block, the operation for writing the write data in the input block, the operation for managing the input block filled with the write data by the NVM subset, and the operation for returning the block that is managed by the NVM subset and does not store the valid data to the corresponding free block pool are performed on each of the plurality of NVM sets. As described above, the free blocks corresponding to the plurality of NVM sets are used, and thus, it is possible to independently perform the allocation of the input block and the returning of the free block for every NVM set. Accordingly, it is possible to prevent the block within the die belonging to a certain NVM set from being allocated as the input block for another NVM set. Therefore, it is possible to guarantee that the die contention will not occur.

In the present embodiment, the NAND flash memory is used as the example of the non-volatile memory. However, the function of the present embodiment may be applied to other various non-volatile memories such as a magnetoresistive random-access memory (MRAM), a phase change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:
a non-volatile memory that includes a plurality of non-volatile memory dies connected to each of a plurality of channels, each of the non-volatile memory dies including a plurality of blocks; and
a controller configured to control the non-volatile memory through the plurality of channels, wherein the controller is configured to:
classify the plurality of non-volatile memory dies into a plurality of die groups including a first die group that includes a plurality of first non-volatile memory dies connected to a first channel of the plurality of channels and a second die group that includes a plurality of second non-volatile memory dies connected to a second channel of the plurality of channels,
perform a data write/read operation on the first die group through the first channel in response to a first I/O command that is received from the host and designates a first area corresponding to the first die group, and perform a data write/read operation on the second die group through the second channel in response to a second I/O command that is received from the host and designates a second area corresponding to the second die group,
manage a free block group of the first die group using a first free block pool corresponding to the first die group, and manage a free block group of the second die group using a second free block pool corresponding to the second die group,
perform an operation for allocating one of free blocks within the first free block pool, as a block in which first user data corresponding to the first area is to be written, an operation for writing the first user data into the allocated block, an operation for classifying the block filled with the first user data into a first data block pool, and an operation for classifying a block in the first data block pool and including no valid data into the first free block pool, and
perform an operation for allocating one of free blocks within the second free block pool, as a block in which second user data corresponding to the second area is to be written, an operation for writing the second user data into the allocated block corresponding to the second area, an operation for classifying the block filled with the second user data into a second data block pool, and an operation for classifying a block in the second data block pool and including no valid data into the second free block pool, and
wherein
the non-volatile memory includes one or more memory packages,
each memory package includes a plurality of stacked non-volatile memory dies,
the plurality of stacked non-volatile memory dies in each memory package is connected to one another through a plurality of vertical vias, and
a plurality of signals corresponding to at least one channel is transmitted to the plurality of stacked non-volatile memory dies of each memory package through the plurality of vertical vias thereof.

2. The memory system according to claim 1, wherein, in each memory package, each of the plurality of vertical vias includes a plurality of through-electrodes passing through a semiconductor substrate of each of the plurality of stacked non-volatile memory dies, and a plurality of bump electrodes that connect the plurality of stacked non-volatile memory dies.

3. The memory system according to claim 1,
wherein the first free block pool is a dedicated free block pool for the first data block pool for managing blocks that belong to the first die group and store valid data, and the second free block pool is a shared free block pool shared among a plurality of second data block pools for managing blocks that belong to the second die group and store valid data.

4. The memory system according to claim 3, wherein the controller is further configured to:
perform an operation for allocating one of the free blocks within the first free block pool, as a first copying destination block, an operation for copying selectively valid data from one or more blocks that belong to the first data block pool and store valid data and invalid data to the first copying destination block, and an operation for classifying the one or more blocks that store only invalid data as a result of the copying of the valid data to the first copying destination block, to the first free block pool, during garbage collection of a block group within the first data block pool, and
perform an operation for allocating one of the free blocks within the second free block pool shared among a plurality of second data block pools, as a second copying destination block, an operation for copying selectively valid data from one or more blocks that belong to the one second data block pool and store valid data and invalid data to the second copying destination block, and an operation for classifying the one or more blocks that store only invalid data as a result of the copying of the valid data to the second copying destination block, to the second free block pool, during garbage collection of a block group within the one second data block pool of the plurality of second data block pools.

5. The memory system according to claim 1,
wherein the first free block pool is a dedicated free block pool for the first data block pool for managing blocks that belong to the first die group and store valid data, and the second free block pool is a dedicated free block pool for the second data block pool for managing blocks that belong to the second die group and store valid data.

6. The memory system according to claim 5, wherein the controller is further configured to:
perform an operation for allocating one of the free blocks within the first free block pool, as a first copying destination block, an operation for copying selectively valid data from one or more blocks that belong to the first data block pool and store valid data and invalid data to the first copying destination block, and an operation for classifying the one or more blocks that store only invalid data as a result of the copying of the valid data to the first copying destination block, to the first free block pool, during garbage collection of a block group within the first data block pool, and
perform an operation for allocating one of the free blocks within the second free block pool, as a second copying destination block, an operation for copying only valid data from one or more blocks that belong to the second data block pool and store valid data and invalid data together to the second copying destination block, and an operation for returning the one or more blocks that store only the invalid data as a result of the copying of the valid data to the second copying destination block, to the second free block pool, during garbage collection of a block group within the second data block pool.

7. The memory system according to claim 1,
wherein the first free block pool is a shared free block pool shared among a plurality of first data block pools for managing blocks that belong to the first die group and store valid data, and the second free block pool is a shared free block pool shared among a plurality of second data block pools for managing blocks that belong to the second die group and store valid data.

8. The memory system according to claim 7, wherein the controller is further configured to:
perform an operation for allocating one of free blocks within the first free block pool shared among the plurality of first data block pools, as a first copying destination block, an operation for copying selectively valid data from one or more blocks that belong to the one first data block pool and store valid data and invalid data to the first copying destination block, and an operation for classifying the one or more blocks that store only invalid data as a result of the copying of the valid data to the first copying destination block, to the first free block pool, during garbage collection of a block group within the one first data block pool of the plurality of first data block pools, and
perform an operation for allocating one of free blocks within the second free block pool shared among a plurality of second data block pools, as a second copying destination block, an operation for copying selectively valid data from one or more blocks that belong to the one second data block pool and store valid data and invalid data to the second copying destination block, and an operation for classifying the one or more blocks that store only invalid data as a result of the copying of the valid data to the second copying destination block, to the second free block pool, during garbage collection of a block group within the one second data block pool of the plurality of second data block pools.

9. A memory system comprising:
a non-volatile memory including a plurality of non-volatile memory dies connected to each of a plurality of channels that are simultaneously controllable; and
a controller circuit configured to:
associate a first die group including a first plurality of non-volatile memory dies connected to each of the plurality of channels with a first namespace, and a second die group including a second plurality of non-volatile memory dies connected to each of the plurality of channels with a second namespace;
carry out an input/output (I/O) operation on the first die group in response to an I/O command received from a host and associated with the first namespace, and an I/O operation on the second die group in response to an I/O command received from the host and associated with the second namespace;
manage a free block group of the first die group using a first free block pool corresponding to the first die group, and manage a free block group of the second die group using a second free block pool corresponding to the second die group;
perform an operation for allocating one of free blocks within the first free block pool, as a block in which first user data corresponding to the first namespace is to be written, an operation for writing the first user data into the allocated block, an operation for classifying the block filled with the first user data into a first data block pool, and an operation for classifying a block in the first data block pool and including no valid data into the first free block pool; and
perform an operation for allocating one of free blocks within the second free block pool, as a block in which second user data corresponding to the second namespace is to be written, an operation for writing the second user data into the allocated block, an operation for classifying the block filled with the second user data into a second data block pool, and an operation for classifying a block in the second data block pool and including no valid data into the second free block pool.

10. The memory system according to claim 9, wherein the plurality of non-volatile memory dies connected to each of the plurality of channels comprises a stack of non-volatile memory dies electrically connected through a plurality of vertical vias passing therethrough.

11. The memory system according to claim 9, wherein the controller circuit is further configured to:
associate the first die group with a third namespace; and
carry out an I/O operation on the first die group in response to an I/O command received from the host and associated with the third namespace.

12. The memory system according to claim 9, wherein the controller circuit is further configured to carry out garbage collection with respect to the first die group to selectively transfer valid data stored in a non-volatile memory die in the first die group connected to one of the channels, to another non-volatile memory die in the first die group connected to another one of the channels.

13. The memory system according to claim 9, wherein the controller circuit is further configured to carry out an inter-group copy operation to selectively transfer valid data stored in a non-volatile memory die in the first die group to a non-volatile memory die in the second die group.

14. The memory system according to claim 9, wherein the controller circuit is further configured to carry out an inter-group exchange operation to selectively transfer valid data stored in a non-volatile memory die in the first die group to a non-volatile memory die in the second die group, and selectively transfer valid data stored in a non-volatile memory die in the second die group to a non-volatile memory die in the first die group.

15. The memory system according to claim 9, wherein the controller circuit is further configured to carry out an operation to create a third die group associated with a third namespace from non-volatile memory dies included in the first memory group, when two or more of the non-volatile memory dies connected to each of the plurality of channels are associated with the first namespace as the first die group.

16. The memory system according to claim 9, wherein the controller circuit is further configured to carry out an operation to consolidate the first die group and the second die group into a single die group, such that an I/O operation for the first namespace is carried out on a non-volatile memory die that was included in the second die group, and that an I/O operation for the second namespace is carried out on a non-volatile memory die that was included in the first die group.

17. A method of controlling a non-volatile memory including a plurality of non-volatile memory dies connected to each of a plurality of channels, each of the non-volatile memory dies including a plurality of blocks, the method comprising:
- classifying the plurality of non-volatile memory dies into a plurality of die groups including a first die group that includes a plurality of first non-volatile memory dies connected to a first channel of the plurality of channels and a second die group that includes a plurality of second non-volatile memory dies connected to a second channel of the plurality of channels;
- performing a data write/read operation on the first die group through the first channel in response to a first I/O command that is received from a host and designates a first area corresponding to the first die group, and performing a data write/read operation on the second die group through the second channel in response to a second I/O command that is received from the host and designates a second area corresponding to the second die group;
- managing a free block group of the first die group using a first free block pool corresponding to the first die group, and managing a free block group of the second die group using a second free block pool corresponding to the second die group;
- performing an operation for allocating one of free blocks within the first free block pool, as a block in which first user data corresponding to the first area is to be written, an operation for writing the first user data into the allocated block, an operation for classifying a block filled with the first user data into a first data block pool, and an operation for classifying a block in the first data block pool including no valid data into the first free block pool; and
- performing an operation for allocating one of free blocks within the second free block pool, as a block in which second user data corresponding to the second area is to be written, an operation for writing the second user data into the allocated block, an operation for classifying a block filled with the second user data into a second data block pool, and an operation for classifying a block in the second data block pool and including no valid data into the second free block pool, wherein
- the non-volatile memory includes one or more memory packages,
- each memory package includes a plurality of stacked non-volatile memory dies,
- the plurality of stacked non-volatile memory dies in each memory package is connected to one another through a plurality of vertical vias, and
- a plurality of signals corresponding to at least one channel is transmitted to the plurality of stacked non-volatile memory dies of each memory package through the plurality of vertical vias thereof.

* * * * *